(12) United States Patent
Xia

(10) Patent No.: US 11,177,446 B2
(45) Date of Patent: Nov. 16, 2021

(54) SILICON CONTAINING ORGANIC FLUORESCENT MATERIALS

(71) Applicant: BEIJING SUMMER SPROUT TECHNOLOGY CO., LTD., Beijing (CN)

(72) Inventor: Chuanjun Xia, Lawrenceville, NJ (US)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 356 days.

(21) Appl. No.: 16/120,330

(22) Filed: Sep. 3, 2018

(65) Prior Publication Data

US 2019/0081253 A1 Mar. 14, 2019

Related U.S. Application Data

(60) Provisional application No. 62/558,842, filed on Sep. 14, 2017.

(51) Int. Cl.
*H01L 51/00* (2006.01)
*C07F 7/08* (2006.01)
*C09K 11/06* (2006.01)
*H01L 51/50* (2006.01)

(52) U.S. Cl.
CPC ........ *H01L 51/0094* (2013.01); *C07F 7/0816* (2013.01); *C09K 11/06* (2013.01); *H01L 51/0061* (2013.01); *H01L 51/0073* (2013.01); *C09K 2211/1018* (2013.01); *H01L 51/006* (2013.01); *H01L 51/0071* (2013.01); *H01L 51/5012* (2013.01); *H01L 51/5016* (2013.01)

(58) Field of Classification Search
CPC .................. C07F 7/0816; C09K 11/06; C09K 2211/1018; H01L 51/006; H01L 51/0061; H01L 51/0071; H01L 51/0073; H01L 51/0094; H01L 51/5012; H01L 51/5016
See application file for complete search history.

(56) References Cited

U.S. PATENT DOCUMENTS

| | | |
|---|---|---|
| 5,703,436 A | 12/1997 | Forrest et al. |
| 5,707,745 A | 1/1998 | Forrest et al. |
| 5,844,363 A | 12/1998 | Gu et al. |

(Continued)

FOREIGN PATENT DOCUMENTS

| | | |
|---|---|---|
| CN | 102246328 | 11/2011 |
| CN | 104629724 | 5/2015 |

(Continued)

OTHER PUBLICATIONS

Machine translation for KR 20130093195 A (publication date Aug. 2013). (Year: 2013).*

(Continued)

*Primary Examiner* — Dawn L Garrett
(74) *Attorney, Agent, or Firm* — Workman Nydegger

(57) ABSTRACT

Novel silicon containing compounds for organic electroluminescent devices is disclosed. The compounds can be used as emitters in the emissive layer of the organic electroluminescent device. More specifically, these compounds can emit blue light. The devices incorporating these compounds as emitters show unexpecting higher efficiency and longer lifetime than prior art compounds. Also disclosed is an organic electroluminescent device and a formulation.

19 Claims, 3 Drawing Sheets

(56) References Cited

U.S. PATENT DOCUMENTS

Figure 1:
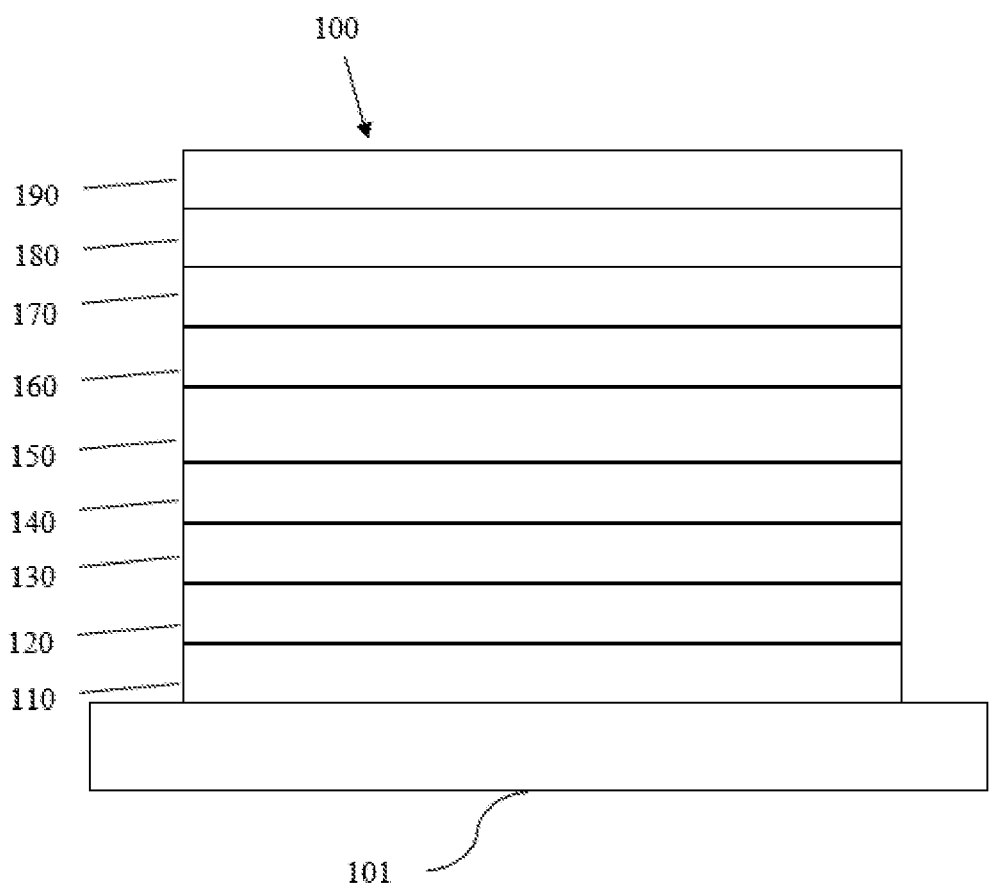

| | | | |
|---|---|---|---|
| 6,097,147 A | 8/2000 | Baldo et al. | |
| 6,303,238 B1 | 10/2001 | Thompson et al. | |
| 7,279,704 B2 | 10/2007 | Walters et al. | |
| 7,968,146 B2 | 6/2011 | Wagner et al. | |
| 2003/0118866 A1* | 6/2003 | Oh | H01L 51/0094 428/690 |
| 2003/0230980 A1 | 12/2003 | Forrest et al. | |
| 2004/0124766 A1* | 7/2004 | Nakagawa | H01L 51/0073 313/504 |
| 2004/0174116 A1 | 9/2004 | Lu et al. | |
| 2009/0267491 A1 | 10/2009 | Takashima et al. | |
| 2012/0181520 A1 | 7/2012 | Kim et al. | |
| 2014/0175398 A1 | 6/2014 | Kim et al. | |
| 2014/0353617 A1 | 12/2014 | Kim et al. | |
| 2015/0329772 A1 | 11/2015 | Heil et al. | |
| 2015/0349273 A1 | 12/2015 | Hung et al. | |
| 2016/0099411 A1 | 4/2016 | Kim et al. | |
| 2016/0155961 A1* | 6/2016 | Ueno | H01L 51/0061 257/40 |
| 2016/0181543 A1 | 6/2016 | Ito et al. | |
| 2016/0190448 A1* | 6/2016 | Kim | C07F 5/027 257/40 |
| 2016/0190487 A1* | 6/2016 | Akashi | C07F 7/0816 257/40 |
| 2016/0359122 A1 | 12/2016 | Boudreault et al. | |
| 2017/0029362 A1* | 2/2017 | Howard, Jr. | C07D 307/91 |
| 2017/0222144 A1 | 8/2017 | Haketa et al. | |
| 2017/0222155 A1 | 8/2017 | Cha et al. | |
| 2018/0145268 A1 | 5/2018 | Ma et al. | |
| 2019/0263841 A1 | 8/2019 | Mujica-Fernaud et al. | |

FOREIGN PATENT DOCUMENTS

| | | | |
|---|---|---|---|
| CN | 106206999 | | 12/2016 |
| CN | 106458953 | | 2/2017 |
| CN | 107004776 | | 8/2017 |
| CN | 109564972 | | 4/2019 |
| CN | 110114362 | | 8/2019 |
| KR | 20120116881 A | * | 10/2012 |
| KR | 20130093195 A | * | 8/2013 |
| KR | 20160141360 | | 12/2016 |
| KR | 20170056425 | | 5/2017 |
| KR | 20180127906 | | 11/2018 |
| WO | WO 2010/064871 A1 | * | 6/2010 |
| WO | WO 2013/009079 A1 | * | 1/2013 ........... C07D 417/04 |
| WO | WO2013173396 | | 11/2013 |
| WO | WO2014209050 | | 12/2014 |
| WO | 2020043657 | | 3/2020 |

OTHER PUBLICATIONS

Machine translation for WO 2013/009079 A1 (publication date Jan. 2013). (Year: 2013).*

Machine translation for KR 20120116881 A (publication date Oct. 2012). (Year: 2012).*

Shimizu M. et al., Sci China Chem, Dec. 2011, vol. 54, No. 12, pp. 1937-1947. (Year: 2011).*

Tang, C. W. et al., "Organic electroluminescent diodes", Applied Physics Letters, 51(12): 913-915 (1987).

Hiroki Uoyama et al., "Highly efficient organic light-emitting diodes from delayed fluorescence", Nature, vol. 492, pp. 234-238 (2012).

Chinese Office Action issued in 201811071664.1 dated Oct. 22, 2020.

Search Report issued in 201811071664.1 dated Oct. 22, 2020.

* cited by examiner $$A-(B)_n$$

Figure 3

SILICON CONTAINING ORGANIC FLUORESCENT MATERIALS

This application claims the benefit of U.S. Provisional Application No. 62/558,842, filed Sep. 14, 2017, the entire content of which is incorporated herein by reference.

1 FIELD OF THE INVENTION

The present invention relates to a compound for organic electronic devices, such as organic light emitting devices. More specifically, the present invention relates to a silicon containing compound, an organic electroluminescent device and a formulation comprising the silicon containing compound.

2 BACKGROUND ART

An organic electronic device is preferably selected from the group consisting of organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (*Applied Physics Letters*, 1987, 51 (12): 913-915). Once a bias is applied to the device, green light was emitted from the device. This invention laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since OLED is a self-emitting solid state device, it offers tremendous potential for display and lighting applications. In addition, the inherent properties of organic materials, such as their flexibility, may make them well suited for particular applications such as fabrication on flexible substrates.

OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of a fluorescent OLED is only 25%. This limitation hindered the commercialization of OLED. In 1997, Forrest and Thompson reported phosphorescent OLED, which uses triplet emission from heave metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. Small molecule refers to any organic or organometallic material that is not a polymer. The molecular weight of a small molecule can be large as long as it has well defined structure. Dendrimers with well-defined structures are considered as small molecules. Polymer OLEDs include conjugated polymers and non-conjugated polymers with pendant emitting groups. Small molecule OLED can become a polymer OLED if post polymerization occurred during the fabrication process.

There are various methods for OLED fabrication. Small molecule OLEDs are generally fabricated by vacuum thermal evaporation. Polymer OLEDs are fabricated by solution process, such as spin-coating, ink-jet printing, and nozzle printing. Small molecule OLEDs can also be fabricated by solution process if the materials can be dissolved or dispersed in solvents.

The emitting color of an OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent emitters still suffer from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime. For fluorescent blue OLEDs, the color saturation, device efficiency, and device lifetime need to be improved to reduce power consumption. In the meantime, TADF devices haven't reached the lifetime goal for commercialization. TADF emitters also need to improve their color purity, severe efficiency roll-off, and device lifetime.

Blue OLEDs suffer from short device lifetime and low efficiency. There is a great need to improve blue OLEDs lifetime and efficiency. The present invention provides a class of silicon-containing blue fluorescent materials to solve the above-mentioned problems. Applicants have found that the introduction of silicon atoms in the blue fluorescent materials produces unexpected high performance, thus improving the efficiency of the fluorescent materials and the lifetime of the device, and is more suitable for commercial blue materials.

3 SUMMARY OF THE INVENTION

The present invention aims to provide a new kind of silicon containing compound to solve the above problems. The silicon containing compound can be used as emitters in the emissive layer of an organic electroluminescent device. The silicon containing compound may emit blue light. Compared to existing compounds, the device incorporating the silicon containing compound as emitters exhibits higher efficiency and longer lifetime.

According to an embodiment of the present invention, a compound of Formula I is disclosed:

$$A\text{-}(B)_n \qquad \text{Formula I}$$

Wherein n is an integer from 1 to 4; when n is 2 or more, two groups of B may be the same or different;

A is a structure represented by formula II:

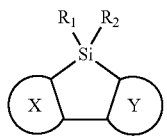

Formula II

Each of ring X and Y independently represents a substituted or unsubstituted aryl or heteroaryl group having 6 to 30 ring atoms;

At least one of X and Y is a fused ring system with at least two six-membered aryl or heteroaryl rings fused together;

$R_1$ and $R_2$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

$R_1$ and $R_2$ are optionally joined to form a ring;

B represents a group represented by Formula III:

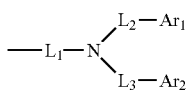

Formula III

Wherein each of $Ar_1$ and $Ar_2$ are independently selected from the group consisting of a substituted or unsubstituted aryl group having 6 to 30 ring carbon atoms, a substituted or unsubstituted heteroaryl group having 5 to 30 ring atoms, and combinations thereof;

Each of $L_1$, $L_2$, and $L_3$ are independently selected from the group consisting of a single bond, an arylene group having 6 to 30 ring carbon atoms, a heteroarylene group having 5 to 30 ring atoms, and combinations thereof;

$Ar_1$ and $Ar_2$ can be optionally joined to form a ring.

According to another embodiment, an organic electroluminescent device is disclosed, which comprising:
an anode,
a cathode,
a series of organic layers deposited between the anode and cathode, wherein at least one of the organic layers comprises a compound having Formula I.

According to yet another embodiment, a formulation comprising a compound of Formula I is also disclosed.

The new silicon containing compound disclosed in the present invention can be used as emitters in the emissive layer of an organic electroluminescent device. The silicon containing compound may emit blue light. Compared to existing compounds, the device incorporating the silicon containing compound as emitters exhibits higher efficiency and longer lifetime.

4 BRIEF DESCRIPTION OF THE DRAWINGS

FIG. 1 schematically shows an organic light emitting device that can incorporate the compound disclosed herein.

Figure 2:
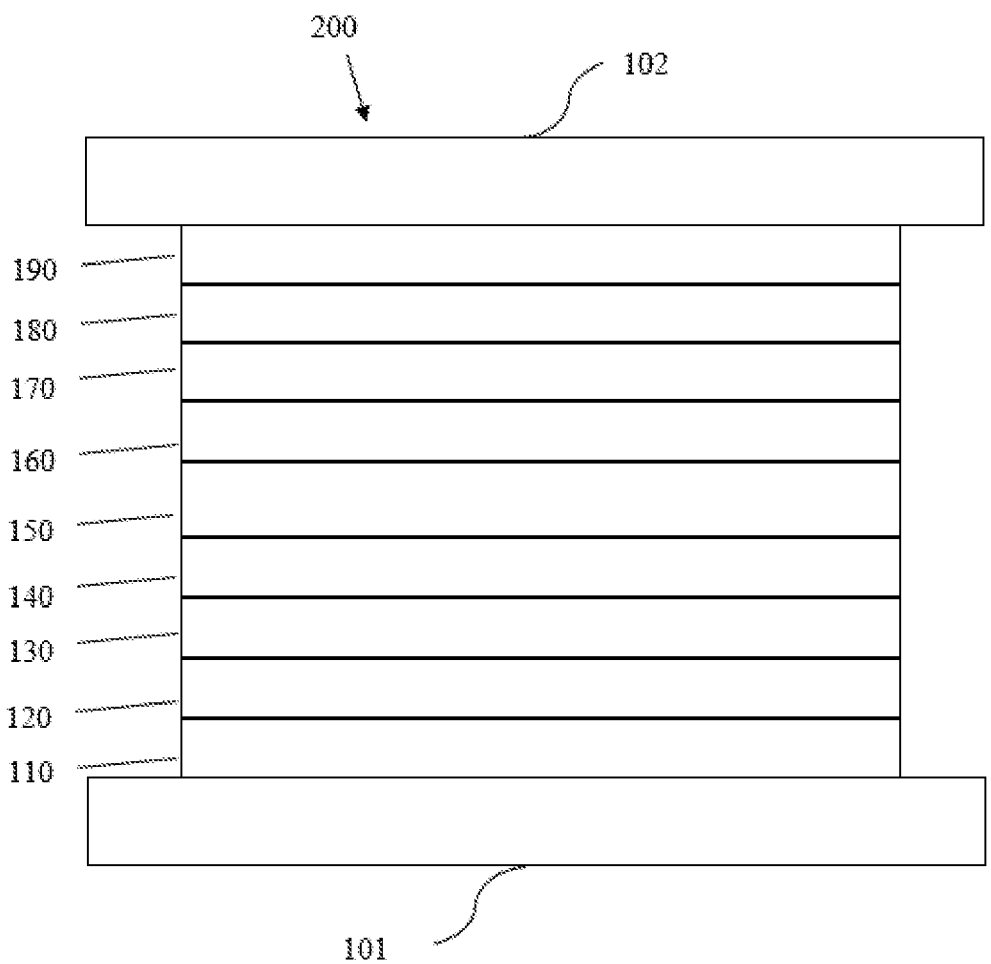

FIG. 2 schematically shows another organic light emitting device that can incorporate the compound disclosed herein.

FIG. 3 shows the compound of Formula I disclosed herein.

5 DETAILED DESCRIPTION

OLEDs can be fabricated on various types of substrates such as glass, plastic, and metal foil. FIG. 1 schematically shows the organic light emitting device 100 without limitation. The figures are not necessarily drawn to scale. Some of the layer in the figure can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, which are incorporated by reference in its entirety.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of host materials are disclosed in U.S. Pat. No. 6,303,238 to Thompson et al., which is incorporated by reference in its entirety. An example of an n-doped electron transport layer is BPhen doped with $L_1$ at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

The layered structure described above is provided by way of non-limiting example. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have a two layers of different emitting materials to achieve desired emission spectrum.

In one embodiment, an OLED may be described as having an "organic layer" disposed between a cathode and an anode. This organic layer may comprise a single layer or multiple layers.

An OLED can be encapsulated by a barrier layer to protect it from harmful species from the environment such as moisture and oxygen. FIG. 2 schematically shows the organic light emitting device 200 without limitation. FIG. 2 differs from FIG. 1 in that the organic light emitting device 200 include a barrier layer 102, which is above the cathode 190. Any material that can provide the barrier function can be used as the barrier layer such as glass and organic-inorganic hybrid layers. The barrier layer should be placed directly or indirectly outside of the OLED device. Multi-layer thin film encapsulation was described in U.S. Pat. No. 7,968,146, which is herein incorporated by reference in its entirety.

Devices fabricated in accordance with embodiments of the invention can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small $\Delta E_{S-T}$. These states may involve CT states. Often, donor-acceptor luminescent materials are constructed by connecting an electron donor moiety such as amino- or carbazole-derivatives and an electron acceptor moiety such as N-containing six-membered aromatic rings.

Definition of Terms of Substituents halogen or halide—as used herein includes fluorine, chlorine, bromine, and iodine.

Alkyl—contemplates both straight and branched chain alkyl groups. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, 3-methylpentyl group. Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and includes cyclobutyl, cyclopentyl, cyclohexyl, 4-methylcyclohexyl, 4,4-dimethylcylcohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing two to fifteen carbon atoms. Examples of the alkenyl group include vinyl group, allyl group, 1-butenyl group, 2-butenyl group, 3-butenyl group, 1,3-butandienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl1-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing two to fifteen carbon atoms. Additionally, the alkynyl group may be optionally substituted.

Aryl or aromatic group—as used herein contemplates noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quarterphenyl group.

Heterocyclic group or heterocycle—as used herein contemplates aromatic and non-aromatic cyclic groups. Heteroaromatic also means heteroaryl. Preferred non-aromatic heterocyclic groups are those containing 3 to 7 ring atoms which includes at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein contemplates noncondensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-Alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-Aryl or —O-heteroaryl. Examples and preferred examples thereof are the same as those described above. Examples of the aryloxy group having 6 to 40 carbon atoms include phenoxy group and biphenyloxy group.

Arylalkyl—as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha.-naphthylmethyl group, 1-alpha.-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline,dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, arylalkyl, alkoxy, aryloxy, amino, cyclic amino, silyl, alkenyl, cycloalkenyl, heteroalkenyl, alkynyl, aryl, heteroaryl, an acyl group, a carbonyl group, a carboxylic acid group, an ether group, an ester group, a nitrile group, an isonitrile group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in this disclosure, the hydrogen atoms can be partially or fully replaced by deuterium. Other atoms such as carbon and nitrogen, can also be replaced by their other stable isotopes. The replacement by other stable isotopes in the compounds may be preferred due to its enhancements of device efficiency and stability.

In the compounds mentioned in this disclosure, multiple substitutions refer to a range that includes a double substitution, up to the maximum available substitutions.

In the compounds mentioned in this disclosure, the expression that adjacent substituents are optionally joined to form a ring is intended to be taken to mean that two radicals are linked to each other by a chemical bond. This is illustrated by the following scheme:

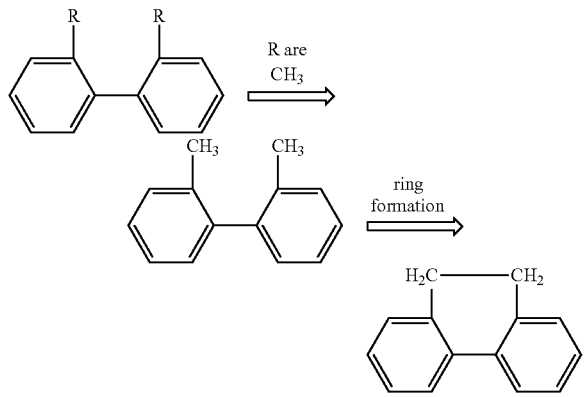

Furthermore, the expression that adjacent substituents are optionally joined to form a ring is also intended to be taken to mean that in the case where one of the two radicals represents hydrogen, the second radical is bonded at a position to which the hydrogen atom was bonded, with formation of a ring. This is illustrated by the following scheme:

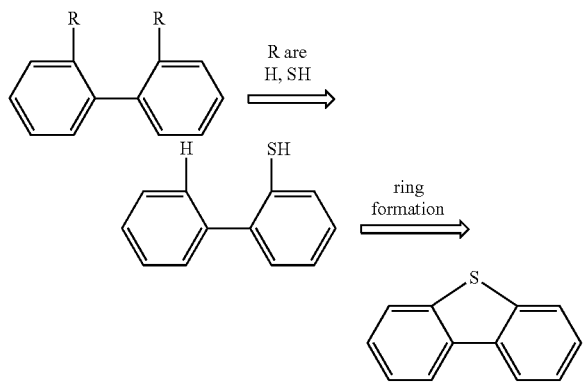

According to an embodiment of the present invention, a compound of Formula I is disclosed:

Formula I wherein n is an integer from 1 to 4; when n is 2 or more, two groups of B may be the same or different;
A is a structure represented by formula II:

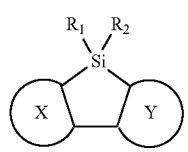

Formula II

Each of ring X and Y independently represents a substituted or unsubstituted aryl or heteroaryl group having 6 to 30 ring atoms;

At least one of X and Y is a fused ring system;

$R_1$ and $R_2$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

$R_1$ and $R_2$ are optionally joined to form a ring;

B represents a group represented by Formula III:

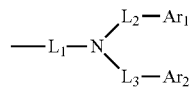

Formula III wherein Each of $Ar_1$ and $Ar_2$ are independently selected from the group consisting of a substituted or unsubstituted aryl group having 6 to 30 ring carbon atoms or a substituted or unsubstituted heteroaryl group having 5 to 30 ring atoms and combinations thereof;

Each of $L_1$, $L_2$, and $L_3$ are independently selected from the group consisting of a single bond, an arylene group having 6 to 30 ring carbon atoms, a heteroarylene group having 5 to 30 ring atoms, and combinations thereof;

$Ar_1$ and $Ar_2$ can be optionally joined to form a ring.

In one preferred embodiment, wherein at least one of X and Y in formula II is a fused ring system with at least two six-membered aryl or heteroaryl rings fused together. In this embodiment, for example, naphthalene belongs to the fused ring system defined in this embodiment, and those skilled in the art can understand naphthalene has a structure in which two six-membered arylene (benzene) rings are fused together. The structure defined by the above fused ring system is readily understood by those skilled in the art by way of illustration of naphthalene. Examples of such fused ring systems also include, but are not limited to, quinoline, isoquinoline, quinazoline, phenanthrene, azaphenanthrene, anthracene, acridine, phenothiazine, phenoxazine, and the like.

In one preferred embodiment, wherein at least one of X and Y in formula II is a fused ring system in which at least two aryl or heteroaryl rings are fused together to form a fused ring system comprising at least 10 carbon atoms, or a fused ring system comprising at least 10 combination of carbon atom and nitrogen atom.

In one preferred embodiment, wherein the structure A is represented by Formula IV-XXIII:
Formula IV
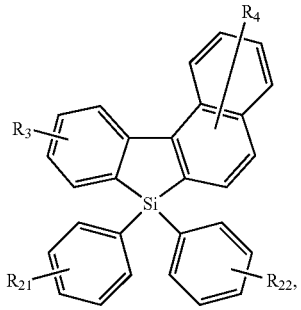
Formula V
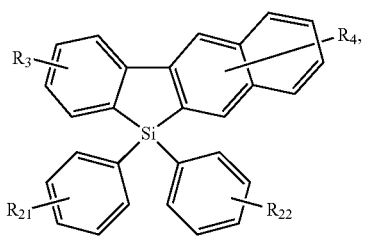
Formula VI
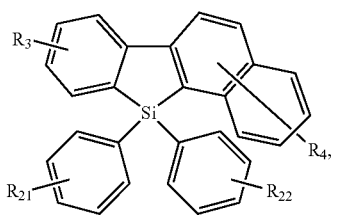
Formula VII
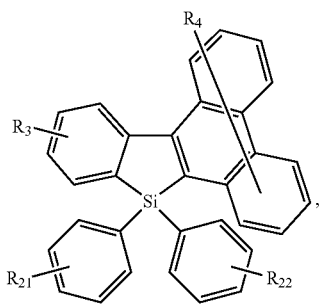
Formula VIII
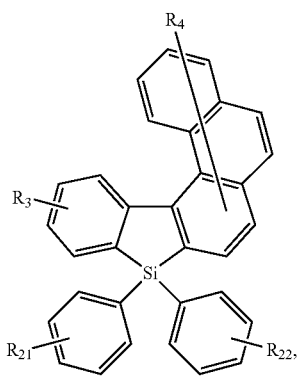
Formula IX
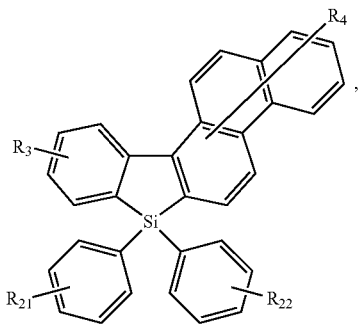
Formula X
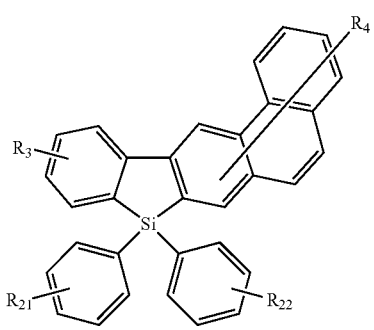
Formula XI
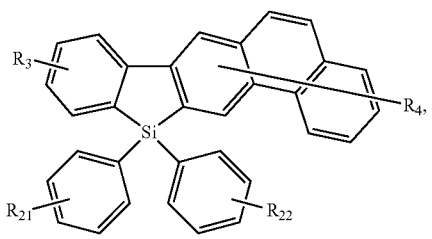
Formula XII
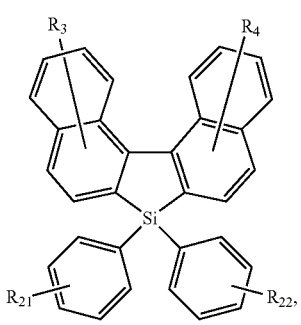
Formula XIII
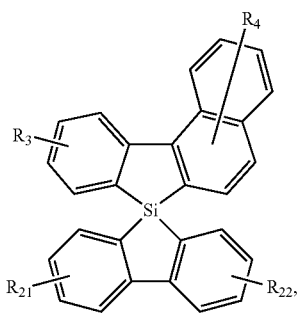

Formula XIV
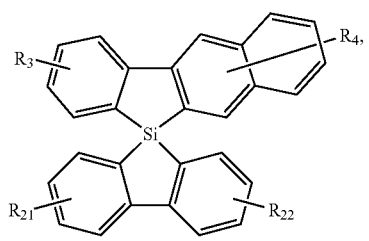
Formula XV
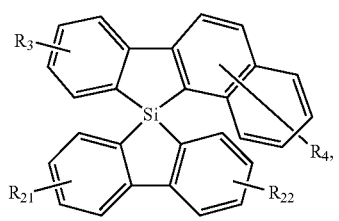
Formula XVI
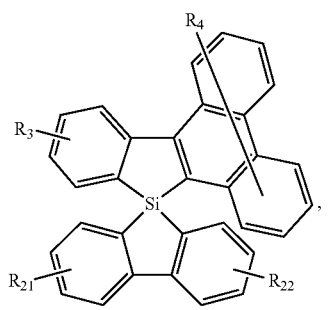
Formula XVII
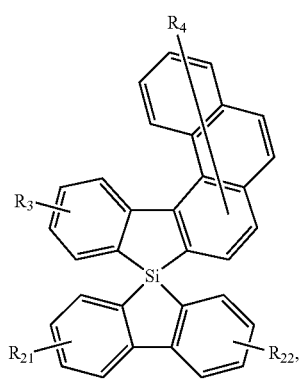
Formula XVIII
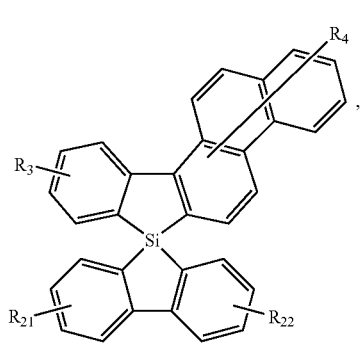
Formula XIX
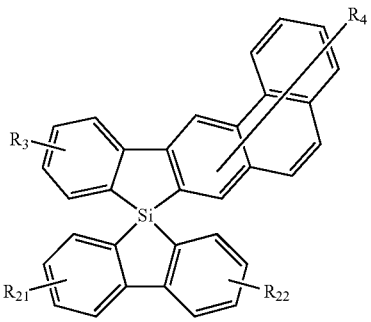
Formula XX
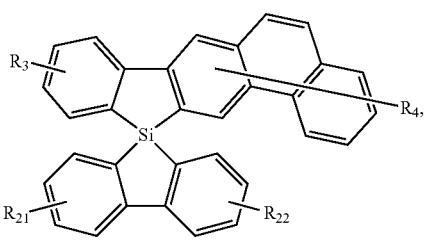
Formula XXI
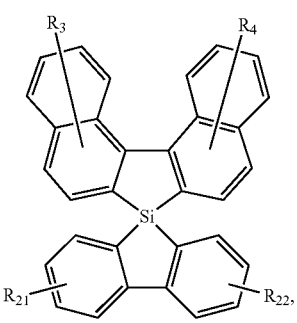
Formula XXII
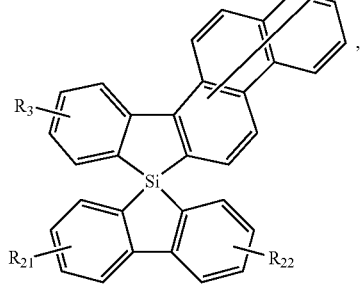
Formula XXIII
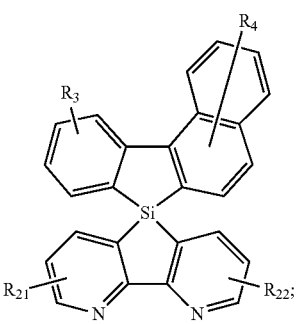

Wherein $R_{21}$, $R_{22}$, $R_3$ and $R_4$ each independently represents mono, multiple or no substitution; when they represent multi substitutions, the adjacent substitution can be joined to form a ring;

$R_{21}$, $R_{22}$, $R_3$ and $R_4$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof.

In one preferred embodiment, wherein the structure B is represented by Formula XXIV:

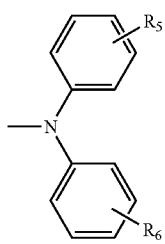

Formula XXIV wherein $R_5$ and $R_6$ each independently represents mono, di, tri, tetra, penta or no substitution; when they represent multi substitutions, the adjacent substitution can be joined to form a ring;

$R_5$ and $R_6$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof.

In one preferred embodiment, wherein the structure B is represented by Formula XXV:

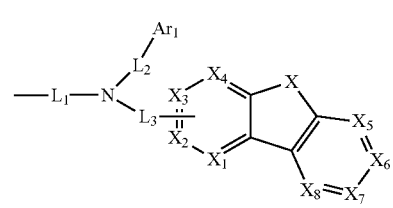

Formula XXV wherein X is O or S, $X_1$, $X_2$, $X_3$, $X_4$, $X_5$, $X_6$, $X_7$ and $X_8$ are independently selected from C, CRx, or N, wherein Rx is independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof.

In one preferred embodiment, wherein the structure B is selected from the group consisting of:

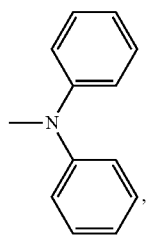

B1

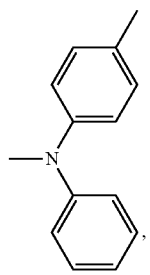

B2

B3 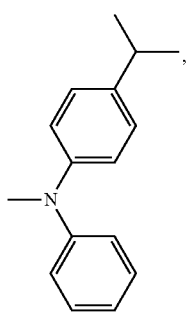
B4 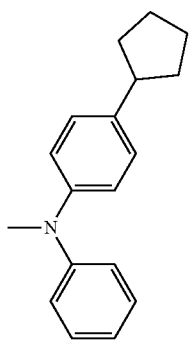
B5 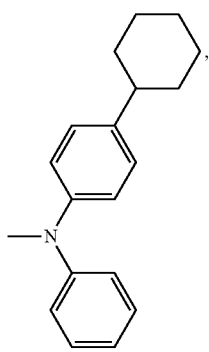
B6 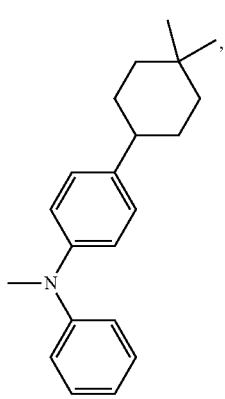
B7 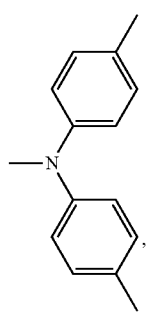
B8 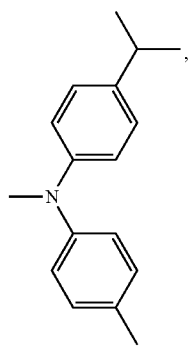
B9 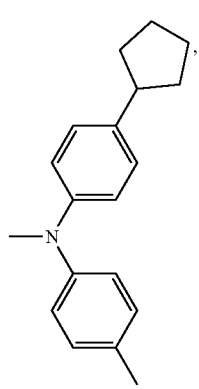
B10 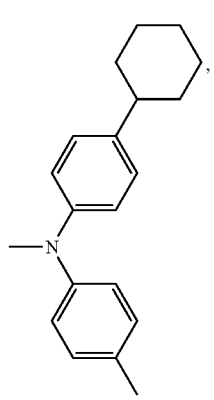

B11 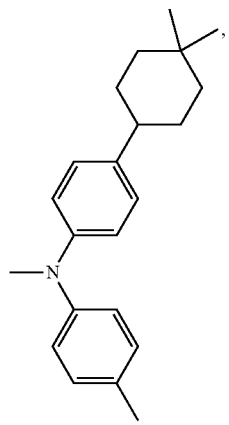
B12 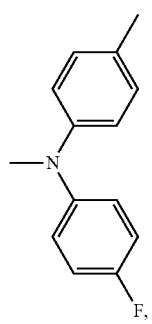
B13 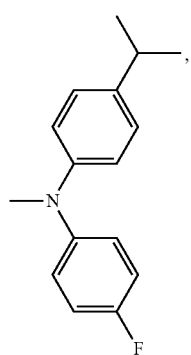
B14 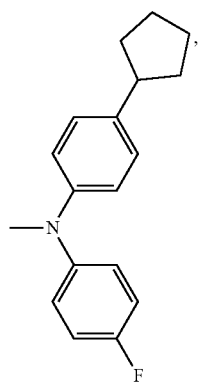
B15 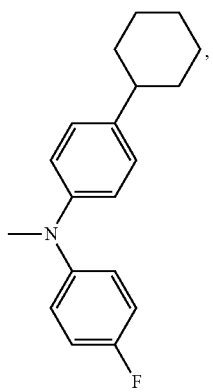
B16 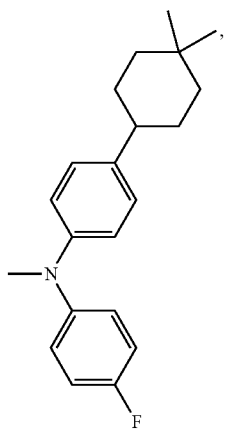
B17 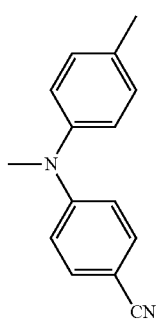
B18 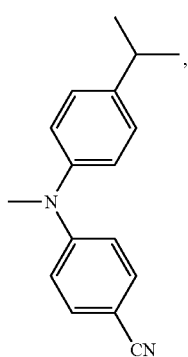

B19
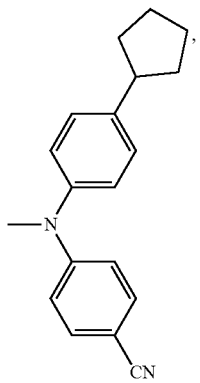
B20
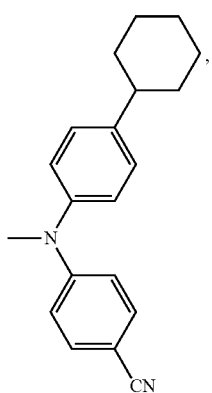
B21
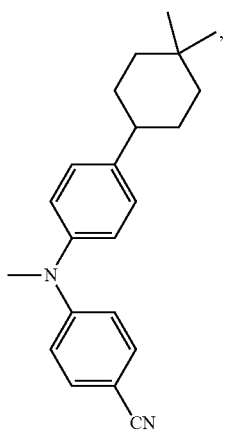
B22
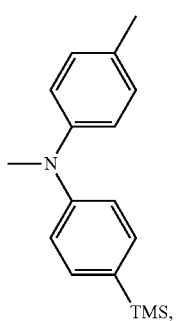
B23
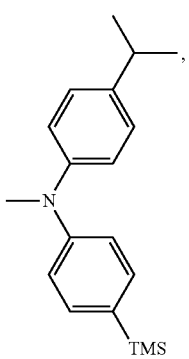
B24
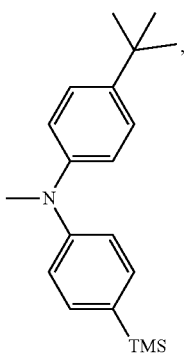
B25
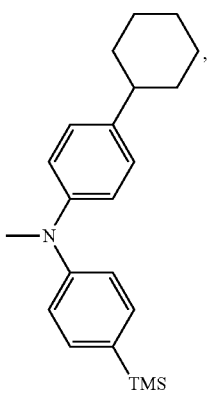
B26
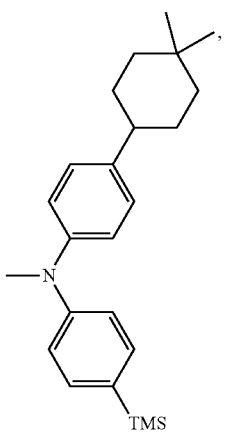

B27
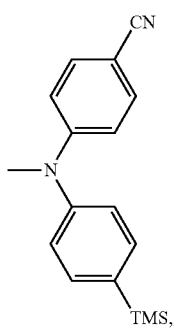
B28
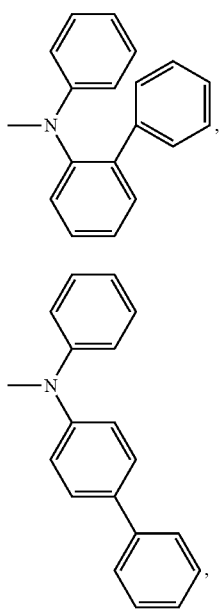
B29
B30
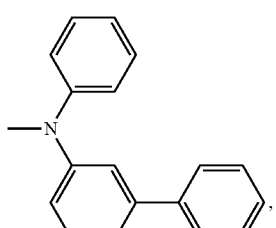
B31
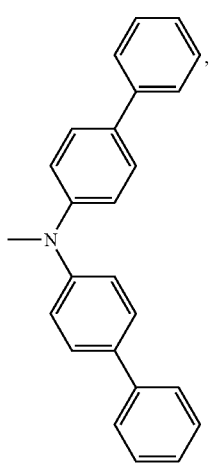
B32
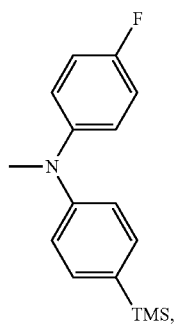
B33
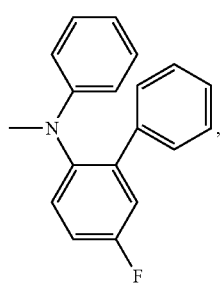
B34
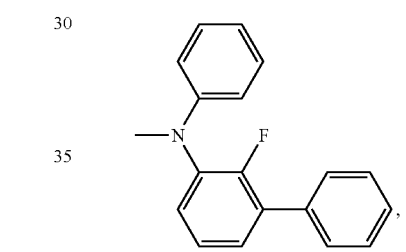
B35
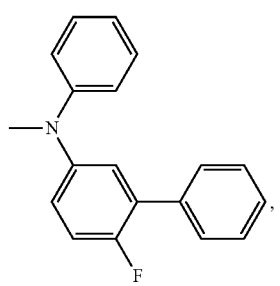
B36
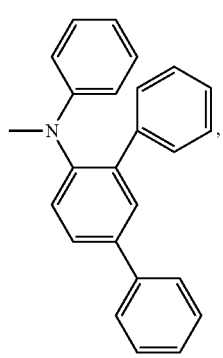

B37 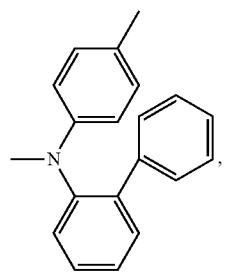
B38 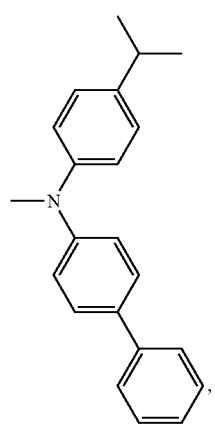
B39 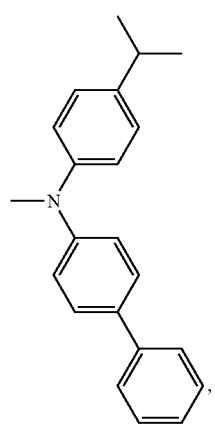
B40 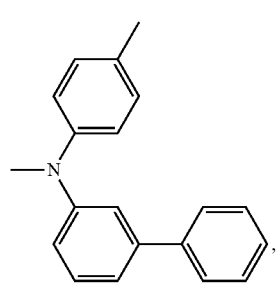
B41 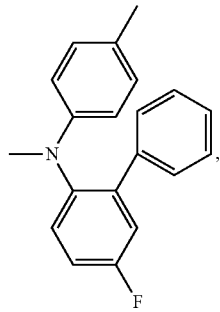
B42 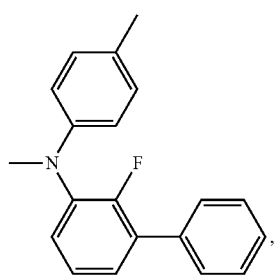
B43 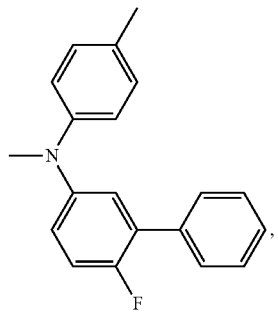
B44 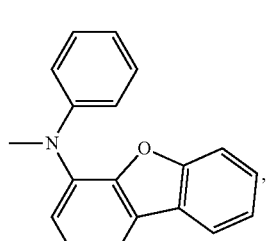
B45 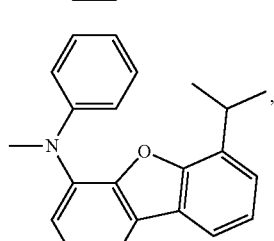
B46 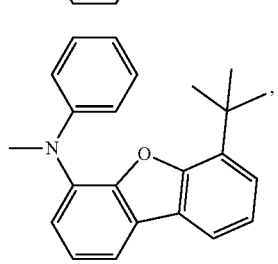

B47
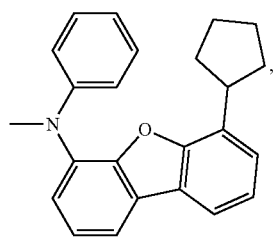
B48
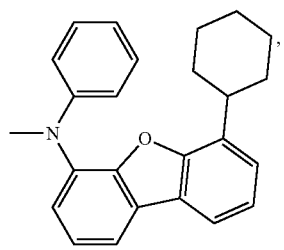
B49
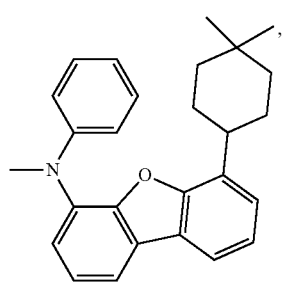
B50
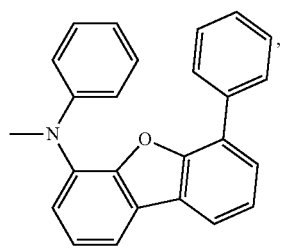
B51
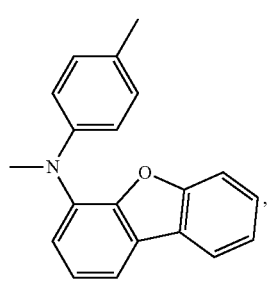
B52
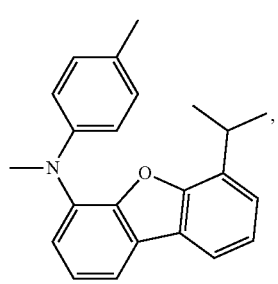
B53
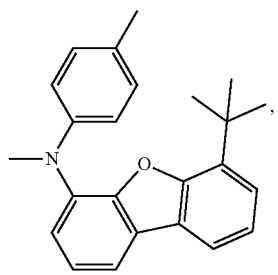
B54
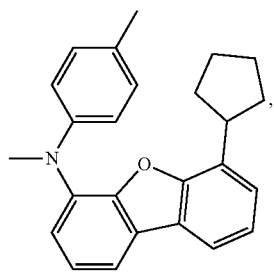
B55
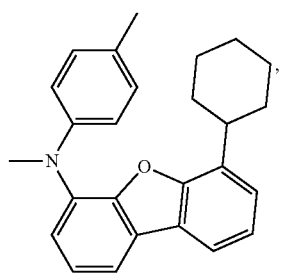
B56
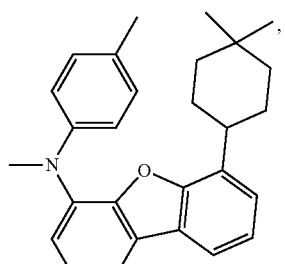
B57
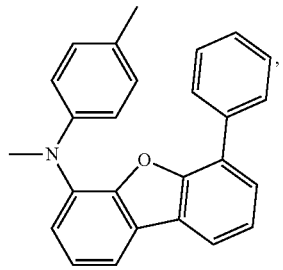

B58 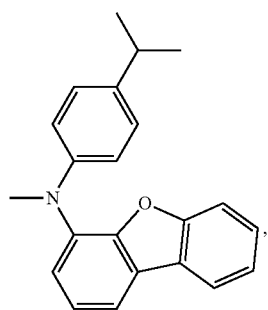
B59 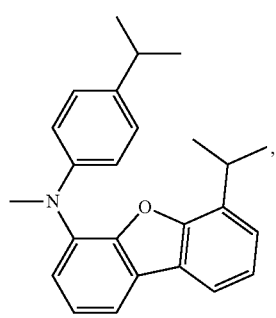
B60 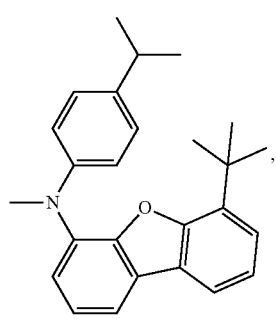
B61 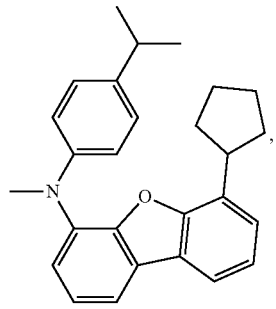
B62 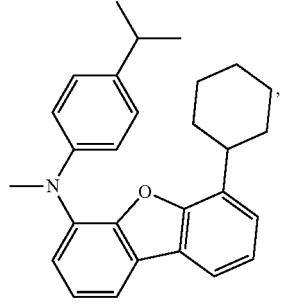
B63 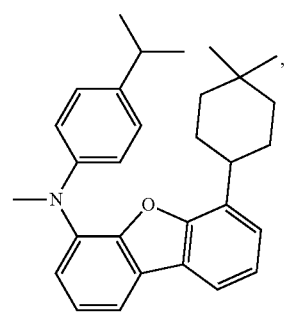
B64 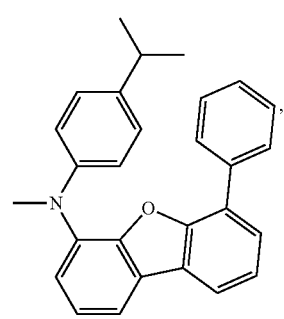
B65 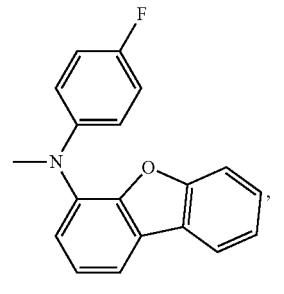
B66 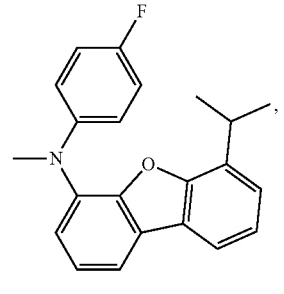
B67 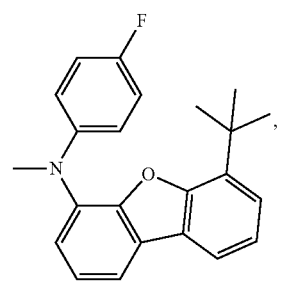

-continued
B68
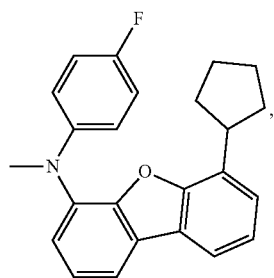
B69
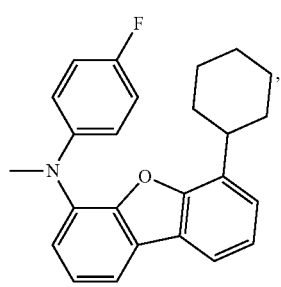
B70
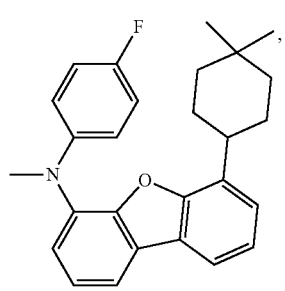
B71
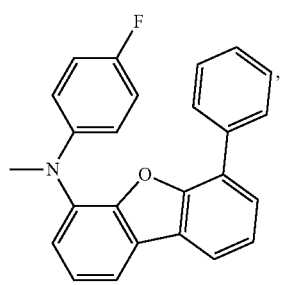
B72
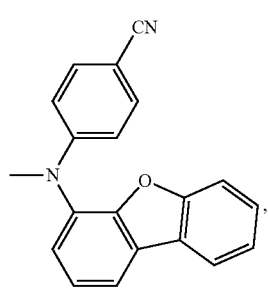
-continued
B73
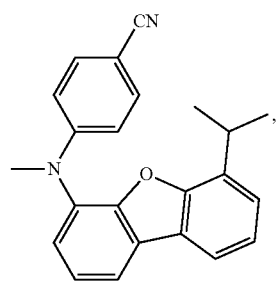
B74
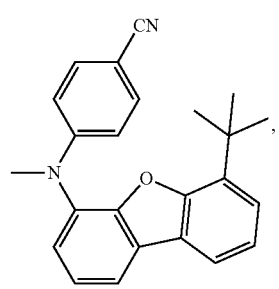
B75
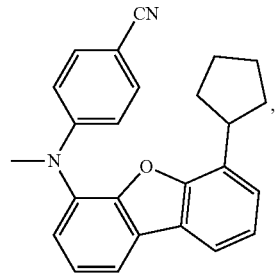
B76
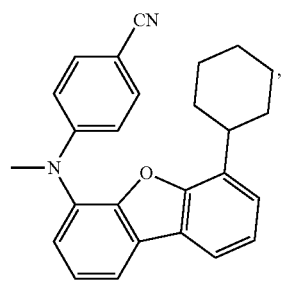
B77
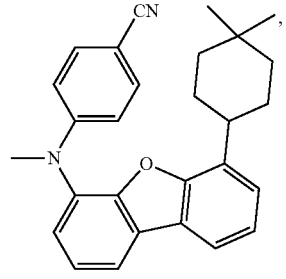

B78
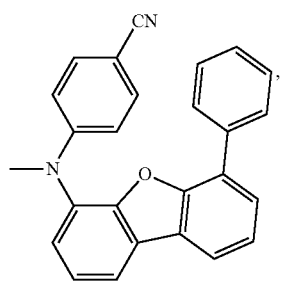
B79
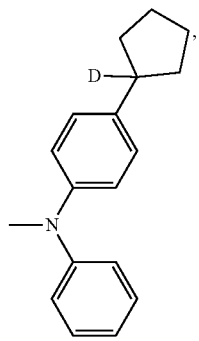
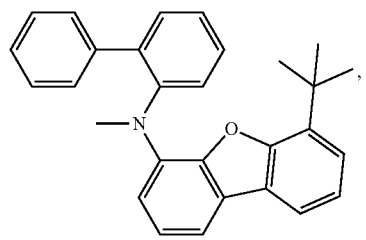
B80
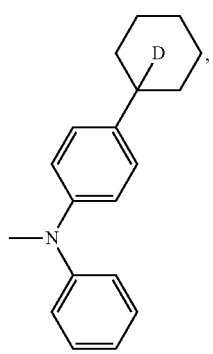
B81
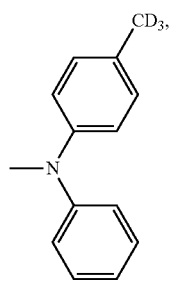
B82
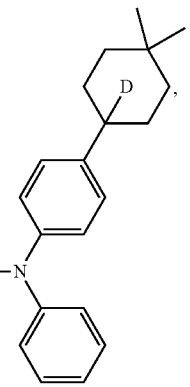
B83
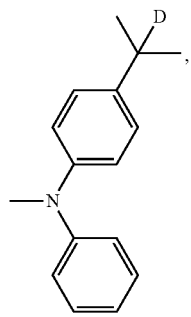
B84
B85
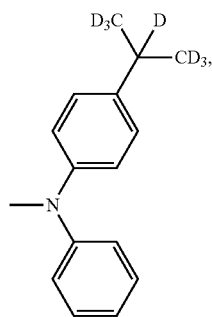
B86
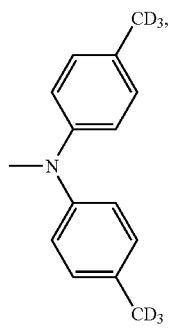

-continued
B87 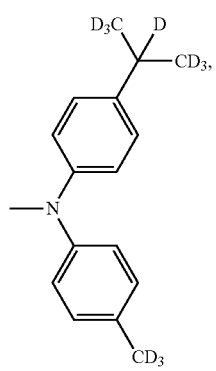
B88 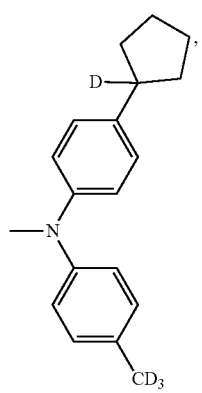
B89 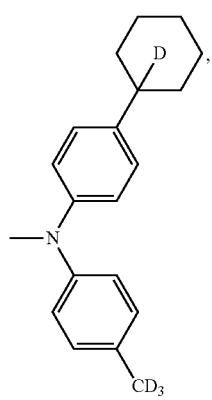
B90 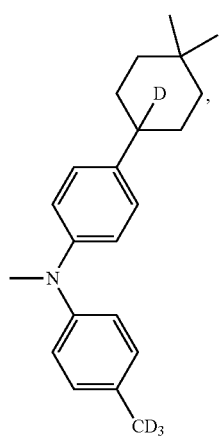
-continued
B91 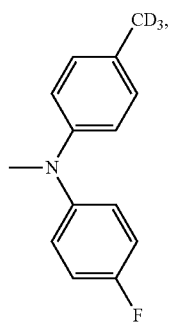
B92 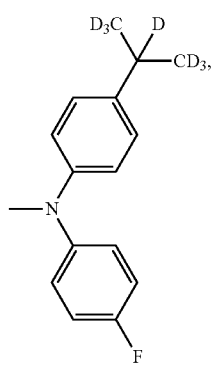
B93 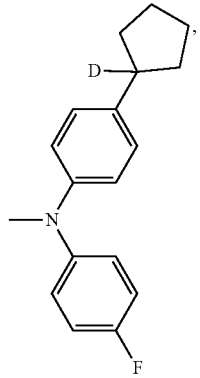
B94 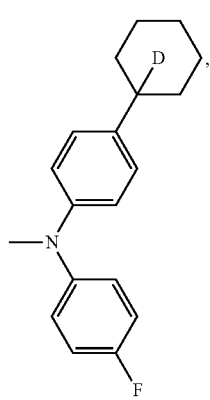

B95 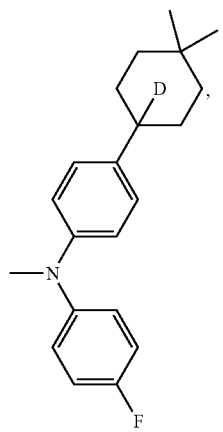
B96 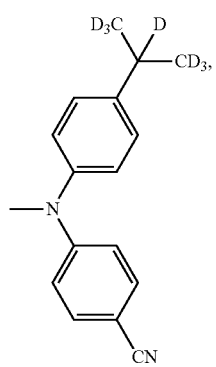
B97 
B98 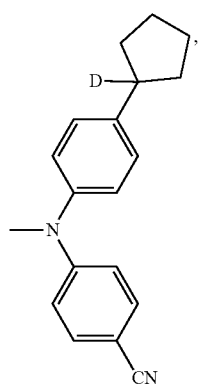
B99 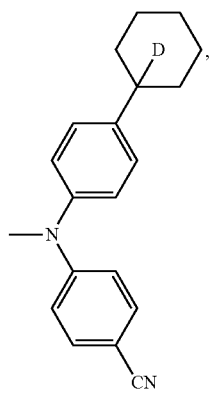
B100 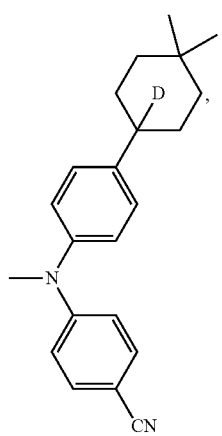
B101 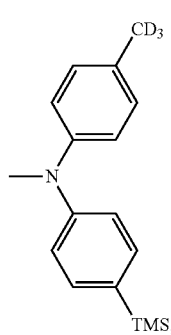
B102 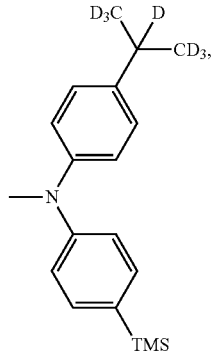

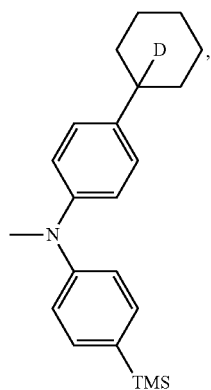
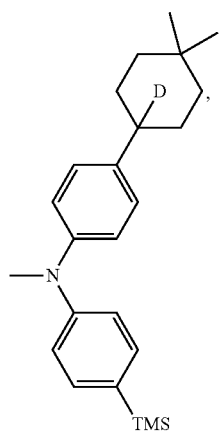
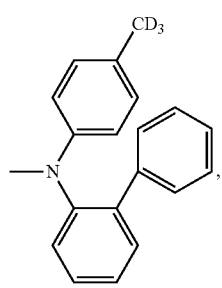
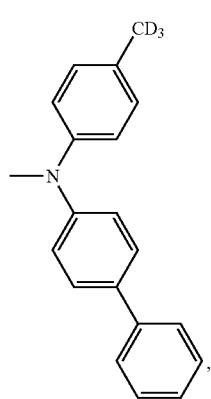
B103
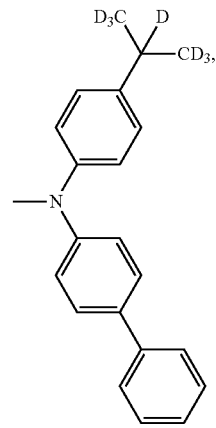
B104
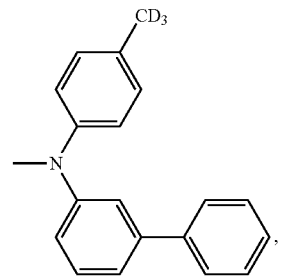
B105
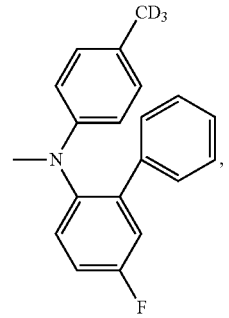
B106
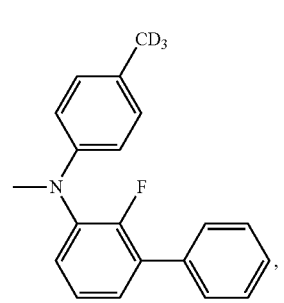
B107
B108
B109
B110
B111
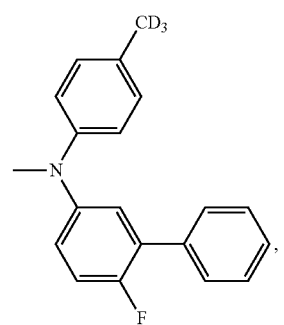

B112 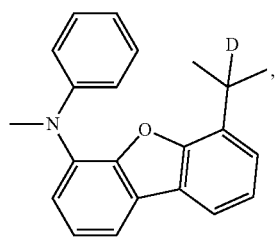
B113 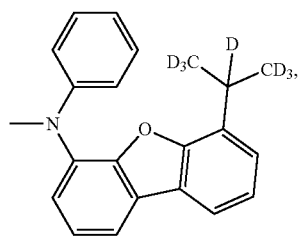
B114 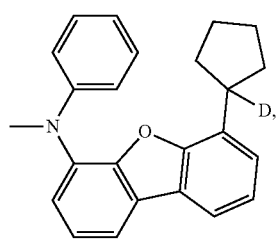
B115 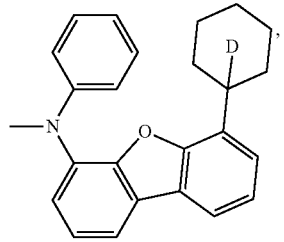
B116 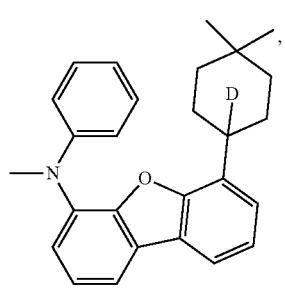
B117 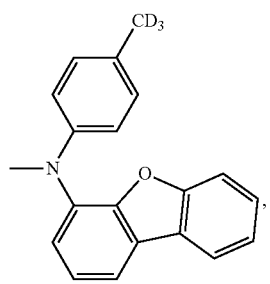
B118 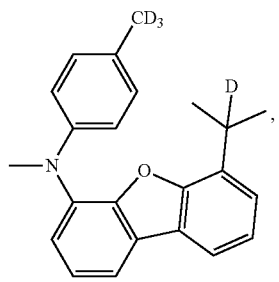
B119 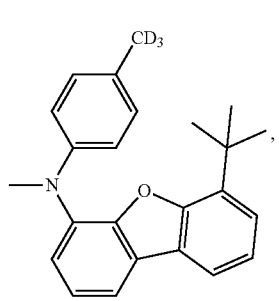
B120 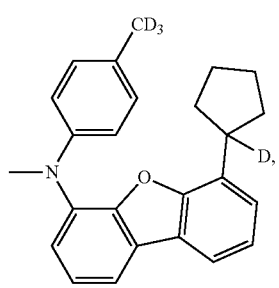
B121 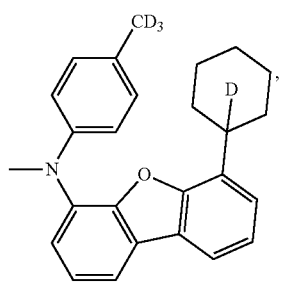
B122 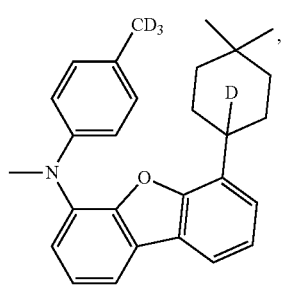

B123 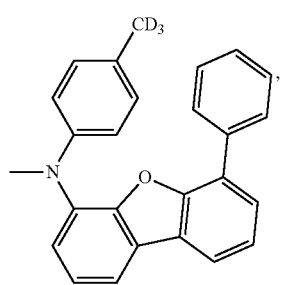
B124 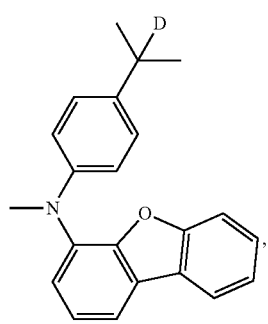
B125 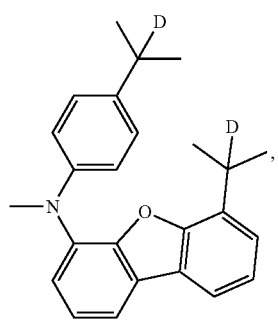
B126 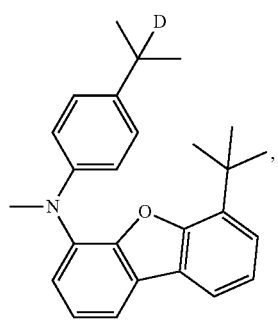
B127 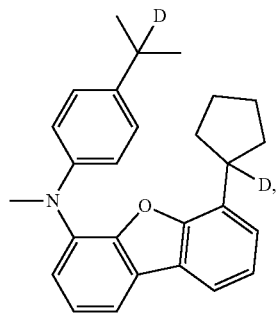
B128 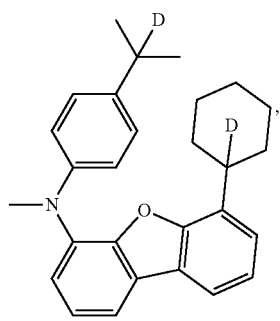
B129 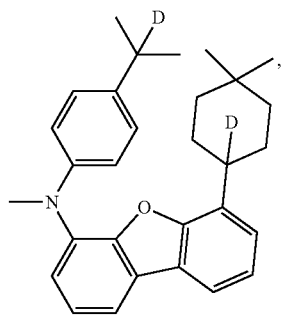
B130 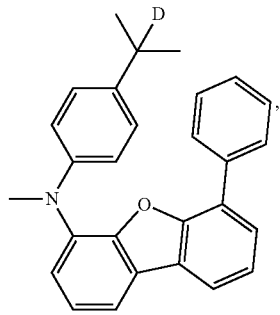
B131 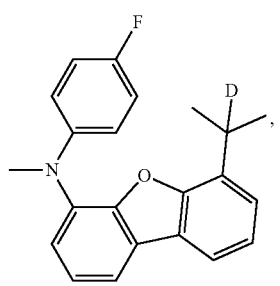
B132 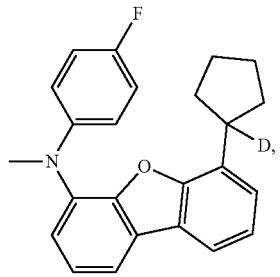

B133 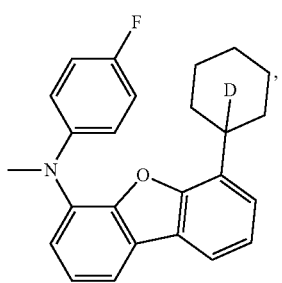
B134 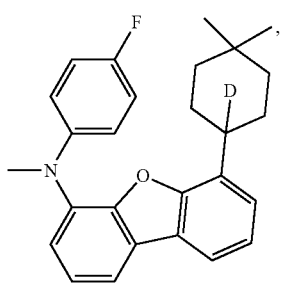
B135 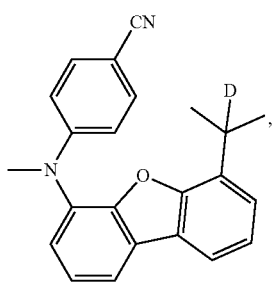
B136 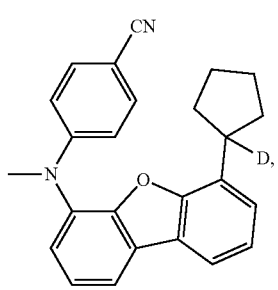
B137 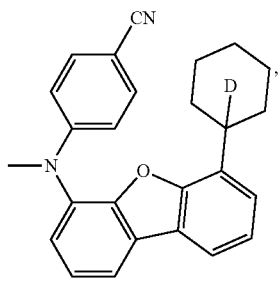
B138 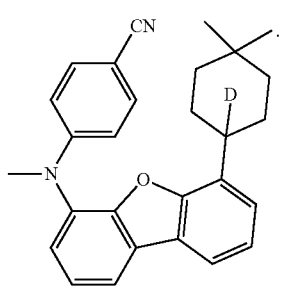
In one preferred embodiment, wherein the compound is a structure represented by formula XXVI-XXXIII:
Formula XXVI 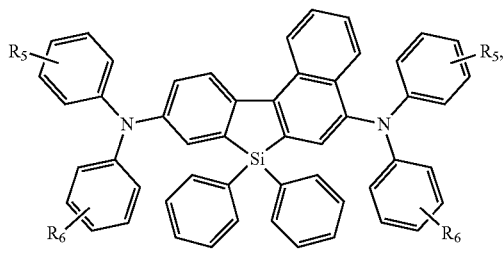
Formula XXVII 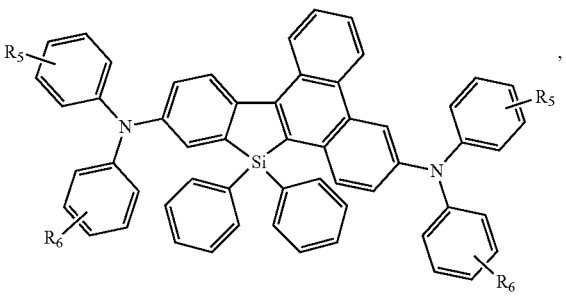
Formula XXVIII 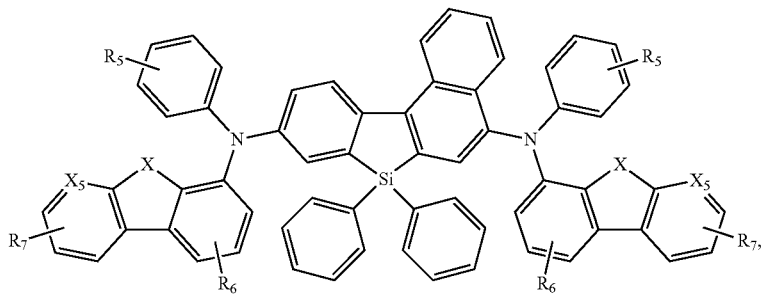

-continued

Formula XXIX

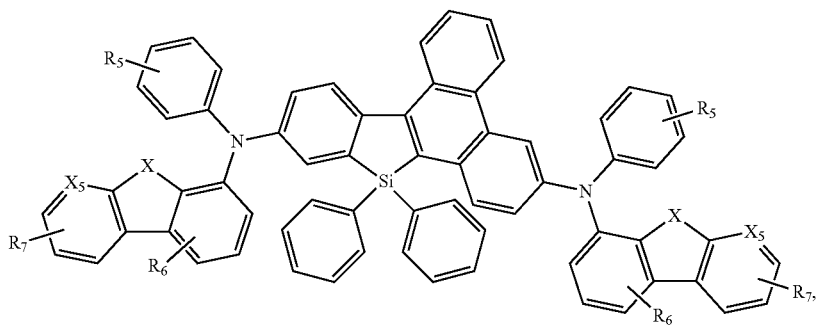

Formula XXX

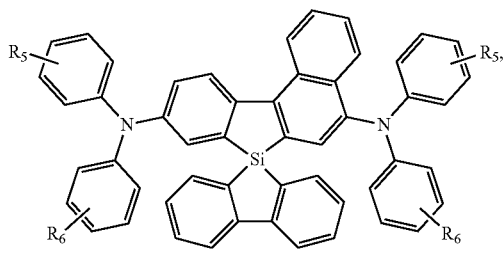

Formula XXXI

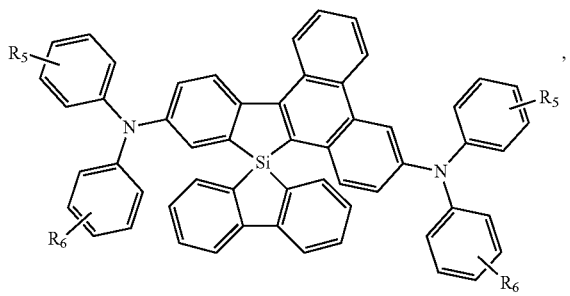

Formula XXXII

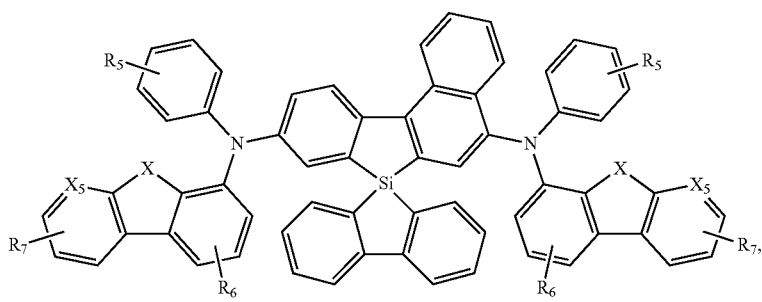

Formula XXXIII

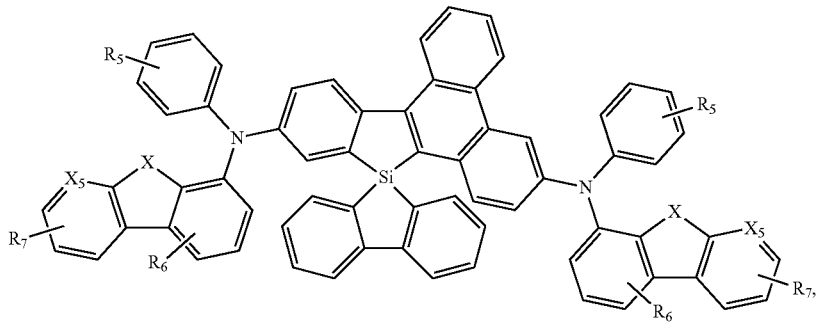

wherein X is O or S, $X_5$ is selected from CRx, C, or N; $R_5$, $R_6$ and $R_7$ each independently represents mono, multi or no substitution; when they represent multi substitutions, the adjacent substitution can be joined to form a ring;

Rx, $R_5$, $R_6$ and $R_7$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof.

In one preferred embodiment, wherein the compound has the structure of compound #1-1104. Compounds #1-1104 have the structure of formula I, and the structures A, B and n of formula I are respectively listed in the corresponding table.

A─(─B)$_n$  formula I

| Compound # | A | B | n |
|---|---|---|---|
| 1. | A1 | B1 | 1 |
| 2. | A1 | B2 | 1 |
| 3. | A1 | B3 | 1 |
| 4. | A1 | B4 | 1 |
| 5. | A1 | B5 | 1 |
| 6. | A1 | B6 | 1 |
| 7. | A1 | B7 | 1 |
| 8. | A1 | B8 | 1 |
| 9. | A1 | B9 | 1 |
| 10. | A1 | B10 | 1 |
| 11. | A1 | B11 | 1 |
| 12. | A1 | B12 | 1 |
| 13. | A1 | B13 | 1 |
| 14. | A1 | B14 | 1 |
| 15. | A1 | B15 | 1 |
| 16. | A1 | B16 | 1 |
| 17. | A1 | B17 | 1 |
| 18. | A1 | B18 | 1 |
| 19. | A1 | B19 | 1 |
| 20. | A1 | B20 | 1 |
| 21. | A1 | B21 | 1 |
| 22. | A1 | B22 | 1 |
| 23. | A1 | B23 | 1 |
| 24. | A1 | B24 | 1 |
| 25. | A1 | B25 | 1 |
| 26. | A1 | B26 | 1 |
| 27. | A1 | B27 | 1 |
| 28. | A1 | B28 | 1 |
| 29. | A1 | B29 | 1 |
| 30. | A1 | B30 | 1 |
| 31. | A1 | B31 | 1 |
| 32. | A1 | B32 | 1 |
| 33. | A1 | B33 | 1 |
| 34. | A1 | B34 | 1 |
| 35. | A1 | B35 | 1 |
| 36. | A1 | B36 | 1 |
| 37. | A1 | B37 | 1 |
| 38. | A1 | B38 | 1 |
| 39. | A1 | B39 | 1 |
| 40. | A1 | B40 | 1 |
| 41. | A1 | B41 | 1 |
| 42. | A1 | B42 | 1 |
| 43. | A1 | B43 | 1 |
| 44. | A1 | B44 | 1 |
| 45. | A1 | B45 | 1 |
| 46. | A1 | B46 | 1 |
| 47. | A1 | B47 | 1 |
| 48. | A1 | B48 | 1 |
| 49. | A1 | B49 | 1 |
| 50. | A1 | B50 | 1 |
| 51. | A1 | B51 | 1 |
| 52. | A1 | B52 | 1 |
| 53. | A1 | B53 | 1 |
| 54. | A1 | B54 | 1 |
| 55. | A1 | B55 | 1 |
| 56. | A1 | B56 | 1 |
| 57. | A1 | B57 | 1 |
| 58. | A1 | B58 | 1 |
| 59. | A1 | B59 | 1 |
| 60. | A1 | B60 | 1 |
| 61. | A1 | B61 | 1 |
| 62. | A1 | B62 | 1 |
| 63. | A1 | B63 | 1 |
| 64. | A1 | B64 | 1 |
| 65. | A1 | B65 | 1 |
| 66. | A1 | B66 | 1 |
| 67. | A1 | B67 | 1 |
| 68. | A1 | B68 | 1 |
| 69. | A1 | B69 | 1 |

-continued

| Compound # | A | B | n |
|---|---|---|---|
| 70. | A1 | B70 | 1 |
| 71. | A1 | B71 | 1 |
| 72. | A1 | B72 | 1 |
| 73. | A1 | B73 | 1 |
| 74. | A1 | B74 | 1 |
| 75. | A1 | B75 | 1 |
| 76. | A1 | B76 | 1 |
| 77. | A1 | B77 | 1 |
| 78. | A1 | B78 | 1 |
| 79. | A1 | B79 | 1 |
| 80. | A1 | B80 | 1 |
| 81. | A1 | B81 | 1 |
| 82. | A1 | B82 | 1 |
| 83. | A1 | B83 | 1 |
| 84. | A1 | B84 | 1 |
| 85. | A1 | B85 | 1 |
| 86. | A1 | B86 | 1 |
| 87. | A1 | B87 | 1 |
| 88. | A1 | B88 | 1 |
| 89. | A1 | B89 | 1 |
| 90. | A1 | B90 | 1 |
| 91. | A1 | B91 | 1 |
| 92. | A1 | B92 | 1 |
| 93. | A1 | B93 | 1 |
| 94. | A1 | B94 | 1 |
| 95. | A1 | B95 | 1 |
| 96. | A1 | B96 | 1 |
| 97. | A1 | B97 | 1 |
| 98. | A1 | B98 | 1 |
| 99. | A1 | B99 | 1 |
| 100. | A1 | B100 | 1 |
| 101. | A1 | B101 | 1 |
| 102. | A1 | B102 | 1 |
| 103. | A1 | B103 | 1 |
| 104. | A1 | B104 | 1 |
| 105. | A1 | B105 | 1 |
| 106. | A1 | B106 | 1 |
| 107. | A1 | B107 | 1 |
| 108. | A1 | B108 | 1 |
| 109. | A1 | B109 | 1 |
| 110. | A1 | B110 | 1 |
| 111. | A1 | B111 | 1 |
| 112. | A1 | B112 | 1 |
| 113. | A1 | B113 | 1 |
| 114. | A1 | B114 | 1 |
| 115. | A1 | B115 | 1 |
| 116. | A1 | B116 | 1 |
| 117. | A1 | B117 | 1 |
| 118. | A1 | B118 | 1 |
| 119. | A1 | B119 | 1 |
| 120. | A1 | B120 | 1 |
| 121. | A1 | B121 | 1 |
| 122. | A1 | B122 | 1 |
| 123. | A1 | B123 | 1 |
| 124. | A1 | B124 | 1 |
| 125. | A1 | B125 | 1 |
| 126. | A1 | B126 | 1 |
| 127. | A1 | B127 | 1 |
| 128. | A1 | B128 | 1 |
| 129. | A1 | B129 | 1 |
| 130. | A1 | B130 | 1 |
| 131. | A1 | B131 | 1 |
| 132. | A1 | B132 | 1 |
| 133. | A1 | B133 | 1 |
| 134. | A1 | B134 | 1 |
| 135. | A1 | B135 | 1 |
| 136. | A1 | B136 | 1 |
| 137. | A1 | B137 | 1 |
| 138. | A1 | B138 | 1 |
| 139. | A2 | B1 | 2 |
| 140. | A2 | B2 | 2 |
| 141. | A2 | B3 | 2 |
| 142. | A2 | B4 | 2 |
| 143. | A2 | B5 | 2 |
| 144. | A2 | B6 | 2 |
| 145. | A2 | B7 | 2 |
| 146. | A2 | B8 | 2 |

| Compound # | A | B | n |
|---|---|---|---|
| 147. | A2 | B9 | 2 |
| 148. | A2 | B10 | 2 |
| 149. | A2 | B11 | 2 |
| 150. | A2 | B12 | 2 |
| 151. | A2 | B13 | 2 |
| 152. | A2 | B14 | 2 |
| 153. | A2 | B15 | 2 |
| 154. | A2 | B16 | 2 |
| 155. | A2 | B17 | 2 |
| 156. | A2 | B18 | 2 |
| 157. | A2 | B19 | 2 |
| 158. | A2 | B20 | 2 |
| 159. | A2 | B21 | 2 |
| 160. | A2 | B22 | 2 |
| 161. | A2 | B23 | 2 |
| 162. | A2 | B24 | 2 |
| 163. | A2 | B25 | 2 |
| 164. | A2 | B26 | 2 |
| 165. | A2 | B27 | 2 |
| 166. | A2 | B28 | 2 |
| 167. | A2 | B29 | 2 |
| 168. | A2 | B30 | 2 |
| 169. | A2 | B31 | 2 |
| 170. | A2 | B32 | 2 |
| 171. | A2 | B33 | 2 |
| 172. | A2 | B34 | 2 |
| 173. | A2 | B35 | 2 |
| 174. | A2 | B36 | 2 |
| 175. | A2 | B37 | 2 |
| 176. | A2 | B38 | 2 |
| 177. | A2 | B39 | 2 |
| 178. | A2 | B40 | 2 |
| 179. | A2 | B41 | 2 |
| 180. | A2 | B42 | 2 |
| 181. | A2 | B43 | 2 |
| 182. | A2 | B44 | 2 |
| 183. | A2 | B45 | 2 |
| 184. | A2 | B46 | 2 |
| 185. | A2 | B47 | 2 |
| 186. | A2 | B48 | 2 |
| 187. | A2 | B49 | 2 |
| 188. | A2 | B50 | 2 |
| 189. | A2 | B51 | 2 |
| 190. | A2 | B52 | 2 |
| 191. | A2 | B53 | 2 |
| 192. | A2 | B54 | 2 |
| 193. | A2 | B55 | 2 |
| 194. | A2 | B56 | 2 |
| 195. | A2 | B57 | 2 |
| 196. | A2 | B58 | 2 |
| 197. | A2 | B59 | 2 |
| 198. | A2 | B60 | 2 |
| 199. | A2 | B61 | 2 |
| 200. | A2 | B62 | 2 |
| 201. | A2 | B63 | 2 |
| 202. | A2 | B64 | 2 |
| 203. | A2 | B65 | 2 |
| 204. | A2 | B66 | 2 |
| 205. | A2 | B67 | 2 |
| 206. | A2 | B68 | 2 |
| 207. | A2 | B69 | 2 |
| 208. | A2 | B70 | 2 |
| 209. | A2 | B71 | 2 |
| 210. | A2 | B72 | 2 |
| 211. | A2 | B73 | 2 |
| 212. | A2 | B74 | 2 |
| 213. | A2 | B75 | 2 |
| 214. | A2 | B76 | 2 |
| 215. | A2 | B77 | 2 |
| 216. | A2 | B78 | 2 |
| 217. | A2 | B79 | 2 |
| 218. | A2 | B80 | 2 |
| 219. | A2 | B81 | 2 |
| 220. | A2 | B82 | 2 |
| 221. | A2 | B83 | 2 |
| 222. | A2 | B84 | 2 |
| 223. | A2 | B85 | 2 |
| 224. | A2 | B86 | 2 |
| 225. | A2 | B87 | 2 |
| 226. | A2 | B88 | 2 |
| 227. | A2 | B89 | 2 |
| 228. | A2 | B90 | 2 |
| 229. | A2 | B91 | 2 |
| 230. | A2 | B92 | 2 |
| 231. | A2 | B93 | 2 |
| 232. | A2 | B94 | 2 |
| 233. | A2 | B95 | 2 |
| 234. | A2 | B96 | 2 |
| 235. | A2 | B97 | 2 |
| 236. | A2 | B98 | 2 |
| 237. | A2 | B99 | 2 |
| 238. | A2 | B100 | 2 |
| 239. | A2 | B101 | 2 |
| 240. | A2 | B102 | 2 |
| 241. | A2 | B103 | 2 |
| 242. | A2 | B104 | 2 |
| 243. | A2 | B105 | 2 |
| 244. | A2 | B106 | 2 |
| 245. | A2 | B107 | 2 |
| 246. | A2 | B108 | 2 |
| 247. | A2 | B109 | 2 |
| 248. | A2 | B110 | 2 |
| 249. | A2 | B111 | 2 |
| 250. | A2 | B112 | 2 |
| 251. | A2 | B113 | 2 |
| 252. | A2 | B114 | 2 |
| 253. | A2 | B115 | 2 |
| 254. | A2 | B116 | 2 |
| 255. | A2 | B117 | 2 |
| 256. | A2 | B118 | 2 |
| 257. | A2 | B119 | 2 |
| 258. | A2 | B120 | 2 |
| 259. | A2 | B121 | 2 |
| 260. | A2 | B122 | 2 |
| 261. | A2 | B123 | 2 |
| 262. | A2 | B124 | 2 |
| 263. | A2 | B125 | 2 |
| 264. | A2 | B126 | 2 |
| 265. | A2 | B127 | 2 |
| 266. | A2 | B128 | 2 |
| 267. | A2 | B129 | 2 |
| 268. | A2 | B130 | 2 |
| 269. | A2 | B131 | 2 |
| 270. | A2 | B132 | 2 |
| 271. | A2 | B133 | 2 |
| 272. | A2 | B134 | 2 |
| 273. | A2 | B135 | 2 |
| 274. | A2 | B136 | 2 |
| 275. | A2 | B137 | 2 |
| 276. | A2 | B138 | 2 |
| 277. | A3 | B1 | 1 |
| 278. | A3 | B2 | 1 |
| 279. | A3 | B3 | 1 |
| 280. | A3 | B4 | 1 |
| 281. | A3 | B5 | 1 |
| 282. | A3 | B6 | 1 |
| 283. | A3 | B7 | 1 |
| 284. | A3 | B8 | 1 |
| 285. | A3 | B9 | 1 |
| 286. | A3 | B10 | 1 |
| 287. | A3 | B11 | 1 |
| 288. | A3 | B12 | 1 |
| 289. | A3 | B13 | 1 |
| 290. | A3 | B14 | 1 |
| 291. | A3 | B15 | 1 |
| 292. | A3 | B16 | 1 |
| 293. | A3 | B17 | 1 |
| 294. | A3 | B18 | 1 |
| 295. | A3 | B19 | 1 |
| 296. | A3 | B20 | 1 |
| 297. | A3 | B21 | 1 |
| 298. | A3 | B22 | 1 |
| 299. | A3 | B23 | 1 |
| 300. | A3 | B24 | 1 |

| Compound # | A | B | n |
|---|---|---|---|
| 301. | A3 | B25 | 1 |
| 302. | A3 | B26 | 1 |
| 303. | A3 | B27 | 1 |
| 304. | A3 | B28 | 1 |
| 305. | A3 | B29 | 1 |
| 306. | A3 | B30 | 1 |
| 307. | A3 | B31 | 1 |
| 308. | A3 | B32 | 1 |
| 309. | A3 | B33 | 1 |
| 310. | A3 | B34 | 1 |
| 311. | A3 | B35 | 1 |
| 312. | A3 | B36 | 1 |
| 313. | A3 | B37 | 1 |
| 314. | A3 | B38 | 1 |
| 315. | A3 | B39 | 1 |
| 316. | A3 | B40 | 1 |
| 317. | A3 | B41 | 1 |
| 318. | A3 | B42 | 1 |
| 319. | A3 | B43 | 1 |
| 320. | A3 | B44 | 1 |
| 321. | A3 | B45 | 1 |
| 322. | A3 | B46 | 1 |
| 323. | A3 | B47 | 1 |
| 324. | A3 | B48 | 1 |
| 325. | A3 | B49 | 1 |
| 326. | A3 | B50 | 1 |
| 327. | A3 | B51 | 1 |
| 328. | A3 | B52 | 1 |
| 329. | A3 | B53 | 1 |
| 330. | A3 | B54 | 1 |
| 331. | A3 | B55 | 1 |
| 332. | A3 | B56 | 1 |
| 333. | A3 | B57 | 1 |
| 334. | A3 | B58 | 1 |
| 335. | A3 | B59 | 1 |
| 336. | A3 | B60 | 1 |
| 337. | A3 | B61 | 1 |
| 338. | A3 | B62 | 1 |
| 339. | A3 | B63 | 1 |
| 340. | A3 | B64 | 1 |
| 341. | A3 | B65 | 1 |
| 342. | A3 | B66 | 1 |
| 343. | A3 | B67 | 1 |
| 344. | A3 | B68 | 1 |
| 345. | A3 | B69 | 1 |
| 346. | A3 | B70 | 1 |
| 347. | A3 | B71 | 1 |
| 348. | A3 | B72 | 1 |
| 349. | A3 | B73 | 1 |
| 350. | A3 | B74 | 1 |
| 351. | A3 | B75 | 1 |
| 352. | A3 | B76 | 1 |
| 353. | A3 | B77 | 1 |
| 354. | A3 | B78 | 1 |
| 355. | A3 | B79 | 1 |
| 356. | A3 | B80 | 1 |
| 357. | A3 | B81 | 1 |
| 358. | A3 | B82 | 1 |
| 359. | A3 | B83 | 1 |
| 360. | A3 | B84 | 1 |
| 361. | A3 | B85 | 1 |
| 362. | A3 | B86 | 1 |
| 363. | A3 | B87 | 1 |
| 364. | A3 | B88 | 1 |
| 365. | A3 | B89 | 1 |
| 366. | A3 | B90 | 1 |
| 367. | A3 | B91 | 1 |
| 368. | A3 | B92 | 1 |
| 369. | A3 | B93 | 1 |
| 370. | A3 | B94 | 1 |
| 371. | A3 | B95 | 1 |
| 372. | A3 | B96 | 1 |
| 373. | A3 | B97 | 1 |
| 374. | A3 | B98 | 1 |
| 375. | A3 | B99 | 1 |
| 376. | A3 | B100 | 1 |
| 377. | A3 | B101 | 1 |
| 378. | A3 | B102 | 1 |
| 379. | A3 | B103 | 1 |
| 380. | A3 | B104 | 1 |
| 381. | A3 | B105 | 1 |
| 382. | A3 | B106 | 1 |
| 383. | A3 | B107 | 1 |
| 384. | A3 | B108 | 1 |
| 385. | A3 | B109 | 1 |
| 386. | A3 | B110 | 1 |
| 387. | A3 | B111 | 1 |
| 388. | A3 | B112 | 1 |
| 389. | A3 | B113 | 1 |
| 390. | A3 | B114 | 1 |
| 391. | A3 | B115 | 1 |
| 392. | A3 | B116 | 1 |
| 393. | A3 | B117 | 1 |
| 394. | A3 | B118 | 1 |
| 395. | A3 | B119 | 1 |
| 396. | A3 | B120 | 1 |
| 397. | A3 | B121 | 1 |
| 398. | A3 | B122 | 1 |
| 399. | A3 | B123 | 1 |
| 400. | A3 | B124 | 1 |
| 401. | A3 | B125 | 1 |
| 402. | A3 | B126 | 1 |
| 403. | A3 | B127 | 1 |
| 404. | A3 | B128 | 1 |
| 405. | A3 | B129 | 1 |
| 406. | A3 | B130 | 1 |
| 407. | A3 | B131 | 1 |
| 408. | A3 | B132 | 1 |
| 409. | A3 | B133 | 1 |
| 410. | A3 | B134 | 1 |
| 411. | A3 | B135 | 1 |
| 412. | A3 | B136 | 1 |
| 413. | A3 | B137 | 1 |
| 414. | A3 | B138 | 1 |
| 415. | A4 | B1 | 2 |
| 416. | A4 | B2 | 2 |
| 417. | A4 | B3 | 2 |
| 418. | A4 | B4 | 2 |
| 419. | A4 | B5 | 2 |
| 420. | A4 | B6 | 2 |
| 421. | A4 | B7 | 2 |
| 422. | A4 | B8 | 2 |
| 423. | A4 | B9 | 2 |
| 424. | A4 | B10 | 2 |
| 425. | A4 | B11 | 2 |
| 426. | A4 | B12 | 2 |
| 427. | A4 | B13 | 2 |
| 428. | A4 | B14 | 2 |
| 429. | A4 | B15 | 2 |
| 430. | A4 | B16 | 2 |
| 431. | A4 | B17 | 2 |
| 432. | A4 | B18 | 2 |
| 433. | A4 | B19 | 2 |
| 434. | A4 | B20 | 2 |
| 435. | A4 | B21 | 2 |
| 436. | A4 | B22 | 2 |
| 437. | A4 | B23 | 2 |
| 438. | A4 | B24 | 2 |
| 439. | A4 | B25 | 2 |
| 440. | A4 | B26 | 2 |
| 441. | A4 | B27 | 2 |
| 442. | A4 | B28 | 2 |
| 443. | A4 | B29 | 2 |
| 444. | A4 | B30 | 2 |
| 445. | A4 | B31 | 2 |
| 446. | A4 | B32 | 2 |
| 447. | A4 | B33 | 2 |
| 448. | A4 | B34 | 2 |
| 449. | A4 | B35 | 2 |
| 450. | A4 | B36 | 2 |
| 451. | A4 | B37 | 2 |
| 452. | A4 | B38 | 2 |
| 453. | A4 | B39 | 2 |
| 454. | A4 | B40 | 2 |

-continued

| Compound # | A | B | n |
|---|---|---|---|
| 455. | A4 | B41 | 2 |
| 456. | A4 | B42 | 2 |
| 457. | A4 | B43 | 2 |
| 458. | A4 | B44 | 2 |
| 459. | A4 | B45 | 2 |
| 460. | A4 | B46 | 2 |
| 461. | A4 | B47 | 2 |
| 462. | A4 | B48 | 2 |
| 463. | A4 | B49 | 2 |
| 464. | A4 | B50 | 2 |
| 465. | A4 | B51 | 2 |
| 466. | A4 | B52 | 2 |
| 467. | A4 | B53 | 2 |
| 468. | A4 | B54 | 2 |
| 469. | A4 | B55 | 2 |
| 470. | A4 | B56 | 2 |
| 471. | A4 | B57 | 2 |
| 472. | A4 | B58 | 2 |
| 473. | A4 | B59 | 2 |
| 474. | A4 | B60 | 2 |
| 475. | A4 | B61 | 2 |
| 476. | A4 | B62 | 2 |
| 477. | A4 | B63 | 2 |
| 478. | A4 | B64 | 2 |
| 479. | A4 | B65 | 2 |
| 480. | A4 | B66 | 2 |
| 481. | A4 | B67 | 2 |
| 482. | A4 | B68 | 2 |
| 483. | A4 | B69 | 2 |
| 484. | A4 | B70 | 2 |
| 485. | A4 | B71 | 2 |
| 486. | A4 | B72 | 2 |
| 487. | A4 | B73 | 2 |
| 488. | A4 | B74 | 2 |
| 489. | A4 | B75 | 2 |
| 490. | A4 | B76 | 2 |
| 491. | A4 | B77 | 2 |
| 492. | A4 | B78 | 2 |
| 493. | A4 | B79 | 2 |
| 494. | A4 | B80 | 2 |
| 495. | A4 | B81 | 2 |
| 496. | A4 | B82 | 2 |
| 497. | A4 | B83 | 2 |
| 498. | A4 | B84 | 2 |
| 499. | A4 | B85 | 2 |
| 500. | A4 | B86 | 2 |
| 501. | A4 | B87 | 2 |
| 502. | A4 | B88 | 2 |
| 503. | A4 | B89 | 2 |
| 504. | A4 | B90 | 2 |
| 505. | A4 | B91 | 2 |
| 506. | A4 | B92 | 2 |
| 507. | A4 | B93 | 2 |
| 508. | A4 | B94 | 2 |
| 509. | A4 | B95 | 2 |
| 510. | A4 | B96 | 2 |
| 511. | A4 | B97 | 2 |
| 512. | A4 | B98 | 2 |
| 513. | A4 | B99 | 2 |
| 514. | A4 | B100 | 2 |
| 515. | A4 | B101 | 2 |
| 516. | A4 | B102 | 2 |
| 517. | A4 | B103 | 2 |
| 518. | A4 | B104 | 2 |
| 519. | A4 | B105 | 2 |
| 520. | A4 | B106 | 2 |
| 521. | A4 | B107 | 2 |
| 522. | A4 | B108 | 2 |
| 523. | A4 | B109 | 2 |
| 524. | A4 | B110 | 2 |
| 525. | A4 | B111 | 2 |
| 526. | A4 | B112 | 2 |
| 527. | A4 | B113 | 2 |
| 528. | A4 | B114 | 2 |
| 529. | A4 | B115 | 2 |
| 530. | A4 | B116 | 2 |
| 531. | A4 | B117 | 2 |
| 532. | A4 | B118 | 2 |
| 533. | A4 | B119 | 2 |
| 534. | A4 | B120 | 2 |
| 535. | A4 | B121 | 2 |
| 536. | A4 | B122 | 2 |
| 537. | A4 | B123 | 2 |
| 538. | A4 | B124 | 2 |
| 539. | A4 | B125 | 2 |
| 540. | A4 | B126 | 2 |
| 541. | A4 | B127 | 2 |
| 542. | A4 | B128 | 2 |
| 543. | A4 | B129 | 2 |
| 544. | A4 | B130 | 2 |
| 545. | A4 | B131 | 2 |
| 546. | A4 | B132 | 2 |
| 547. | A4 | B133 | 2 |
| 548. | A4 | B134 | 2 |
| 549. | A4 | B135 | 2 |
| 550. | A4 | B136 | 2 |
| 551. | A4 | B137 | 2 |
| 552. | A4 | B138 | 2 |
| 553. | A5 | B1 | 1 |
| 554. | A5 | B2 | 1 |
| 555. | A5 | B3 | 1 |
| 556. | A5 | B4 | 1 |
| 557. | A5 | B5 | 1 |
| 558. | A5 | B6 | 1 |
| 559. | A5 | B7 | 1 |
| 560. | A5 | B8 | 1 |
| 561. | A5 | B9 | 1 |
| 562. | A5 | B10 | 1 |
| 563. | A5 | B11 | 1 |
| 564. | A5 | B12 | 1 |
| 565. | A5 | B13 | 1 |
| 566. | A5 | B14 | 1 |
| 567. | A5 | B15 | 1 |
| 568. | A5 | B16 | 1 |
| 569. | A5 | B17 | 1 |
| 570. | A5 | B18 | 1 |
| 571. | A5 | B19 | 1 |
| 572. | A5 | B20 | 1 |
| 573. | A5 | B21 | 1 |
| 574. | A5 | B22 | 1 |
| 575. | A5 | B23 | 1 |
| 576. | A5 | B24 | 1 |
| 577. | A5 | B25 | 1 |
| 578. | A5 | B26 | 1 |
| 579. | A5 | B27 | 1 |
| 580. | A5 | B28 | 1 |
| 581. | A5 | B29 | 1 |
| 582. | A5 | B30 | 1 |
| 583. | A5 | B31 | 1 |
| 584. | A5 | B32 | 1 |
| 585. | A5 | B33 | 1 |
| 586. | A5 | B34 | 1 |
| 587. | A5 | B35 | 1 |
| 588. | A5 | B36 | 1 |
| 589. | A5 | B37 | 1 |
| 590. | A5 | B38 | 1 |
| 591. | A5 | B39 | 1 |
| 592. | A5 | B40 | 1 |
| 593. | A5 | B41 | 1 |
| 594. | A5 | B42 | 1 |
| 595. | A5 | B43 | 1 |
| 596. | A5 | B44 | 1 |
| 597. | A5 | B45 | 1 |
| 598. | A5 | B46 | 1 |
| 599. | A5 | B47 | 1 |
| 600. | A5 | B48 | 1 |
| 601. | A5 | B49 | 1 |
| 602. | A5 | B50 | 1 |
| 603. | A5 | B51 | 1 |
| 604. | A5 | B52 | 1 |
| 605. | A5 | B53 | 1 |
| 606. | A5 | B54 | 1 |
| 607. | A5 | B55 | 1 |
| 608. | A5 | B56 | 1 |

-continued

| Compound # | A | B | n |
|---|---|---|---|
| 609. | A5 | B57 | 1 |
| 610. | A5 | B58 | 1 |
| 611. | A5 | B59 | 1 |
| 612. | A5 | B60 | 1 |
| 613. | A5 | B61 | 1 |
| 614. | A5 | B62 | 1 |
| 615. | A5 | B63 | 1 |
| 616. | A5 | B64 | 1 |
| 617. | A5 | B65 | 1 |
| 618. | A5 | B66 | 1 |
| 619. | A5 | B67 | 1 |
| 620. | A5 | B68 | 1 |
| 621. | A5 | B69 | 1 |
| 622. | A5 | B70 | 1 |
| 623. | A5 | B71 | 1 |
| 624. | A5 | B72 | 1 |
| 625. | A5 | B73 | 1 |
| 626. | A5 | B74 | 1 |
| 627. | A5 | B75 | 1 |
| 628. | A5 | B76 | 1 |
| 629. | A5 | B77 | 1 |
| 630. | A5 | B78 | 1 |
| 631. | A5 | B79 | 1 |
| 632. | A5 | B80 | 1 |
| 633. | A5 | B81 | 1 |
| 634. | A5 | B82 | 1 |
| 635. | A5 | B83 | 1 |
| 636. | A5 | B84 | 1 |
| 637. | A5 | B85 | 1 |
| 638. | A5 | B86 | 1 |
| 639. | A5 | B87 | 1 |
| 640. | A5 | B88 | 1 |
| 641. | A5 | B89 | 1 |
| 642. | A5 | B90 | 1 |
| 643. | A5 | B91 | 1 |
| 644. | A5 | B92 | 1 |
| 645. | A5 | B93 | 1 |
| 646. | A5 | B94 | 1 |
| 647. | A5 | B95 | 1 |
| 648. | A5 | B96 | 1 |
| 649. | A5 | B97 | 1 |
| 650. | A5 | B98 | 1 |
| 651. | A5 | B99 | 1 |
| 652. | A5 | B100 | 1 |
| 653. | A5 | B101 | 1 |
| 654. | A5 | B102 | 1 |
| 655. | A5 | B103 | 1 |
| 656. | A5 | B104 | 1 |
| 657. | A5 | B105 | 1 |
| 658. | A5 | B106 | 1 |
| 659. | A5 | B107 | 1 |
| 660. | A5 | B108 | 1 |
| 661. | A5 | B109 | 1 |
| 662. | A5 | B110 | 1 |
| 663. | A5 | B111 | 1 |
| 664. | A5 | B112 | 1 |
| 665. | A5 | B113 | 1 |
| 666. | A5 | B114 | 1 |
| 667. | A5 | B115 | 1 |
| 668. | A5 | B116 | 1 |
| 669. | A5 | B117 | 1 |
| 670. | A5 | B118 | 1 |
| 671. | A5 | B119 | 1 |
| 672. | A5 | B120 | 1 |
| 673. | A5 | B121 | 1 |
| 674. | A5 | B122 | 1 |
| 675. | A5 | B123 | 1 |
| 676. | A5 | B124 | 1 |
| 677. | A5 | B125 | 1 |
| 678. | A5 | B126 | 1 |
| 679. | A5 | B127 | 1 |
| 680. | A5 | B128 | 1 |
| 681. | A5 | B129 | 1 |
| 682. | A5 | B130 | 1 |
| 683. | A5 | B131 | 1 |
| 684. | A5 | B132 | 1 |
| 685. | A5 | B133 | 1 |

-continued

| Compound # | A | B | n |
|---|---|---|---|
| 686. | A5 | B134 | 1 |
| 687. | A5 | B135 | 1 |
| 688. | A5 | B136 | 1 |
| 689. | A5 | B137 | 1 |
| 690. | A5 | B138 | 1 |
| 691. | A6 | B1 | 2 |
| 692. | A6 | B2 | 2 |
| 693. | A6 | B3 | 2 |
| 694. | A6 | B4 | 2 |
| 695. | A6 | B5 | 2 |
| 696. | A6 | B6 | 2 |
| 697. | A6 | B7 | 2 |
| 698. | A6 | B8 | 2 |
| 699. | A6 | B9 | 2 |
| 700. | A6 | B10 | 2 |
| 701. | A6 | B11 | 2 |
| 702. | A6 | B12 | 2 |
| 703. | A6 | B13 | 2 |
| 704. | A6 | B14 | 2 |
| 705. | A6 | B15 | 2 |
| 706. | A6 | B16 | 2 |
| 707. | A6 | B17 | 2 |
| 708. | A6 | B18 | 2 |
| 709. | A6 | B19 | 2 |
| 710. | A6 | B20 | 2 |
| 711. | A6 | B21 | 2 |
| 712. | A6 | B22 | 2 |
| 713. | A6 | B23 | 2 |
| 714. | A6 | B24 | 2 |
| 715. | A6 | B25 | 2 |
| 716. | A6 | B26 | 2 |
| 717. | A6 | B27 | 2 |
| 718. | A6 | B28 | 2 |
| 719. | A6 | B29 | 2 |
| 720. | A6 | B30 | 2 |
| 721. | A6 | B31 | 2 |
| 722. | A6 | B32 | 2 |
| 723. | A6 | B33 | 2 |
| 724. | A6 | B34 | 2 |
| 725. | A6 | B35 | 2 |
| 726. | A6 | B36 | 2 |
| 727. | A6 | B37 | 2 |
| 728. | A6 | B38 | 2 |
| 729. | A6 | B39 | 2 |
| 730. | A6 | B40 | 2 |
| 731. | A6 | B41 | 2 |
| 732. | A6 | B42 | 2 |
| 733. | A6 | B43 | 2 |
| 734. | A6 | B44 | 2 |
| 735. | A6 | B45 | 2 |
| 736. | A6 | B46 | 2 |
| 737. | A6 | B47 | 2 |
| 738. | A6 | B48 | 2 |
| 739. | A6 | B49 | 2 |
| 740. | A6 | B50 | 2 |
| 741. | A6 | B51 | 2 |
| 742. | A6 | B52 | 2 |
| 743. | A6 | B53 | 2 |
| 744. | A6 | B54 | 2 |
| 745. | A6 | B55 | 2 |
| 746. | A6 | B56 | 2 |
| 747. | A6 | B57 | 2 |
| 748. | A6 | B58 | 2 |
| 749. | A6 | B59 | 2 |
| 750. | A6 | B60 | 2 |
| 751. | A6 | B61 | 2 |
| 752. | A6 | B62 | 2 |
| 753. | A6 | B63 | 2 |
| 754. | A6 | B64 | 2 |
| 755. | A6 | B65 | 2 |
| 756. | A6 | B66 | 2 |
| 757. | A6 | B67 | 2 |
| 758. | A6 | B68 | 2 |
| 759. | A6 | B69 | 2 |
| 760. | A6 | B70 | 2 |
| 761. | A6 | B71 | 2 |
| 762. | A6 | B72 | 2 |

| Compound # | A | B | n |
|---|---|---|---|
| 763. | A6 | B73 | 2 |
| 764. | A6 | B74 | 2 |
| 765. | A6 | B75 | 2 |
| 766. | A6 | B76 | 2 |
| 767. | A6 | B77 | 2 |
| 768. | A6 | B78 | 2 |
| 769. | A6 | B79 | 2 |
| 770. | A6 | B80 | 2 |
| 771. | A6 | B81 | 2 |
| 772. | A6 | B82 | 2 |
| 773. | A6 | B83 | 2 |
| 774. | A6 | B84 | 2 |
| 775. | A6 | B85 | 2 |
| 776. | A6 | B86 | 2 |
| 777. | A6 | B87 | 2 |
| 778. | A6 | B88 | 2 |
| 779. | A6 | B89 | 2 |
| 780. | A6 | B90 | 2 |
| 781. | A6 | B91 | 2 |
| 782. | A6 | B92 | 2 |
| 783. | A6 | B93 | 2 |
| 784. | A6 | B94 | 2 |
| 785. | A6 | B95 | 2 |
| 786. | A6 | B96 | 2 |
| 787. | A6 | B97 | 2 |
| 788. | A6 | B98 | 2 |
| 789. | A6 | B99 | 2 |
| 790. | A6 | B100 | 2 |
| 791. | A6 | B101 | 2 |
| 792. | A6 | B102 | 2 |
| 793. | A6 | B103 | 2 |
| 794. | A6 | B104 | 2 |
| 795. | A6 | B105 | 2 |
| 796. | A6 | B106 | 2 |
| 797. | A6 | B107 | 2 |
| 798. | A6 | B108 | 2 |
| 799. | A6 | B109 | 2 |
| 800. | A6 | B110 | 2 |
| 801. | A6 | B111 | 2 |
| 802. | A6 | B112 | 2 |
| 803. | A6 | B113 | 2 |
| 804. | A6 | B114 | 2 |
| 805. | A6 | B115 | 2 |
| 806. | A6 | B116 | 2 |
| 807. | A6 | B117 | 2 |
| 808. | A6 | B118 | 2 |
| 809. | A6 | B119 | 2 |
| 810. | A6 | B120 | 2 |
| 811. | A6 | B121 | 2 |
| 812. | A6 | B122 | 2 |
| 813. | A6 | B123 | 2 |
| 814. | A6 | B124 | 2 |
| 815. | A6 | B125 | 2 |
| 816. | A6 | B126 | 2 |
| 817. | A6 | B127 | 2 |
| 818. | A6 | B128 | 2 |
| 819. | A6 | B129 | 2 |
| 820. | A6 | B130 | 2 |
| 821. | A6 | B131 | 2 |
| 822. | A6 | B132 | 2 |
| 823. | A6 | B133 | 2 |
| 824. | A6 | B134 | 2 |
| 825. | A6 | B135 | 2 |
| 826. | A6 | B136 | 2 |
| 827. | A6 | B137 | 2 |
| 828. | A6 | B138 | 2 |
| 829. | A7 | B1 | 1 |
| 830. | A7 | B2 | 1 |
| 831. | A7 | B3 | 1 |
| 832. | A7 | B4 | 1 |
| 833. | A7 | B5 | 1 |
| 834. | A7 | B6 | 1 |
| 835. | A7 | B7 | 1 |
| 836. | A7 | B8 | 1 |
| 837. | A7 | B9 | 1 |
| 838. | A7 | B10 | 1 |
| 839. | A7 | B11 | 1 |
| 840. | A7 | B12 | 1 |
| 841. | A7 | B13 | 1 |
| 842. | A7 | B14 | 1 |
| 843. | A7 | B15 | 1 |
| 844. | A7 | B16 | 1 |
| 845. | A7 | B17 | 1 |
| 846. | A7 | B18 | 1 |
| 847. | A7 | B19 | 1 |
| 848. | A7 | B20 | 1 |
| 849. | A7 | B21 | 1 |
| 850. | A7 | B22 | 1 |
| 851. | A7 | B23 | 1 |
| 852. | A7 | B24 | 1 |
| 853. | A7 | B25 | 1 |
| 854. | A7 | B26 | 1 |
| 855. | A7 | B27 | 1 |
| 856. | A7 | B28 | 1 |
| 857. | A7 | B29 | 1 |
| 858. | A7 | B30 | 1 |
| 859. | A7 | B31 | 1 |
| 860. | A7 | B32 | 1 |
| 861. | A7 | B33 | 1 |
| 862. | A7 | B34 | 1 |
| 863. | A7 | B35 | 1 |
| 864. | A7 | B36 | 1 |
| 865. | A7 | B37 | 1 |
| 866. | A7 | B38 | 1 |
| 867. | A7 | B39 | 1 |
| 868. | A7 | B40 | 1 |
| 869. | A7 | B41 | 1 |
| 870. | A7 | B42 | 1 |
| 871. | A7 | B43 | 1 |
| 872. | A7 | B44 | 1 |
| 873. | A7 | B45 | 1 |
| 874. | A7 | B46 | 1 |
| 875. | A7 | B47 | 1 |
| 876. | A7 | B48 | 1 |
| 877. | A7 | B49 | 1 |
| 878. | A7 | B50 | 1 |
| 879. | A7 | B51 | 1 |
| 880. | A7 | B52 | 1 |
| 881. | A7 | B53 | 1 |
| 882. | A7 | B54 | 1 |
| 883. | A7 | B55 | 1 |
| 884. | A7 | B56 | 1 |
| 885. | A7 | B57 | 1 |
| 886. | A7 | B58 | 1 |
| 887. | A7 | B59 | 1 |
| 888. | A7 | B60 | 1 |
| 889. | A7 | B61 | 1 |
| 890. | A7 | B62 | 1 |
| 891. | A7 | B63 | 1 |
| 892. | A7 | B64 | 1 |
| 893. | A7 | B65 | 1 |
| 894. | A7 | B66 | 1 |
| 895. | A7 | B67 | 1 |
| 896. | A7 | B68 | 1 |
| 897. | A7 | B69 | 1 |
| 898. | A7 | B70 | 1 |
| 899. | A7 | B71 | 1 |
| 900. | A7 | B72 | 1 |
| 901. | A7 | B73 | 1 |
| 902. | A7 | B74 | 1 |
| 903. | A7 | B75 | 1 |
| 904. | A7 | B76 | 1 |
| 905. | A7 | B77 | 1 |
| 906. | A7 | B78 | 1 |
| 907. | A7 | B79 | 1 |
| 908. | A7 | B80 | 1 |
| 909. | A7 | B81 | 1 |
| 910. | A7 | B82 | 1 |
| 911. | A7 | B83 | 1 |
| 912. | A7 | B84 | 1 |
| 913. | A7 | B85 | 1 |
| 914. | A7 | B86 | 1 |
| 915. | A7 | B87 | 1 |
| 916. | A7 | B88 | 1 |

| Compound # | A | B | n |
|---|---|---|---|
| 917. | A7 | B89 | 1 |
| 918. | A7 | B90 | 1 |
| 919. | A7 | B91 | 1 |
| 920. | A7 | B92 | 1 |
| 921. | A7 | B93 | 1 |
| 922. | A7 | B94 | 1 |
| 923. | A7 | B95 | 1 |
| 924. | A7 | B96 | 1 |
| 925. | A7 | B97 | 1 |
| 926. | A7 | B98 | 1 |
| 927. | A7 | B99 | 1 |
| 928. | A7 | B100 | 1 |
| 929. | A7 | B101 | 1 |
| 930. | A7 | B102 | 1 |
| 931. | A7 | B103 | 1 |
| 932. | A7 | B104 | 1 |
| 933. | A7 | B105 | 1 |
| 934. | A7 | B106 | 1 |
| 935. | A7 | B107 | 1 |
| 936. | A7 | B108 | 1 |
| 937. | A7 | B109 | 1 |
| 938. | A7 | B110 | 1 |
| 939. | A7 | B111 | 1 |
| 940. | A7 | B112 | 1 |
| 941. | A7 | B113 | 1 |
| 942. | A7 | B114 | 1 |
| 943. | A7 | B115 | 1 |
| 944. | A7 | B116 | 1 |
| 945. | A7 | B117 | 1 |
| 946. | A7 | B118 | 1 |
| 947. | A7 | B119 | 1 |
| 948. | A7 | B120 | 1 |
| 949. | A7 | B121 | 1 |
| 950. | A7 | B122 | 1 |
| 951. | A7 | B123 | 1 |
| 952. | A7 | B124 | 1 |
| 953. | A7 | B125 | 1 |
| 954. | A7 | B126 | 1 |
| 955. | A7 | B127 | 1 |
| 956. | A7 | B128 | 1 |
| 957. | A7 | B129 | 1 |
| 958. | A7 | B130 | 1 |
| 959. | A7 | B131 | 1 |
| 960. | A7 | B132 | 1 |
| 961. | A7 | B133 | 1 |
| 962. | A7 | B134 | 1 |
| 963. | A7 | B135 | 1 |
| 964. | A7 | B136 | 1 |
| 965. | A7 | B137 | 1 |
| 966. | A7 | B138 | 1 |
| 967. | A8 | B1 | 2 |
| 968. | A8 | B2 | 2 |
| 969. | A8 | B3 | 2 |
| 970. | A8 | B4 | 2 |
| 971. | A8 | B5 | 2 |
| 972. | A8 | B6 | 2 |
| 973. | A8 | B7 | 2 |
| 974. | A8 | B8 | 2 |
| 975. | A8 | B9 | 2 |
| 976. | A8 | B10 | 2 |
| 977. | A8 | B11 | 2 |
| 978. | A8 | B12 | 2 |
| 979. | A8 | B13 | 2 |
| 980. | A8 | B14 | 2 |
| 981. | A8 | B15 | 2 |
| 982. | A8 | B16 | 2 |
| 983. | A8 | B17 | 2 |
| 984. | A8 | B18 | 2 |
| 985. | A8 | B19 | 2 |
| 986. | A8 | B20 | 2 |
| 987. | A8 | B21 | 2 |
| 988. | A8 | B22 | 2 |
| 989. | A8 | B23 | 2 |
| 990. | A8 | B24 | 2 |
| 991. | A8 | B25 | 2 |
| 992. | A8 | B26 | 2 |
| 993. | A8 | B27 | 2 |
| 994. | A8 | B28 | 2 |
| 995. | A8 | B29 | 2 |
| 996. | A8 | B30 | 2 |
| 997. | A8 | B31 | 2 |
| 998. | A8 | B32 | 2 |
| 999. | A8 | B33 | 2 |
| 1000. | A8 | B34 | 2 |
| 1001. | A8 | B35 | 2 |
| 1002. | A8 | B36 | 2 |
| 1003. | A8 | B37 | 2 |
| 1004. | A8 | B38 | 2 |
| 1005. | A8 | B39 | 2 |
| 1006. | A8 | B40 | 2 |
| 1007. | A8 | B41 | 2 |
| 1008. | A8 | B42 | 2 |
| 1009. | A8 | B43 | 2 |
| 1010. | A8 | B44 | 2 |
| 1011. | A8 | B45 | 2 |
| 1012. | A8 | B46 | 2 |
| 1013. | A8 | B47 | 2 |
| 1014. | A8 | B48 | 2 |
| 1015. | A8 | B49 | 2 |
| 1016. | A8 | B50 | 2 |
| 1017. | A8 | B51 | 2 |
| 1018. | A8 | B52 | 2 |
| 1019. | A8 | B53 | 2 |
| 1020. | A8 | B54 | 2 |
| 1021. | A8 | B55 | 2 |
| 1022. | A8 | B56 | 2 |
| 1023. | A8 | B57 | 2 |
| 1024. | A8 | B58 | 2 |
| 1025. | A8 | B59 | 2 |
| 1026. | A8 | B60 | 2 |
| 1027. | A8 | B61 | 2 |
| 1028. | A8 | B62 | 2 |
| 1029. | A8 | B63 | 2 |
| 1030. | A8 | B64 | 2 |
| 1031. | A8 | B65 | 2 |
| 1032. | A8 | B66 | 2 |
| 1033. | A8 | B67 | 2 |
| 1034. | A8 | B68 | 2 |
| 1035. | A8 | B69 | 2 |
| 1036. | A8 | B70 | 2 |
| 1037. | A8 | B71 | 2 |
| 1038. | A8 | B72 | 2 |
| 1039. | A8 | B73 | 2 |
| 1040. | A8 | B74 | 2 |
| 1041. | A8 | B75 | 2 |
| 1042. | A8 | B76 | 2 |
| 1043. | A8 | B77 | 2 |
| 1044. | A8 | B78 | 2 |
| 1045. | A8 | B79 | 2 |
| 1046. | A8 | B80 | 2 |
| 1047. | A8 | B81 | 2 |
| 1048. | A8 | B82 | 2 |
| 1049. | A8 | B83 | 2 |
| 1050. | A8 | B84 | 2 |
| 1051. | A8 | B85 | 2 |
| 1052. | A8 | B86 | 2 |
| 1053. | A8 | B87 | 2 |
| 1054. | A8 | B88 | 2 |
| 1055. | A8 | B89 | 2 |
| 1056. | A8 | B90 | 2 |
| 1057. | A8 | B91 | 2 |
| 1058. | A8 | B92 | 2 |
| 1059. | A8 | B93 | 2 |
| 1060. | A8 | B94 | 2 |
| 1061. | A8 | B95 | 2 |
| 1062. | A8 | B96 | 2 |
| 1063. | A8 | B97 | 2 |
| 1064. | A8 | B98 | 2 |
| 1065. | A8 | B99 | 2 |
| 1066. | A8 | B100 | 2 |
| 1067. | A8 | B101 | 2 |
| 1068. | A8 | B102 | 2 |
| 1069. | A8 | B103 | 2 |
| 1070. | A8 | B104 | 2 |

-continued
| Compound # | A | B | n |
|---|---|---|---|
| 1071. | A8 | B105 | 2 |
| 1072. | A8 | B106 | 2 |
| 1073. | A8 | B107 | 2 |
| 1074. | A8 | B108 | 2 |
| 1075. | A8 | B109 | 2 |
| 1076. | A8 | B110 | 2 |
| 1077. | A8 | B111 | 2 |
| 1078. | A8 | B112 | 2 |
| 1079. | A8 | B113 | 2 |
| 1080. | A8 | B114 | 2 |
| 1081. | A8 | B115 | 2 |
| 1082. | A8 | B116 | 2 |
| 1083. | A8 | B117 | 2 |
| 1084. | A8 | B118 | 2 |
| 1085. | A8 | B119 | 2 |
| 1086. | A8 | B120 | 2 |
| 1087. | A8 | B121 | 2 |
| 1088. | A8 | B122 | 2 |
| 1089. | A8 | B123 | 2 |
| 1090. | A8 | B124 | 2 |
| 1091. | A8 | B125 | 2 |
| 1092. | A8 | B126 | 2 |
| 1093. | A8 | B127 | 2 |
| 1094. | A8 | B128 | 2 |
| 1095. | A8 | B129 | 2 |
| 1096. | A8 | B130 | 2 |
| 1097. | A8 | B131 | 2 |
| 1098. | A8 | B132 | 2 |
| 1099. | A8 | B133 | 2 |
| 1100. | A8 | B134 | 2 |
| 1101. | A8 | B135 | 2 |
| 1102. | A8 | B136 | 2 |
| 1103. | A8 | B137 | 2 |
| 1104. | A8 | B138 | 2 |
The structure of B1-B138 in the table is as described in the previous embodiment, and the structure of A1-A8 in the table is shown as follows:
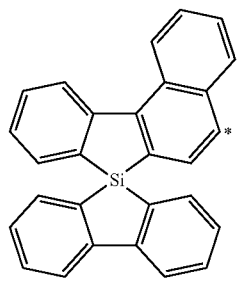
A1
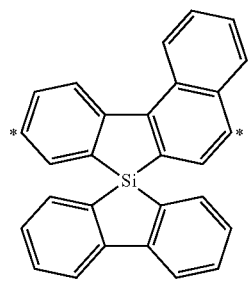
A2
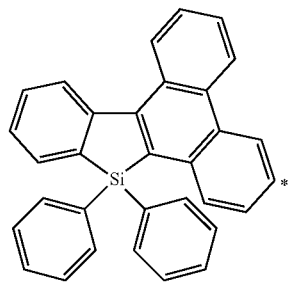
A3
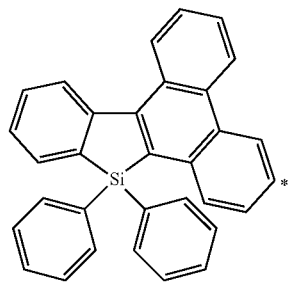
A4
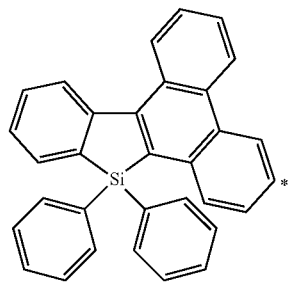
A5
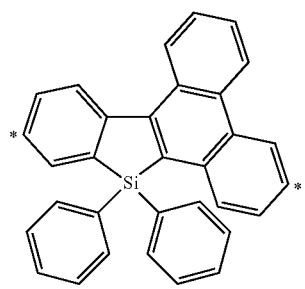
A6
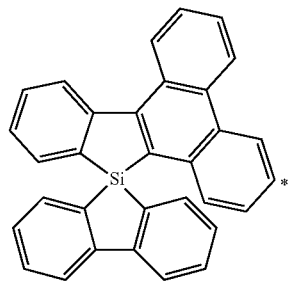
A7

-continued

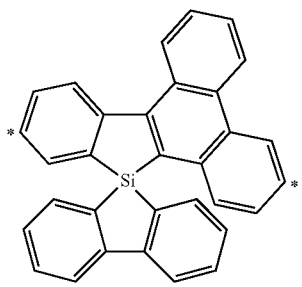

A8

Wherein "*" in the above A1-A8 formula represents the position where the group B is bonded with.

According to another embodiment, an organic electroluminescent device is disclosed. The organic electroluminescent device comprises:
an anode,
a cathode,
and a series of organic layers deposited between the anode and cathode, wherein at least one of the organic layers comprises a compound having formula I. The compound having formula I is as described in any of the previous embodiment.

In one embodiment, the organic electroluminescent device comprises a light-emitting layer, wherein the light-emitting layer comprises a compound having formula I.

In one embodiment, wherein at least one organic layer comprises a compound having formula I and an anthracene compound.

In one preferred embodiment, wherein at least one organic layer comprises a compound having formula I and an anthracene compound having formula a:

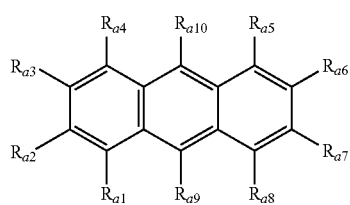

Formula a $R_{a1}$, $R_{a2}$, $R_{a3}$, $R_{a4}$, $R_{a5}$, $R_{a6}$, $R_{a7}$, and $R_{a8}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof Wherein $R_{a9}$ and $R_{a10}$ are independently selected from the group consisting of a substituted or unsubstituted aryl or heteroaryl group having 5 to 30 ring atoms.

In one embodiment, wherein the device emits white light.

According to yet another embodiment, a formulation comprising a compound having a structure represented by Formula I is also disclosed. The compound having a structure represented by formula I is as described in any of the previous embodiment.

Combination with Other Materials

The materials described herein as useful for a particular layer in an organic light emitting device may be used in combination with a wide variety of other materials present in the device. The combinations of these materials are described in more detail in U.S. Pat. App. No. 20160359122 at paragraphs 0132-0161, which are incorporated by reference in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, emissive dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which are incorporated by reference in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatography-mass spectrometer produced by SHIMADZU, gas chromatography-mass spectrometer produced by SHIMADZU, differential Scanning calorimeters produced by SHIMADZU, fluorescence spectrophotometer produced by Shanghai Lengguang Tech., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

EXAMPLE

The method for preparing the compounds of the present invention is not limited. The following compound is exemplified as a typical but non-limiting example, and its synthesis route and preparation method are as follows:

Example 1: Synthesis of Compound 186

Step 1:

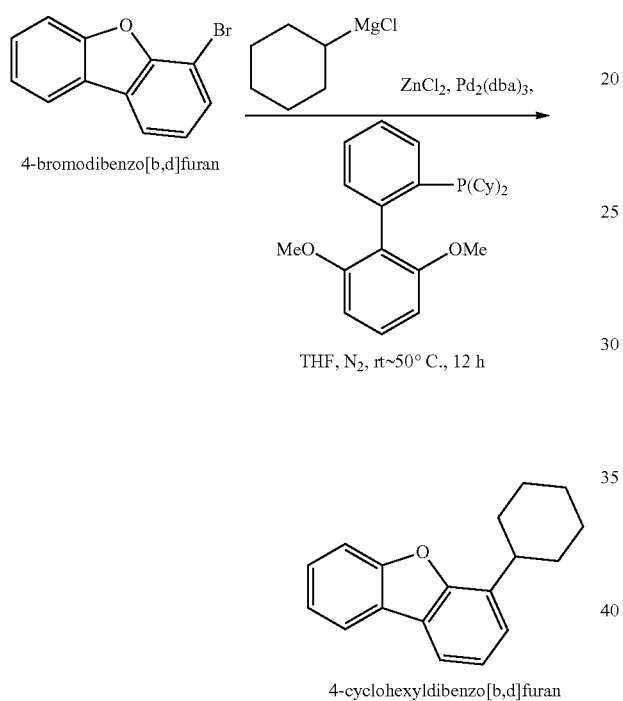

Under N₂ atmosphere, to THF (300.0 mL) was added cyclohexylmagnesium chloride (445.0 mL, 1.3 M in THF/toluene (62/38, v/v)) at room temperature, and zinc chloride (410.0 mL, 2.0 M in 2-methyltetrahydrofuran) was added dropwise with stirring, it was reacted at room temperature for 1 h (white solid precipitated). Then 4-bromodibenzo[b,d]furan (82.0 g, 331.9 mmol), 2-dicyclohexylphorspine-2', 6'-dimethoxybiphenyl (12.0 g, 29.2 mmol) and tris(dibenzylideneacetone)dipalladium (9.0 g, 9.8 mmol) were mixed together and added to the reaction mixture quickly. The reaction was heated to 50° C. for 12 h, and was monitored by TLC. After the reaction was completed, it was cooled to room temperature, and quenched with saturated NH₄Cl solution (200 mL). After filtration, the residue was washed with EA. The filtrate was combined and extracted with EA (2*100 mL). The organic phase was washed with saturated NaCl solution (2*100 mL), dried over anhydrous Na₂SO₄ and evaporated to dryness. The residue was purified by column chromatography (silica gel (200~300 mesh), eluent: petroleum ether) to give 4-cyclohexyldibenzo[b,d]furan as yellow oil (74.0 g, 295.6 mmol, 88.0%).

Step 2:

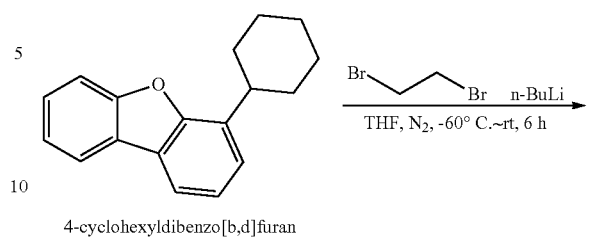

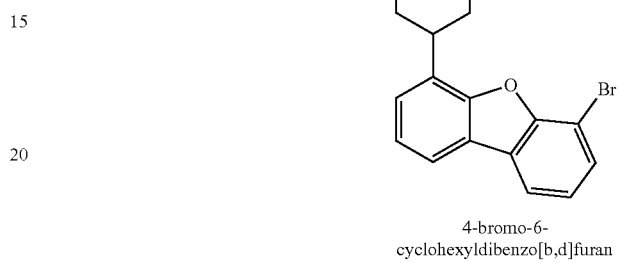

Under N₂ atmosphere, to THF (700.0 mL) was added 4-cyclohexyldibenzo[b,d]furan (74.0 g, 295.6 mmol). The resulting solution was cooled to −60° C. via dry ice ethanol bath, and n-BuLi (130.0 mL, 1.4 M) was added dropwise below −40° C. After the addition, the cooling bath was removed and the reaction was carried out at room temperature for 6 h (monitored by TLC after the sample being quenched with DMF). Then the reaction solution was cooled to −60° C. again, and 1,2-dibromoethane (51.0 mL, 591.3 mmol) was added dropwise below −40° C. The cooling bath was removed after the addition, and the reaction was carried out overnight (monitored by TLC). Saturated NH₄Cl solution (100 mL) was added dropwise to the reaction mixture. After 5 min stirring, the mixture was extracted with EA (2*100 mL), the organic phase was washed with NaCl (sat., aq.) (2*100 mL), dried over anhydrous Na₂SO₄, and evaporated to dryness. The residue was purified by column chromatography (silica gel (200-300 mesh), eluent: petroleum ether) to give a mixture (60 g) of 4-cyclohexyldibenzo[b,d]furan and 4-bromo-6-cyclohexyldibenzo[b,d]furan. The mixture was added to n-hexane (400 mL) and heated to reflux until completely dissolved. The solution was cooled with room temperature. The needle-like solid precipitated was collected via filtration, washed with small amount of n-hexane and dried under vacuum with oil pump to give 4-bromo-6-cyclohexyldibenzo[b,d]furan as white solid (40.0 g, 121.5 mmol, 41.0%).

Step 3:

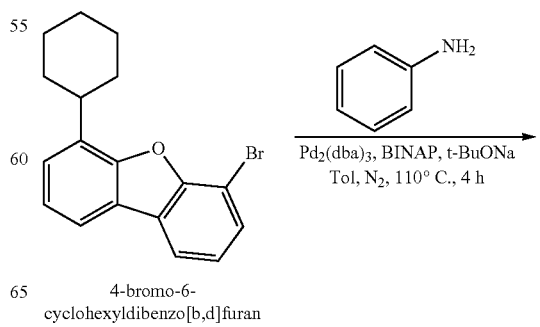

-continued

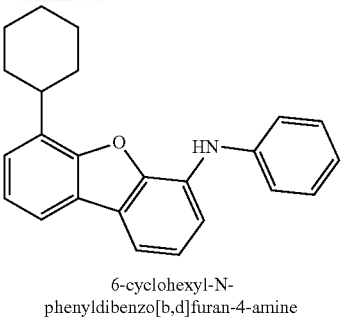

6-cyclohexyl-N-phenyldibenzo[b,d]furan-4-amine

Under N$_2$ atmosphere, to toluene (600.0 mL) was added tris(dibenzylideneacetone)dipalladium (5.5 g, 6.0 mmol) at room temperature, and the mixture was stirred for 10 min. 1,1'-binaphthyl-2,2'-bisdiphenylphosphine (7.5 g, 12.0 mmol) was added and the mixture was stirred for another 20 min. 4-bromo-6-cyclohexyldibenzo[b,d]furan (40.0 g, 121.5 mmol) was added to the reaction mixture, stirred until completely dissolved, then aniline (16.6 mL, 182.0 mmol) was added and stirred for another 5 min. To the reaction mixture was added sodium tert-butoxide (29.0 g, 301.7 mmol). The resulting mixture was heated to 110° C. for 4 h. The reaction was monitored by TLC. After the completion, the reaction mixture as hot was filtered through a three-layered plug (basic alumina, anhydrous Na$_2$SO$_4$, and celite, 1 cm for each layer). The filtrate was concentrated and purified by column chromatography (silica gel (200-300 mesh), gradient elution from 10:1 to 6:1 PE/toluene, v/v) to give 6-cyclohexyl-N-phenyldibenzo[b,d]furan-4-amine as semi-transparent solid (30.0 g, 87.9 mmol, 72.0%).

Step 4:

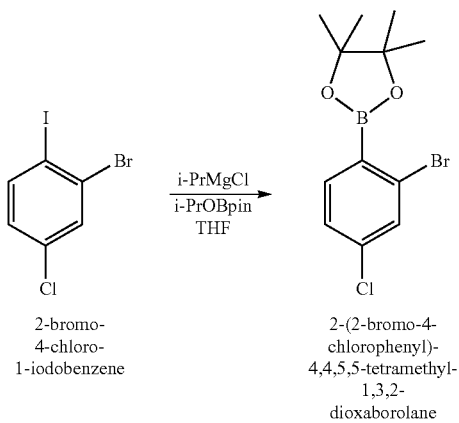 [SMILES: "i-PrMgCl" ; Clc1ccc(I)c(Br)c1 ; "i-PrOBpinTHF" ; CC1(C)OB(c2ccc(Cl)cc2Br)OC1(C)C]

2-bromo-4-chloro-1-iodobenzene 2-(2-bromo-4-chlorophenyl)-4,4,5,5-tetramethyl-1,3,2-dioxaborolane 2-bromo-4-chloro-1-iodobenzene (63.2 g, 199.15 mmol) was dissolved in anhydrous THF (600 mL) under N$_2$ atmosphere at room temperature, stirred at room temperature until dissolved and then cooled to −78° C. Isopropylmagnesium chloride (170 mL, 1.3 M) was added slowly. After reacting for 1 h at room temperature, 2-isopropoxy-4,4,5,5-tetramethyl-1,3,2-dioxaborolane (56 g, 300.10 mmol) was added slowly to room temperature and the mixture was stirred for 2 h. Water was added to quench the reaction. EA was added and the reaction mixture was washed three times and concentrated, purified by column chromatography (eluent: EA/PE=1/40, v/v) to give 2-(2-bromo-4-chlorophenyl)-4,4,5,5-tetramethyl-1,3,2-dioxaborolane (56.88 g, 179.20 mmol, 90%).

Step 5:

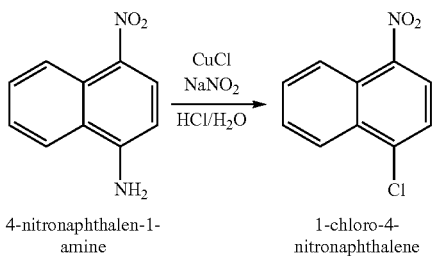 [SMILES: Nc1ccc([N+](=O)[O-])c2ccccc12 ; O=[N+]([O-])c1ccc(Cl)c2ccccc12]

4-nitronaphthalen-1-amine 1-chloro-4-nitronaphthalene

To HCl (2 L, 6 mol/L) was added 4-nitronaphthalen-1-amine (100 g, 531.38 mmol) at room temperature. The reaction solution was cooled to 0° C. after stirring for 2 h, and NaNO$_2$ (44 g, 637.68 mmol) was added. Stirring was continued for 2 h at the same temperature. CuCl (212.8 g, 2149.50 mmol) was slowly added portion-wise. The reaction mixture was stirred for 12 h at room temperature. After completion, the reaction mixture was extracted with EA, the organic phase was combined, washed with saturated NaHCO$_3$ solution, concentrated and purified by column chromatography (eluent: EA/PE=1/40, v/v) to give 1-chloro-4-nitronaphthalene (80 g, 385.34 mmol, 72.6%).

Step 6:

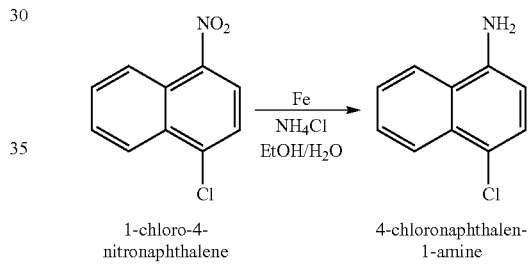

1-chloro-4-nitronaphthalene 4-chloronaphthalen-1-amine

To a solution of EtOH/H$_2$O=3:1 (4 L) was added 1-chloro-4-nitronaphthalene (80 g, 385.34 mmol), NH$_4$Cl (13.5 g, 252.38 mmol), and reduced iron powder (108 g, 1928.57 mmol) at room temperature. The reaction mixture was heated to 80° C. and stirred for 4 h, and filtered through celite. Most of EtOH was evaporated off. The residue was extracted with EA, concentrated, purified by column chromatography (eluent: EA/PE=1/4) to give 4-chloronaphthalen-1-amine (58.4 g, 330.27 mmol, 85.5%).

Step 7:

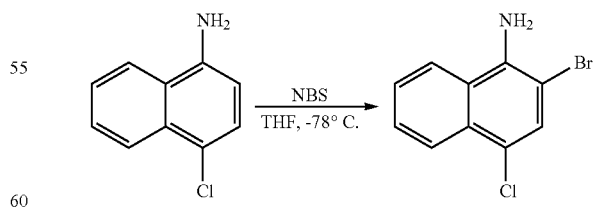

To THF (2000 mL) was added 4-chloronaphthalen-1-amine (40 g, 225.4 mmol) at room temperature. After cooling to −78° C., N-bromosuccinimide (41.0 g, 225.4 mmol) was added portion-wise. The reaction was stirred at low temperature until completion. Then the reaction was quenched with water, extracted with DCM, concentrated, and purified by column chromatography (eluent: PE/EA=16/1) to give 2-bromo-4-chloronaphthalen-1-amine as black solid (51.2 g, 200.0 mmol, 88.7%).

Step 8:

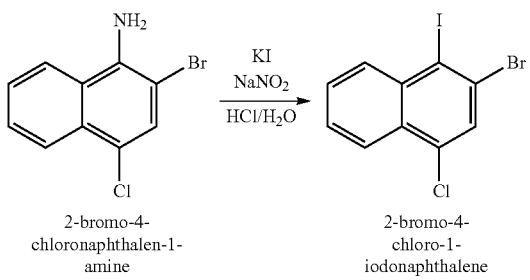 [SMILES: Nc1c(Br)cc(Cl)c2ccccc12 ; Clc1cc(Br)c(I)c2ccccc12]

2-bromo-4-chloronaphthalen-1-amine 2-bromo-4-chloro-1-iodonaphthalene

To HCl (1.0 L, 6 M) was added 2-bromo-4-chloronaphthalen-1-amine (51.2 g, 200.0 mmol) at room temperature. The mixture was stirred for 30 min at room temperature. After cooled to 0° C., NaNO$_2$ (13.8 g, 220 mmol) was added. The resulting mixture was stirred for 2 h at the same temperature, and KI (166 g, 1000 mmol) was added portionwise. The reaction mixture was stirred for 12 h at room temperature. After completion, the reaction mixture was extracted with EA, the organic phase was combined, washed with saturated NaHCO$_3$ solution, concentrated and purified by column chromatography (eluent: PE) to give 2-bromo-4-chloro-1-iodonaphthalene (36.8 g, 100.2 mmol, 50.1%).

Step 9:

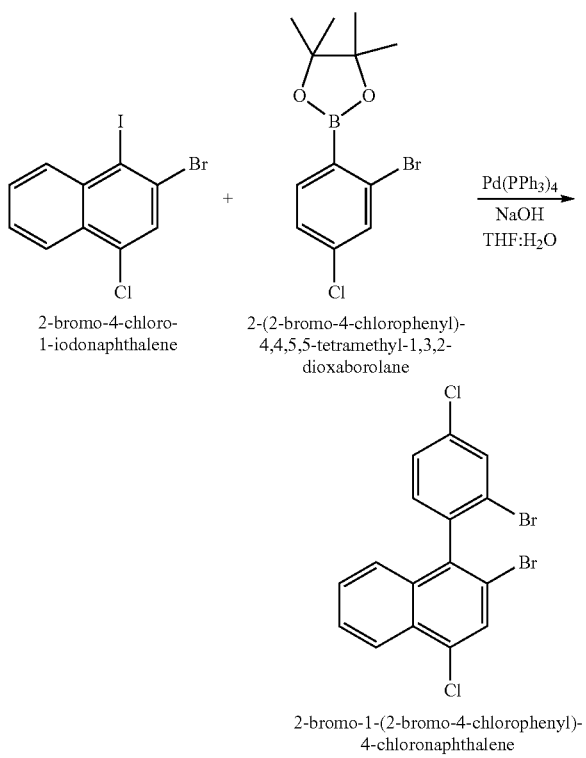

2-bromo-4-chloro-1-iodonaphthalene 2-(2-bromo-4-chlorophenyl)-4,4,5,5-tetramethyl-1,3,2-dioxaborolane 2-bromo-1-(2-bromo-4-chlorophenyl)-4-chloronaphthalene Under N$_2$ atmosphere, to THF (750.0 mL) were sequentially added 2-bromo-4-chloro-1-iodonaphthalene (30 g, 81.74 mmol), 2-(2-bromo-4-chlorophenyl)-4,4,5,5,-tetramethyl-1,3,2-dioxaborolane (31.1 g, 98 mmol), Pd(PPh$_3$)$_4$ (5.0 g, 4.31 mmol) and NaOH solution (15.2 g, 380.00 mmol in 250.0 mL H$_2$O) at room temperature. The reaction mixture was heated to 100° C. and stirred for 24 h. After completion, the reaction mixture was cooled to room temperature, extracted with EA for three times, concentrated, purified by column chromatography (eluent: EA/PE=1/30) to give 2-bromo-1-(2-bromo-4-chlorophenyl)-4-chloronaphthalene (17.6 g, 40.8 mmol, 50%).

Step 10:

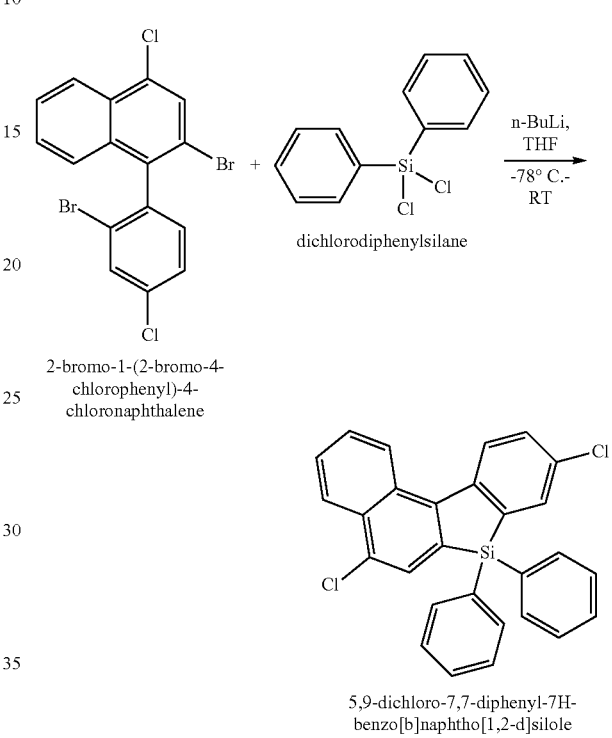

2-bromo-1-(2-bromo-4-chlorophenyl)-4-chloronaphthalene dichlorodiphenylsilane 5,9-dichloro-7,7-diphenyl-7H-benzo[b]naphtho[1,2-d]silole 2-bromo-1-(2-bromo-4-chlorophenyl)-4-chloronaphthalene (10.0 g, 23.25 mmol) was dissolved in ether (100 mL) under N$_2$ atmosphere. The reaction mixture was cooled to −78° C., and n-BuLi (23.2 mL, 55.68 mmol, 2.4 M) was added dropwise slowly. The reaction was kept at this temperature for 60 min, then dichlorodiphenylsilane (7.0 g, 27.91 mmol) was added, and the resulting mixture was kept at low temperature for 1 h. After the completion, the reaction was quenched with water, extracted with EA, combined, concentrated, purified by column chromatography (eluent: PE) to give 5,9-dichloro-7,7-diphenyl-7H-benzo[b]naphtho[1,2-d]silole as white solid (6.3 g, 13.9 mmol, 60%).

Step 11:

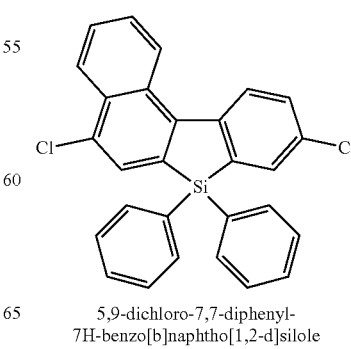

5,9-dichloro-7,7-diphenyl-7H-benzo[b]naphtho[1,2-d]silole +

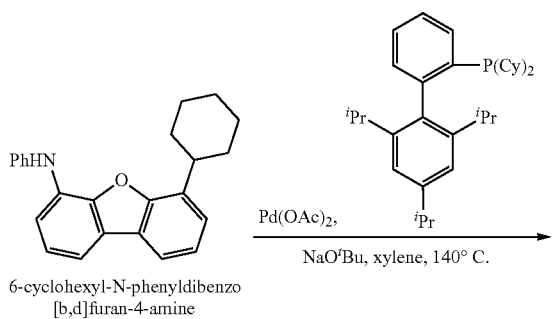

6-cyclohexyl-N-phenyldibenzo
[b,d]furan-4-amine

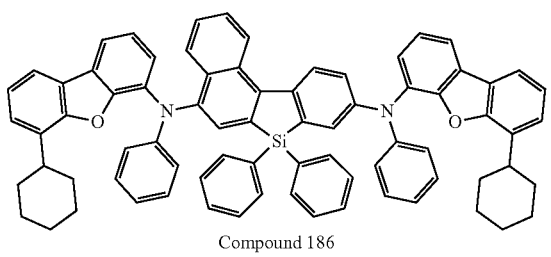

Compound 186

To a 100 mL three neck flask was added Pd(OAc)$_2$ (28.1 mg, 0.13 mmol), 2-dicyclohexylphosphine-2',4',6'-triisopropylbiphenyl (119.5 mg, 0.25 mmol), and xylene (40 mL). The solution was bubbled with N$_2$ for 20 min until the color of the solution no longer changed. Then 5,9-dichloro-7,7-diphenyl-7H-benzo[b]naphtho[1,2-d]silole (1.9 g, 4.19 mmol), 6-cyclohexyl-N-phenyldibenzo[b,d]furan-4-amine (3.5 g, 10.46 mmol), and Sodium tert-butoxide (2.01 g, 20.93 mmol) were added. The solution was bubbled with N$_2$ for another 10 min and heated to 140° C. until the reaction of the raw materials is completed. The reaction solution was filtered through Celite and MgSO$_4$, washed with DCM, evaporated to give yellow-green oil. The oil was mixed with 100 g Celite, purified by column chromatography (eluent: PE/THF=20/1), removed the solvent finally to give the compound 186 as yellow solid (1.3 g, 1.22 mmol, 29.1%). The compound was identified to be the target product, having a molecular weight of 1063.

Example 2: Synthesis of Compound 738

Step 1:

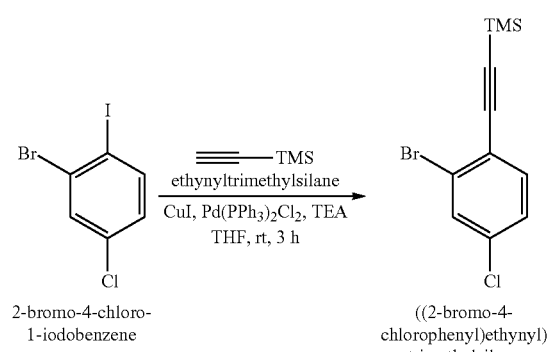

2-bromo-4-chloro-
1-iodobenzene ((2-bromo-4-
chlorophenyl)ethynyl)
trimethylsilane Under N$_2$ atmosphere, 2-bromo-4-chloro-1-iodobenzene (120.0 g, 378.13 mmol) was dissolved in anhydrous THF (1500.0 mL) at room temperature. After stirring at room temperature, to the solution were added triethylamine (60.0 mL, 397.21 mmol), CuI (2.1 g, 11.03 mmol), and Pd(PPh$_3$)$_2$Cl$_2$ (8.0 g, 11.40 mmol). After stirring for 20 min, ethynyltrimethylsilane (55.0 mL, 397.31 mmol) was added slowly. The reaction was carried out at room temperature for 3 h, and monitored by TLC. The reaction was quenched with water, extracted with EA, concentrated, and purified by column chromatography (eluent: PE) to give ((2-bromo-4-chlorophenyl)ethynyl)trimethylsilane as yellow liquid (100.0 g, 347.63 mmol, 90.0%).

Step 2:

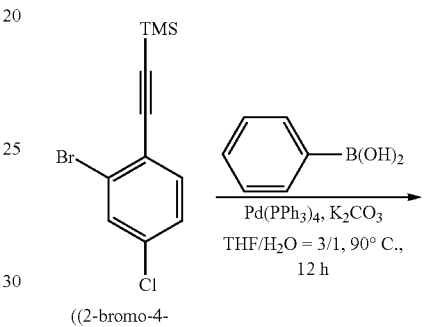

((2-bromo-4-
chlorophenyl)ethynyl)
trimethylsilane

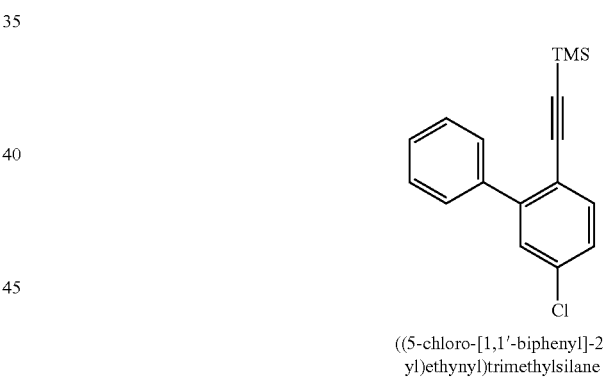

((5-chloro-[1,1'-biphenyl]-2-
yl)ethynyl)trimethylsilane

Under N$_2$ atmosphere, ((2-bromo-4-chlorophenyl)ethynyl)trimethylsilane (100.0 g, 347.63 mmol) was dissolved in THF/H$_2$O (2/1, 1750.0 mL) at room temperature. After stirring at room temperature, to the solution, phenyl boronic acid (51.0 g, 418.27 mmol), K$_2$CO$_3$ (96.0 g, 695.65 mmol), and Pd(PPh$_3$)$_4$ (12.0 g, 10.38 mmol) were sequentially added. The mixture was heated to reflux for 12 h, and monitored by TLC. After completion, the reaction mixture was cooled to room temperature, extracted with EA, washed with saturated NaCl solution, dried over anhydrous Na$_2$SO$_4$, concentrated, and purified by column chromatography (eluent: PE) to give ((5-chloro-[1,1'-biphenyl]-2-yl)ethynyl)trimethylsilane as yellow liquid (81.0 g, 281.58 mmol, 81.0%).

Step 3:

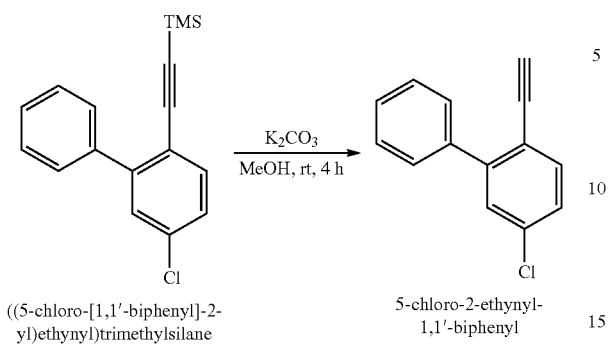

((5-chloro-[1,1'-biphenyl]-2-yl)ethynyl)trimethylsilane 5-chloro-2-ethynyl-1,1'-biphenyl At room temperature, ((5-chloro-[1,1'-biphenyl]-2-yl)ethynyl)trimethylsilane (81.0 g, 281.58 mmol) was dissolved in MeOH (800.0 mL). K₂CO₃ (46.6, 337.90 mmol) was added and the mixture was reacted at room temperature for 4 h, and the reaction was monitored by TLC. After the completion, the reaction solution was filtered by celite, concentrated, and purified by column chromatography (eluent: PE) to give 5-chloro-2-ethynyl-1,1'-biphenyl as light yellow solid (58.0 g, 272.71 mmol, 96.8%).

Step 4:

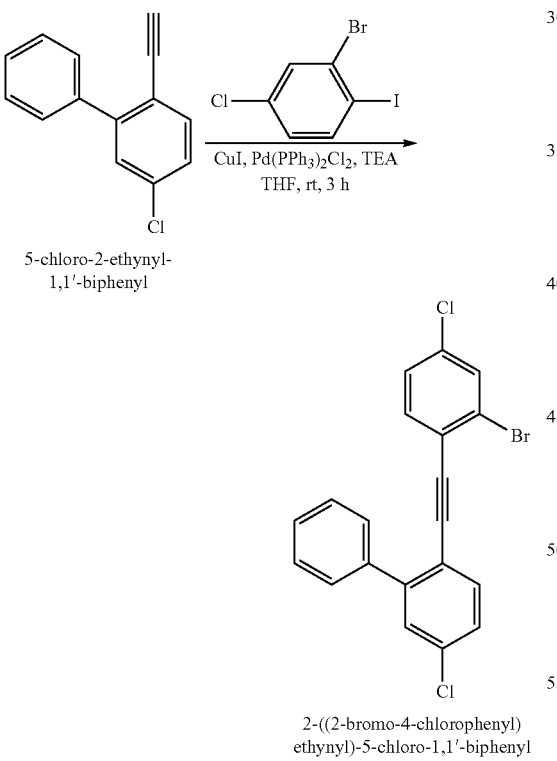

5-chloro-2-ethynyl-1,1'-biphenyl 2-((2-bromo-4-chlorophenyl)ethynyl)-5-chloro-1,1'-biphenyl Under N₂ atmosphere, 2-bromo-4-chloro-1-iodobenzene (12 g, 38.36 mmol) was dissolved in anhydrous THF (200.0 mL) at room temperature. To the solution were add TEA (6.3 mL, 45.14 mmol), CuI (0.2 g, 1.13 mmol), and Pd(PPh₃)₂Cl₂ (0.8 g, 1.13 mmol). The mixture was stirred for 20 min. Then 5-chloro-2-ethynyl-1,1'-biphenyl (8.0 g, 37.62 mmol, in 20 mL THF) was slowly added. The mixture was reacted at room temperature for 3 h, and monitored by TLC. The reaction mixture was quenched with water, extracted with EA, concentrated, and purified by column chromatography (eluent: PE) to give 2-((2-bromo-4-chlorophenyl)ethynyl)-5-chloro-1,1'-biphenyl as white solid (12.0 g, 30.1 mmol, 80%).

Step 5:

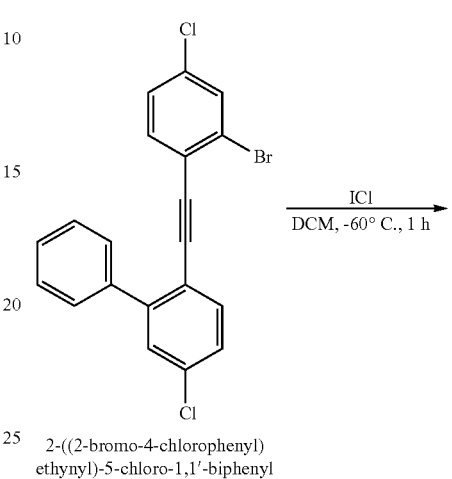

2-((2-bromo-4-chlorophenyl)ethynyl)-5-chloro-1,1'-biphenyl

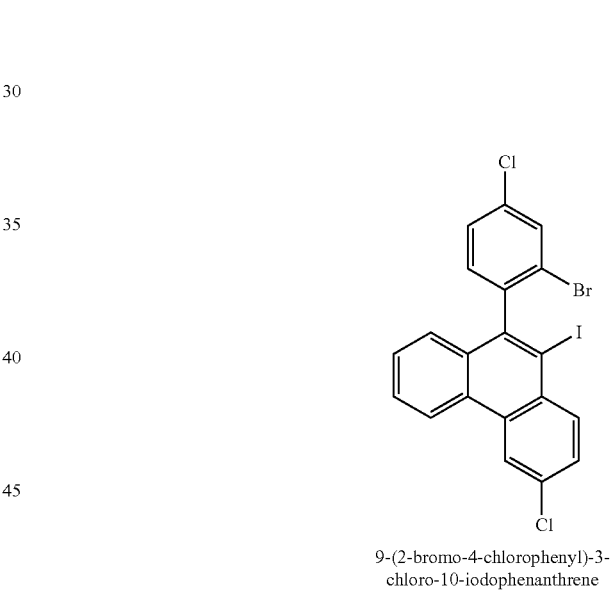

9-(2-bromo-4-chlorophenyl)-3-chloro-10-iodophenanthrene

Under N₂ atmosphere, 2-((2-bromo-4-chlorophenyl)ethynyl)-5-chloro-1,1'-biphenyl (12.0 g, 30.1 mmol) was dissolved in DCM (300.0 mL) at room temperature. After cooling to −60° C., a solution of ICl (33.6 mL, 33.61 mmol, 1.0 M) was slowly added to the reaction solution. The resulting solution was reacted at low temperature for 1 h, and monitored by TLC. After completion, the reaction mixture was quenched with saturated Na₂SO₃ solution, and was allowed to warm to room temperature after the cooling bath was removed. Stirring was continued until the purple color of the solution disappeared. The mixture was extracted with DCM, dried over MgSO₄, filtered, and concentrated. The residue solid was refluxed in n-hexane (1.0 L) for 4 h, and the solid was collected by filtration to give 9-(2-bromo-4-chlorophenyl)-3-chloro-10-iodophenanthrene as white solid (14.9 g, 28.50 mmol, 94.7%).

Step 6:

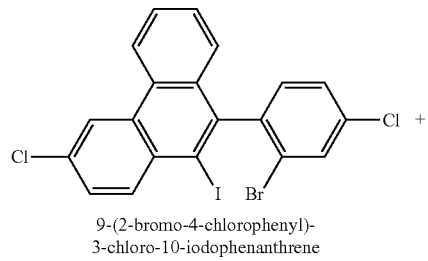

9-(2-bromo-4-chlorophenyl)-
3-chloro-10-iodophenanthrene 9-(2-bromo-4-chlorophenyl)-3-chloro-10-iodo-phenanthrene (10.52 g, 20 mmol) was dissolved in 100 mL of Et$_2$O. After cooling to −78° C., 8.8 mL of n-BuLi solution (2.5 M) was added slowly to the solution. After reacting for 1 h at −78° C., a pre-cooled to −78° C. solution of dichlorodiphenylsilane (7.56 g, 30 mmol) in THF (100 mL) was slowly added to the reaction solution. The mixture was reacted for 1 h at −78° C., and then slowly warmed to room temperature and reacted for another 2 h. A solid slowly precipitated after most of Et$_2$O was evaporated. After filtration, the solid was recrystallized twice in THF to give 6,11-dichloro-9,9-diphenyl-9H-benzo[d]phenanthro[9,10-b]silole (2.5 g, 5 mmol, 25%).

Step 7:

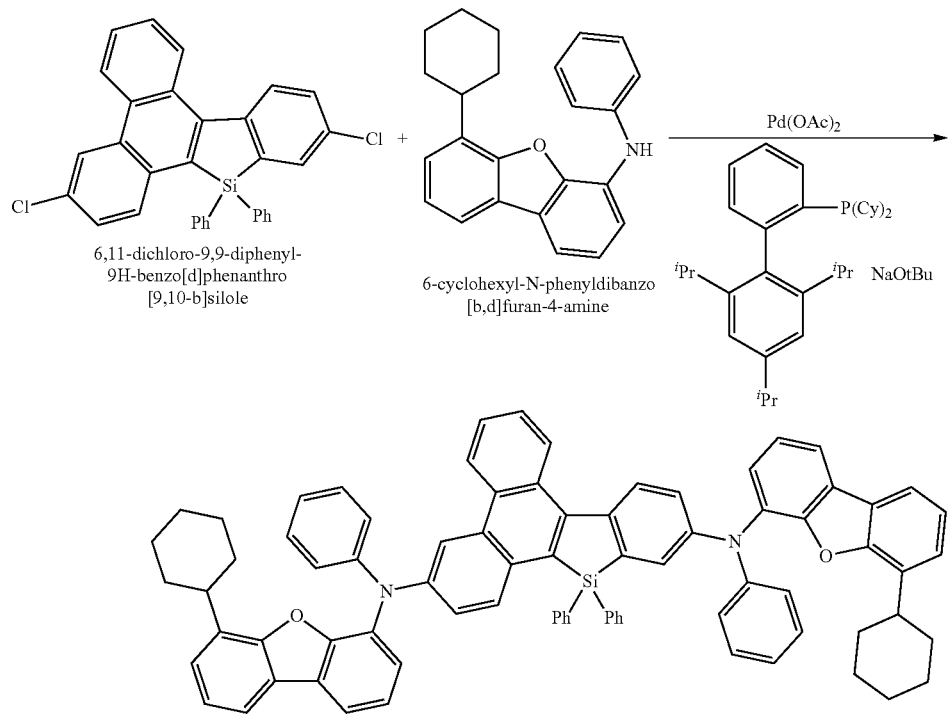

-continued

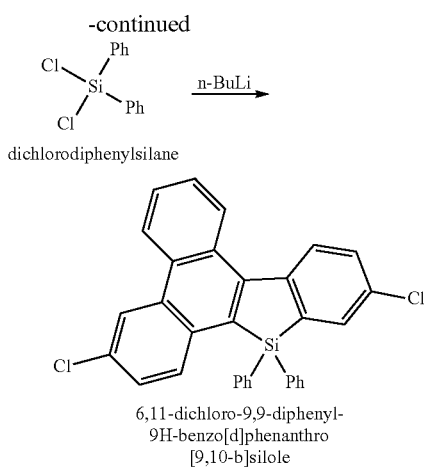

Under N$_2$ atmosphere, to xylene (50.0 mL) was added Pd(OAc)$_2$ (30 mg, 0.14 mmol) at room temperature. After stirring for 10 min, 2-dicyclohexylphosphine-2',4',6'-triisopropylbiphenyl (132 mg, 0.27 mmol) was added and the resulting solution was stirred for 30 min. 6,11-dichloro-9,9-diphenyl-9H-benzo[d]phenanthro[9,10-b]silole (2.5 g, 5 mmol) was added to the reaction solution and stirred until completely dissolved. 6-cyclohexyl-N-phenyldibenzo[b,d]furan-4-amine (5.1 g, 15 mmol) was added to the reaction solution and stirred until completely dissolved. NaOt-Bu (2.5 g, 25 mmol) was added to the reaction solution. The reaction solution was heated to 140° C. for 1 h, and monitored by TLC. After the completion, the reaction mixture as hot was filtered through a three-layered plug (basic alumina, anhydrous Na$_2$SO$_4$, and celite, 1 cm for each layer). The filtrate was concentrated and purified by column chromatography (silica gel (200 ~300 mesh), eluent: PE/toluene (10/1)). After concentration, the resulting solid was heated in THF until dissolved, and anhydrous EtOH was added to the solution. The solvent was distilled off under normal pressure until solid appear. The mixture was cooled to room temperature under stirring. The solid was collected by filtration to give Compound 738 as yellow solid (1.9 g, 1.7 mmol, 34%). The compound was identified to be the target product, having a molecular weight of 1113.

The persons skilled in the art should know that the above preparation method is only an illustrative example, and the persons skilled in the art can obtain the structure of other compounds of the present invention by modifying the above preparation method.

Device Examples

A glass substrate with 80 nm thick indium-tin-oxide (ITO) anode was first cleaned and then treated with oxygen plasma and UV ozone. After the treatments, the substrate was baked dry in a glovebox to remove moisture. The substrate was then mounted on a substrate holder and loaded into a vacuum chamber. The organic layers specified below were deposited in sequence by thermal vacuum deposition on the ITO anode at a rate of 0.2-2 Å/s at a vacuum of around $10^{-8}$ torr. Compound HI (100 Å) was used as the hole injection layer (HIL). Compound HT (1000 Å) was used as the hole transporting layer (HTL). Compound EB (100 Å) was used as the electron blocking layer (EBL). Then the inventive compound or the comparative compound was doped in the host Compound HOST as the emitting layer (EML, 250 Å). On the emitting layer, Compound HB (100 Å) was deposited as the hole blocking layer (HBL). A mixture (50:50) of Compound ET and 8-Hydroxyquinolinolato-lithium (Liq) was deposited as the electron transporting layer (ETL, 150 Å). Finally, 10 Å-thick Liq was deposited as the electron injection layer and 1200 Å of Al was deposited as the cathode. The device was then transferred back to the glovebox and encapsulated with a glass lid and a moisture getter to complete the device.

The detailed emitting layer structure and thicknesses are shown in the table below. In the layers in which more than one materials were used, they were obtained by doping different compounds in the weight ratios described therein.

TABLE 1

Device structure of device examples

| Device ID | EML |
|---|---|
| Example 1 | Compound HOST:Compound 186 (96:4) (250 Å) |
| Example 2 | Compound HOST:Compound 738 (96:4) (250 Å) |
| Comparative Example 1 | Compound HOST:Compound A (96:4) (250 Å) |
| Comparative Example 2 | Compound HOST:Compound B (96:4) (250 Å) |

The structures of the materials used in the devices are shown below:

Compound HI

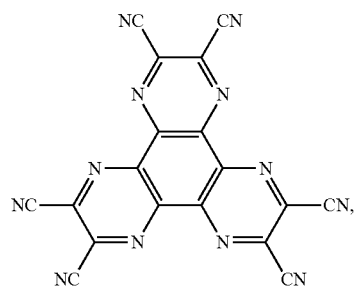

Compound HT

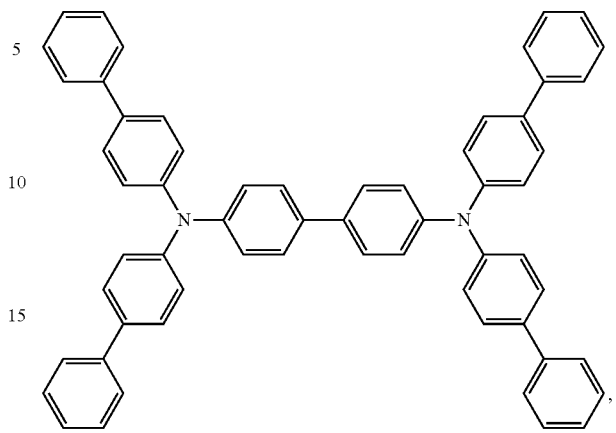

Compound EB

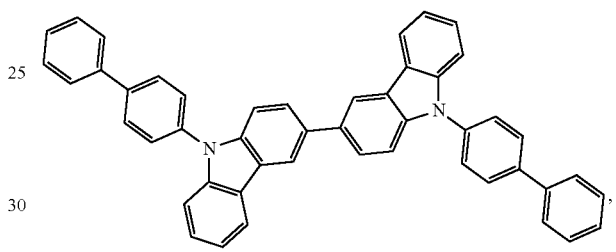

Compound HOST

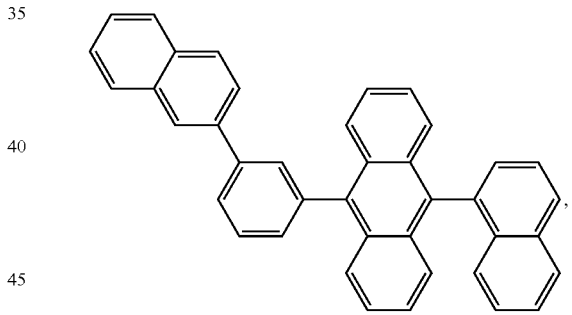

Compound HB

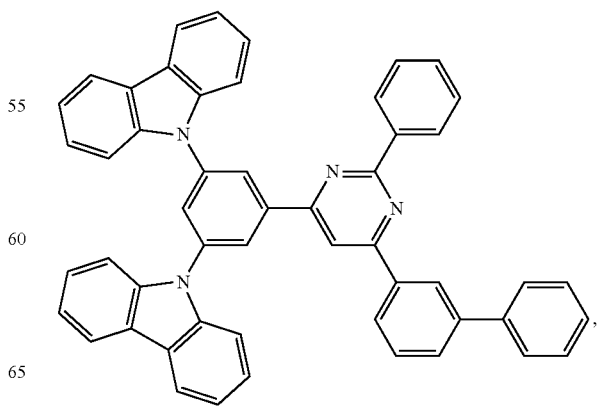

Compound ET

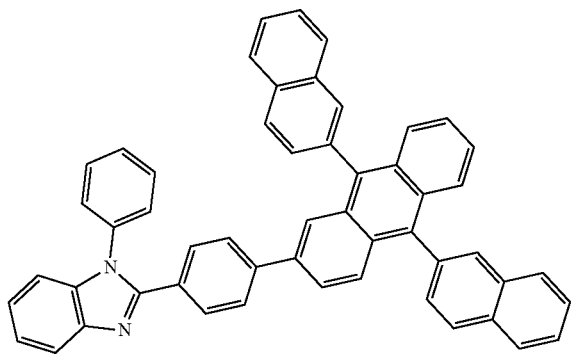

Compound 186

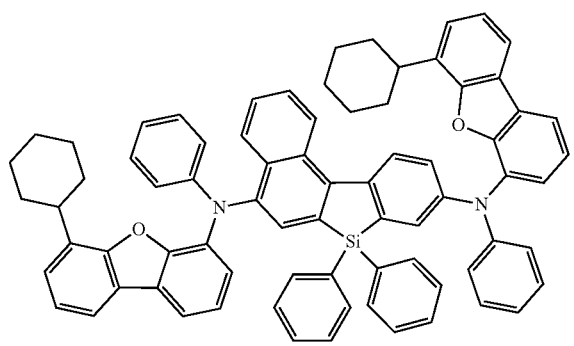

Compound 738

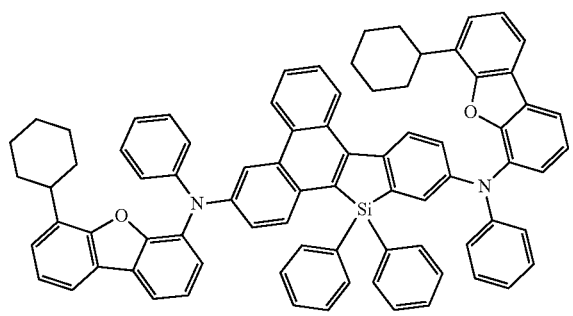

Compound A

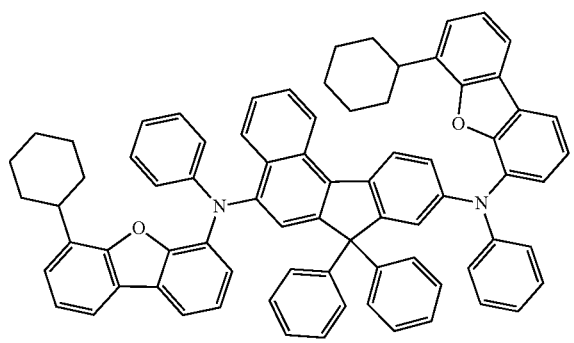

Compound B

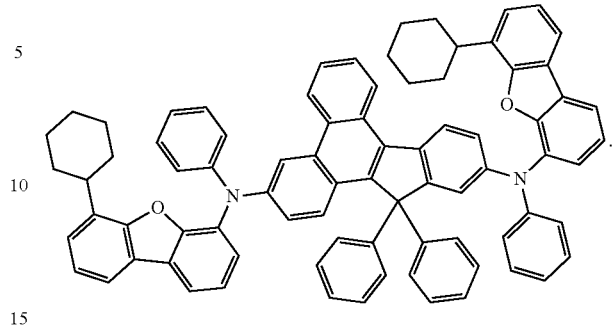

The IVL characteristics of the devices were measured at various current densities and voltages. The luminance efficiency (LE), External Quantum Efficiency (EQE), λmax, voltage (V) and CIE data were measured at 1000 nits. The lifetime was tested at a constant current from an initial brightness of 1200 nits. LT97 means the lifetime of the device decayed to 97% of the initial brightness. The lifetime of Comparative Example 1 is set to 100 and all the other devices are relative to Comparative Example 1.

TABLE 2

Device data

| Device ID | CIE (x,y) | λmax (nm) | Voltage (V) | LE (cd/A) | EQE (%) | LT97 |
|---|---|---|---|---|---|---|
| Example 1 | (0.16,0.37) | 480 | 3.84 | 17.7 | 7.9 | 1350 |
| Example 2 | (0.16,0.38) | 476 | 3.73 | 18.0 | 7.9 | 2600 |
| Comparative Example 1 | (0.15,0.13) | 452 | 4.22 | 7.9 | 7.6 | 100 |
| Comparative Example 2 | (0.15,0.09) | 442 | 4.15 | 5.3 | 6.6 | 90 |

Discussion

Table 2 shows the device performance of the compounds 186 and 738 of the present invention and comparative compounds. Compounds 186 and 738 are compared to compounds A and B, and compounds 186 and 738 are silicon fluorene compounds, while compounds A and B are corresponding fluorene compounds. Unexpectedly, the device efficiencies of compounds 186 and 738 are much higher than those of compounds A and (EQE 7.9% and 7.9% vs. 7.6% and 6.6%). The device voltages of compounds 186 and 738 are much lower than those of compounds A and B (3.84 V and 3.73 V vs. 4.22 V and 4.15 V). Furthermore, the inventive compounds showed much improved lifetime compared to comparative compounds.

The advantages observed with the compounds of the invention are completely unexpected. Even for those skilled in the art, it is impossible to predict this situation. The present invention provides a range of effective luminescent materials. These materials can be used in commercial OLED products.

It is understood that the various embodiments described herein are by way of example only and are not intended to limit the scope of the invention. The present invention as claimed may therefore include variations from the particular examples and preferred embodiments described herein, as will be apparent to one of skill in the art. Many of the materials and structures described herein may be substituted

What is claimed is:
1. A compound of formula I:

 Formula I wherein,
n is an integer from 1 to 4; when n is 2 or more, two groups of B may be the same or different;
A is a structure represented by formula II:

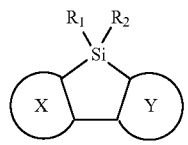 Formula II each of ring X and Y independently represents a substituted or unsubstituted aryl or heteroaryl group having 6 to 30 ring atoms;
at least one of X and Y is a fused ring system;
$R_1$ and $R_2$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;
$R_1$ and $R_2$ are optionally joined to form a ring;
B represents a group represented by Formula III:

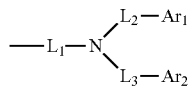 Formula III wherein:
each of $Ar_1$ and $Ar_2$ are independently selected from the group consisting of a substituted or unsubstituted aryl group having 6 to 30 ring carbon atoms, a substituted or unsubstituted heteroaryl group having 5 to 30 ring atoms, and combinations thereof;
each of $L_1$, $L_2$, and $L_3$ are independently selected from the group consisting of a single bond, an arylene group having 6 to 30 ring carbon atoms, a heteroarylene group having 5 to 30 ring atoms, and combinations thereof;
$Ar_1$ and $Ar_2$ can be optionally joined to form a ring; and
when n is 1, B is connected on the fused ring in the ring X or B is connected on the fused ring in the ring Y;
wherein the structure A is selected from Formula IV-X and Formula XII-XXIII:

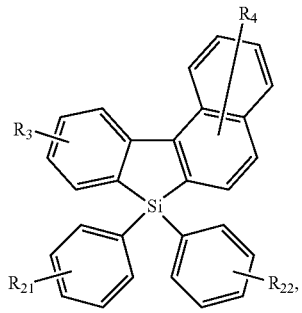 Formula IV

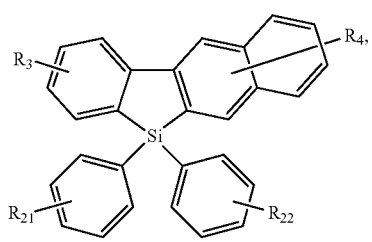 Formula V

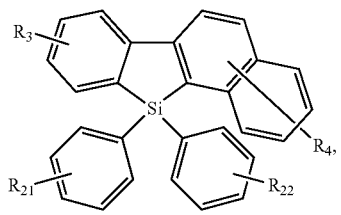 Formula VI

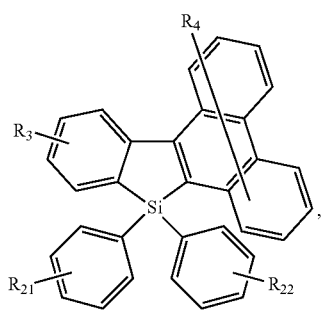 Formula VII

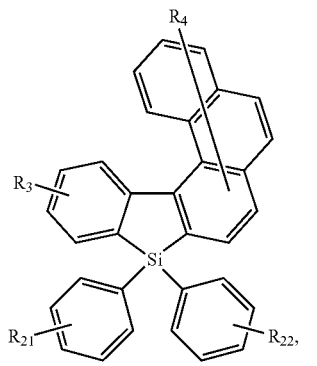 Formula VIII

-continued
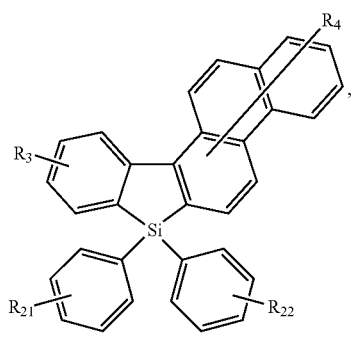
Formula IX
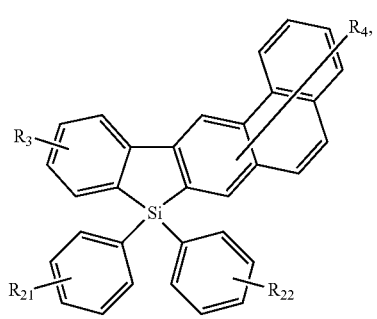
Formula X
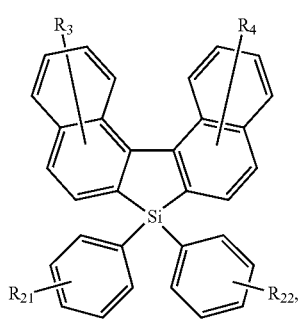
Formula XII
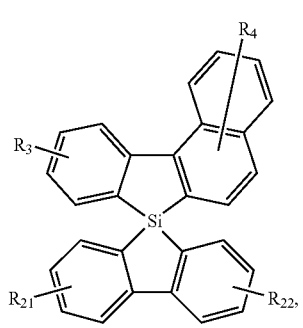
Formula XIII
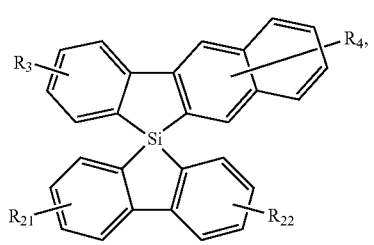
Formula XIV
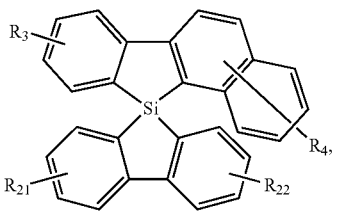
Formula XV
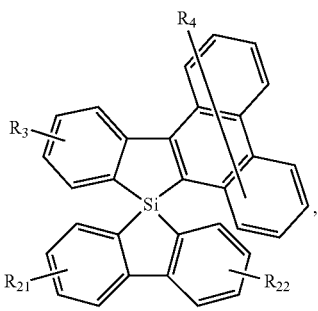
Formula XVI
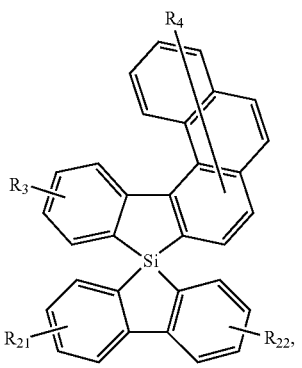
Formula XVII
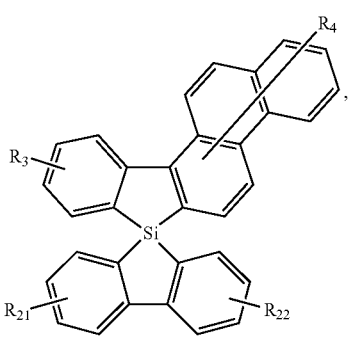
Formula XVIII
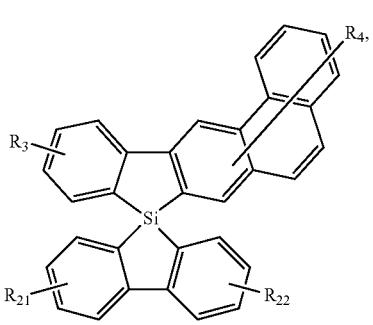
Formula XIX -continued Formula XX

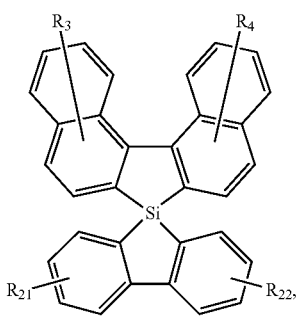

Formula XXI

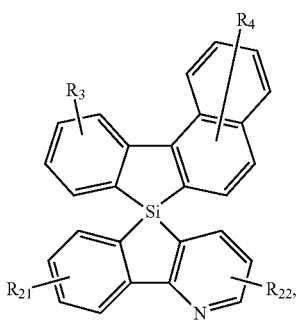

Formula XXII

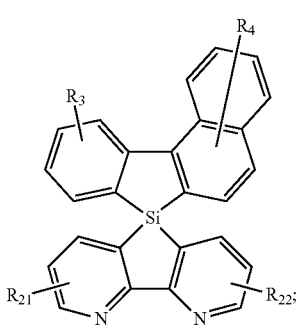

and

Formula XXIII

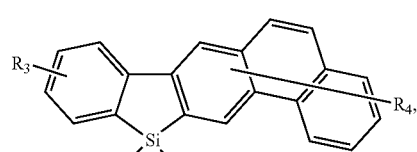

wherein, $R_{21}$, $R_{22}$, $R_3$ and $R_4$ each independently represents mono, multiple or no substitution:

when they represent multi substitutions, the adjacent substitution can be optionally joined to form a ring, with the proviso that for Formula V, only $R_{21}$, $R_{22}$ and $R_3$ can be optionally joined to form a ring:

$R_{21}$, $R_{22}$, $R_3$ and $R_4$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof.

2. The compound of claim 1, wherein the structure B is represented by Formula XXIV:

Formula XXIV

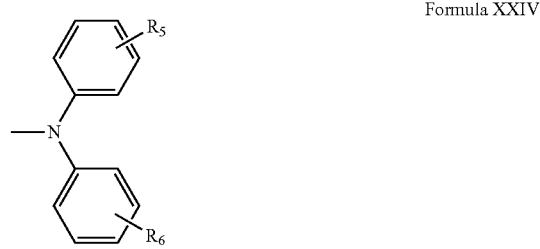

wherein $R_5$ and $R_6$ each independently represents mono, di, tri, tetra, penta or no substitution; when they represent multi substitutions, the adjacent substitution can be optionally joined to form a ring;

$R_5$ and $R_6$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof.

3. The compound of claim 1, wherein the structure B is represented by Formula XXV:

Formula XXV

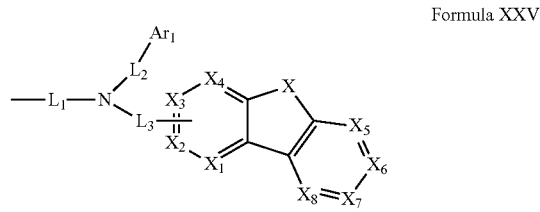

wherein
X is O or S,

X$_1$, X$_2$, X$_3$, X$_4$, X$_5$, X$_6$, X$_7$ and X$_8$ are independently selected from C, CRx or N, wherein Rx is independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof.

4. The compound of claim 1, wherein the structure B is selected from the group consisting of:

B1

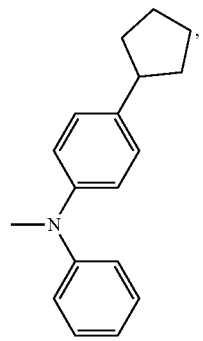

B2

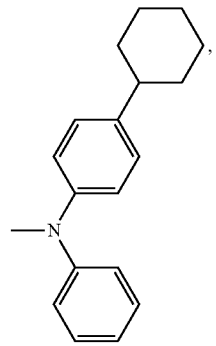

B3

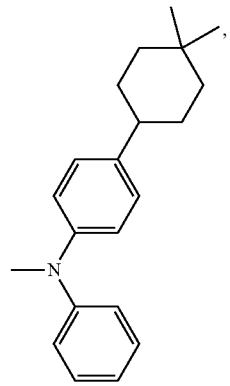

B4

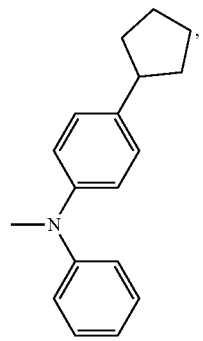

B5

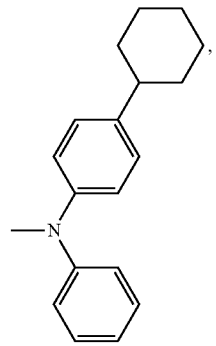

B6

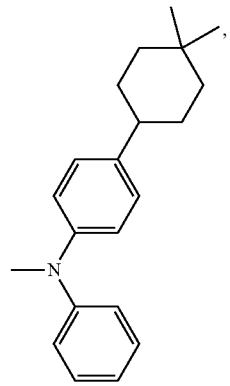

B7

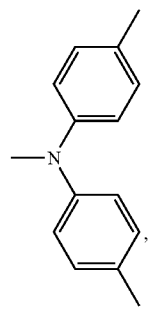

-continued
B8
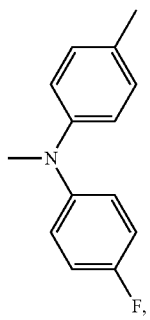
B9
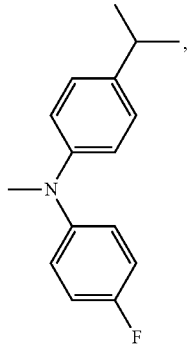
B10
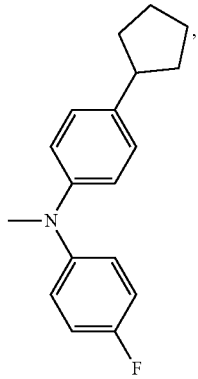
B11
-continued
B12
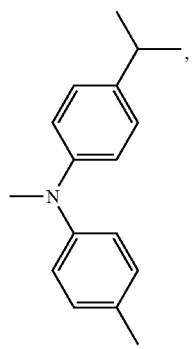
B13
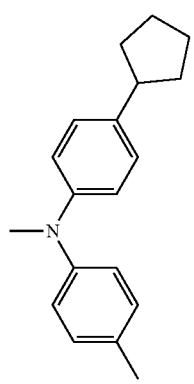
B14
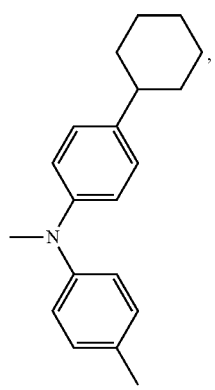
B15
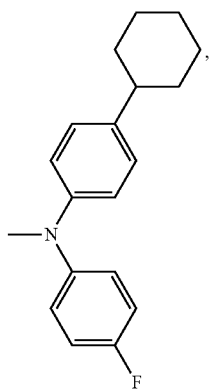
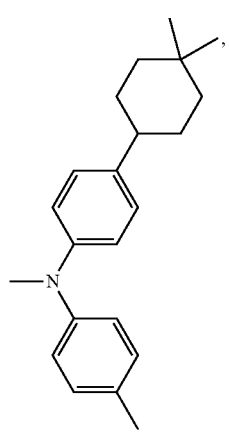

B16 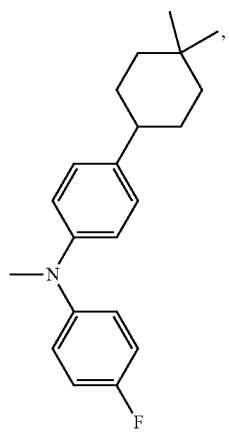
B17 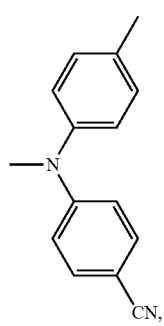
B18 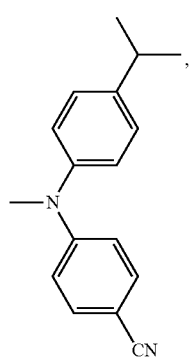
B19 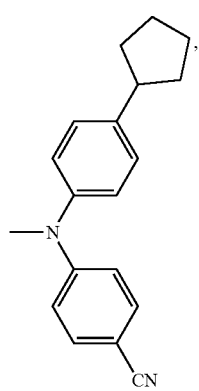
B20 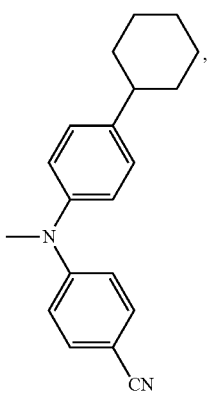
B21 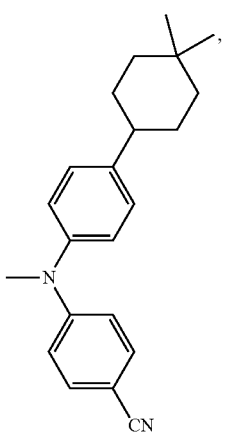
B22 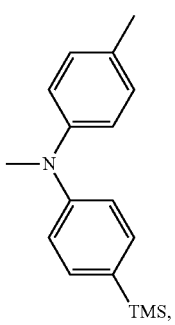
B23 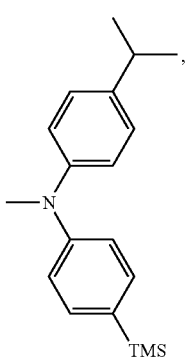

B24
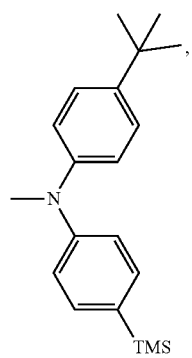
B25
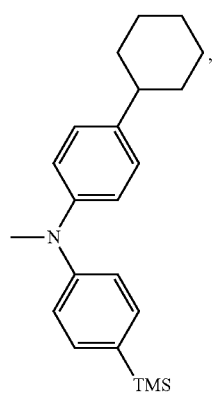
B26
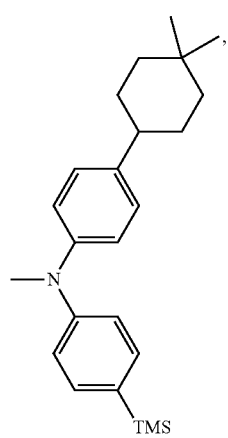
B27
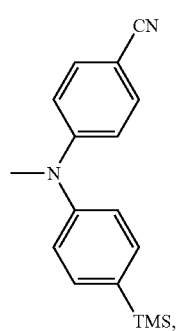
B28
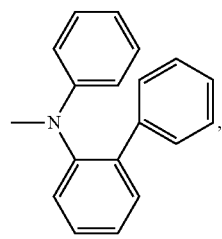
B29
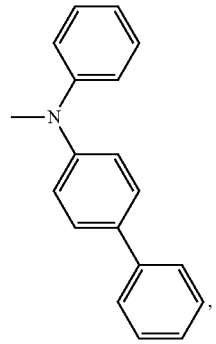
B30
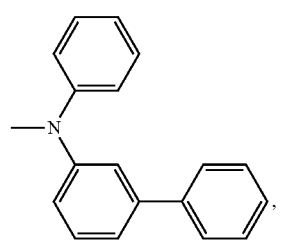
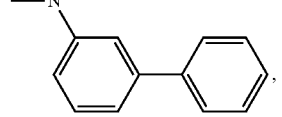
B31
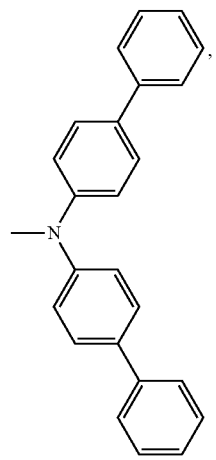
B32
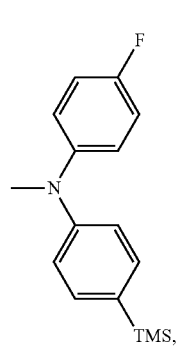

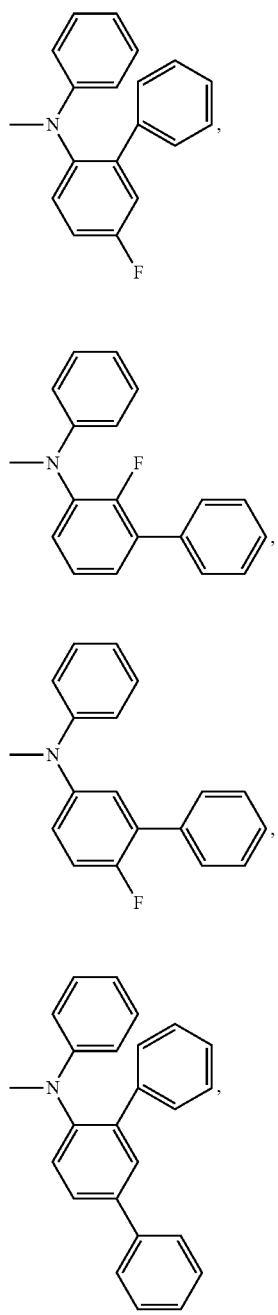
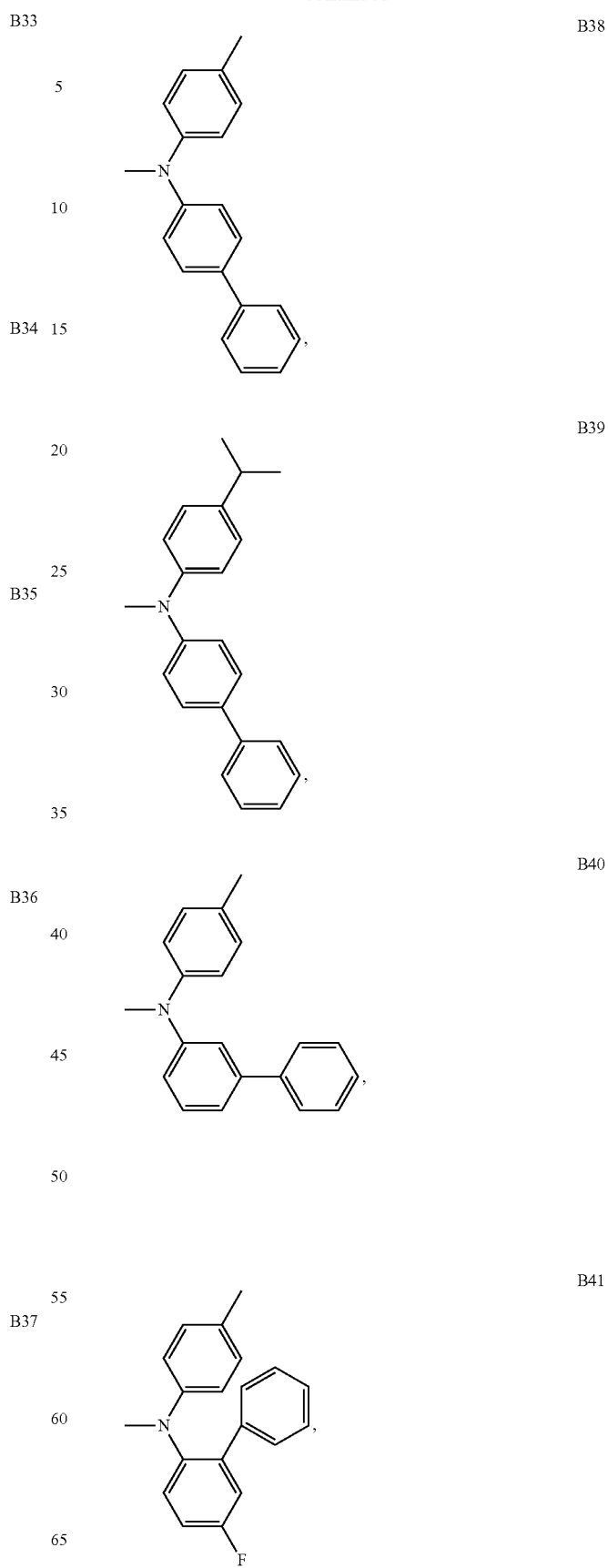

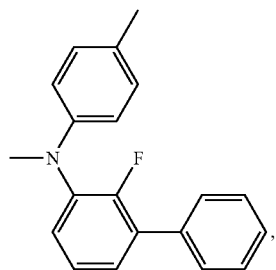
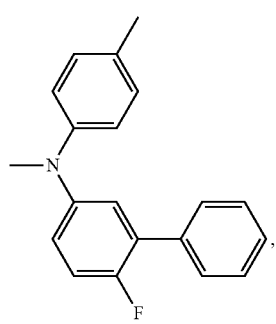
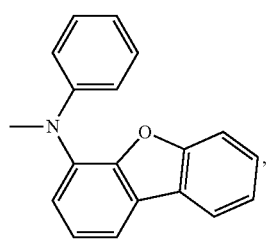
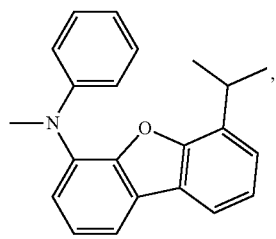
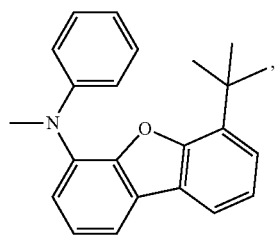
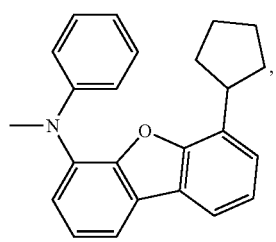
B42
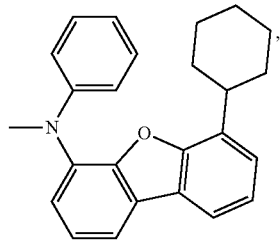
B43
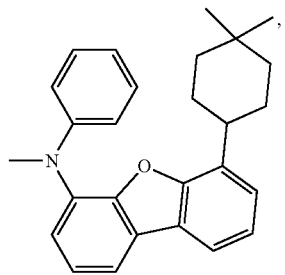
B44
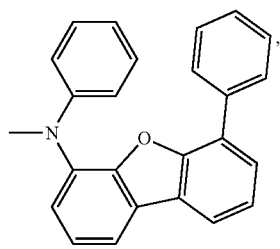
B45
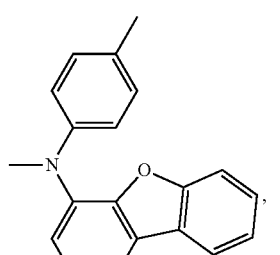
B46
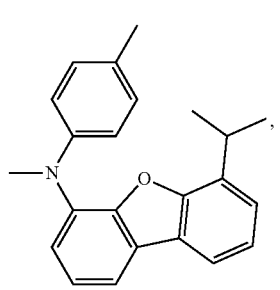
B47
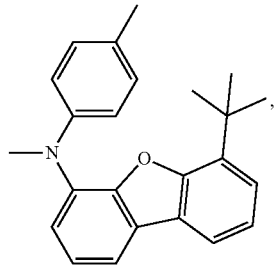
B48
B49
B50
B51
B52
B53

B54 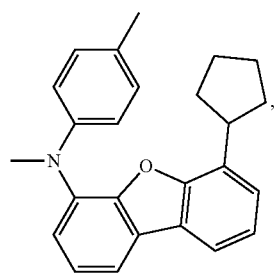
B55 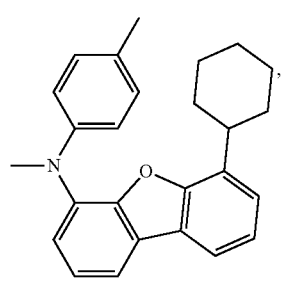
B56 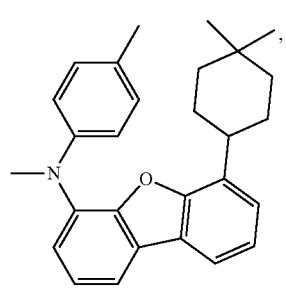
B57 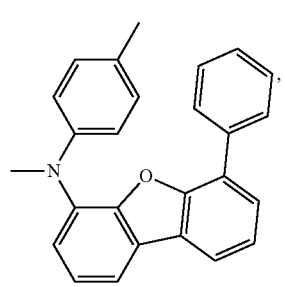
B58 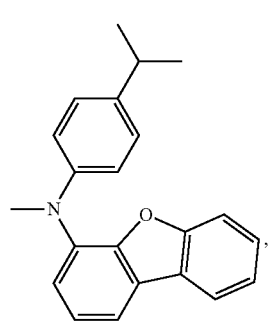
B59 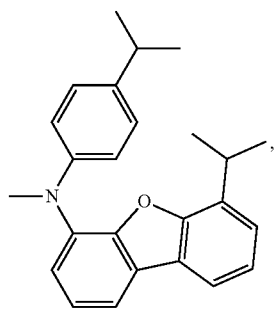
B60 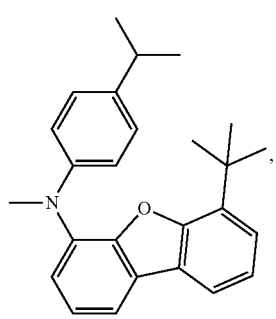
B61 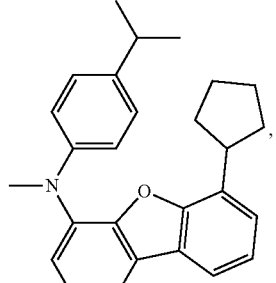
B62 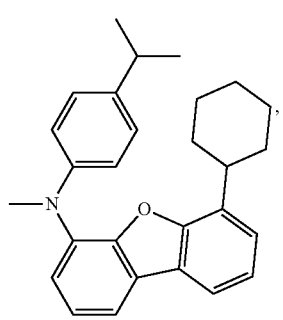
B63 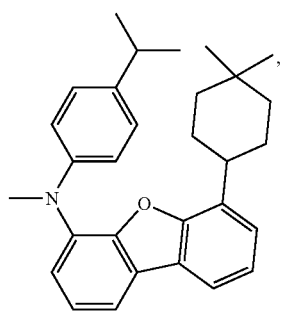

B64 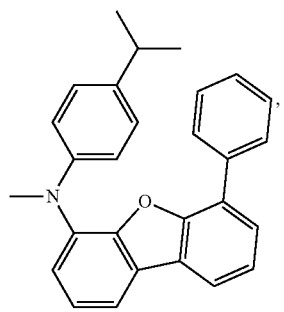
B65 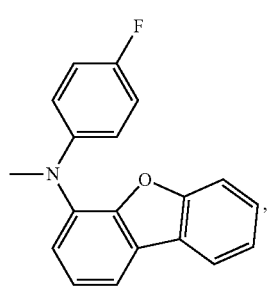
B66 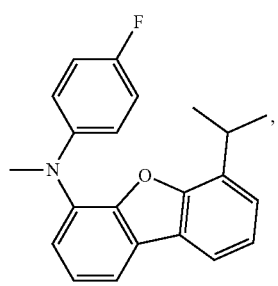
B67 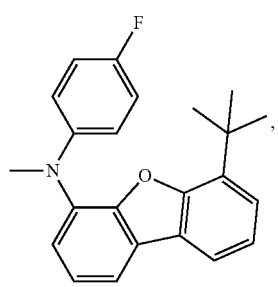
B68 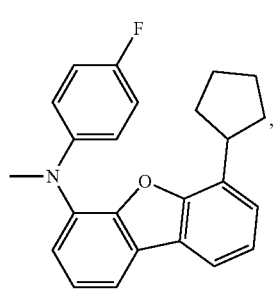
B69 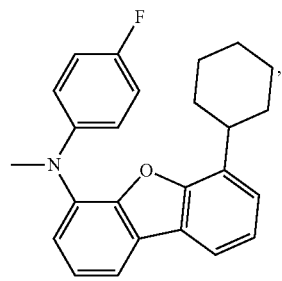
B70 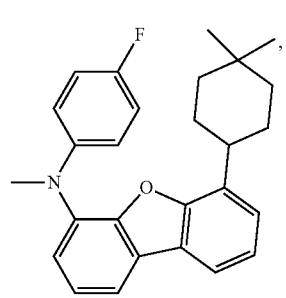
B71 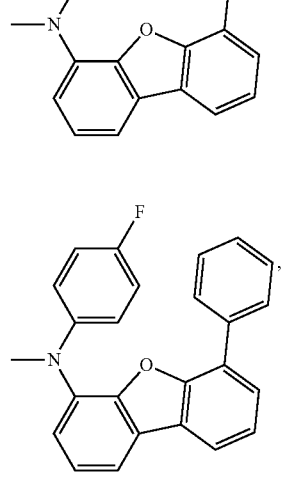
B72 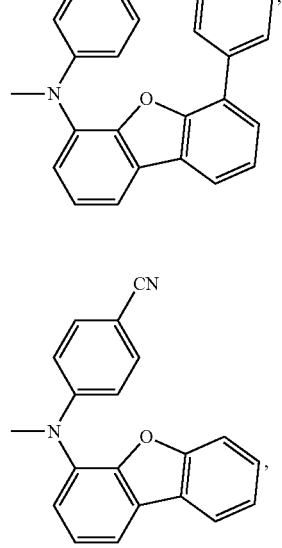
B73 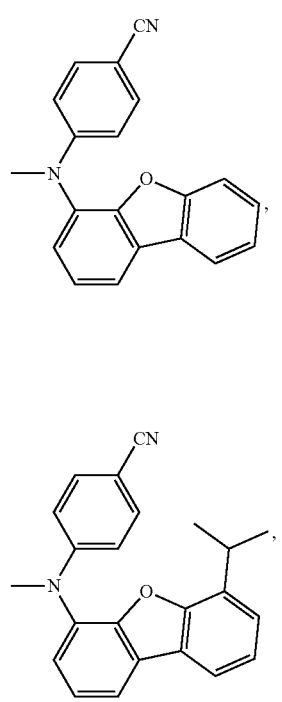

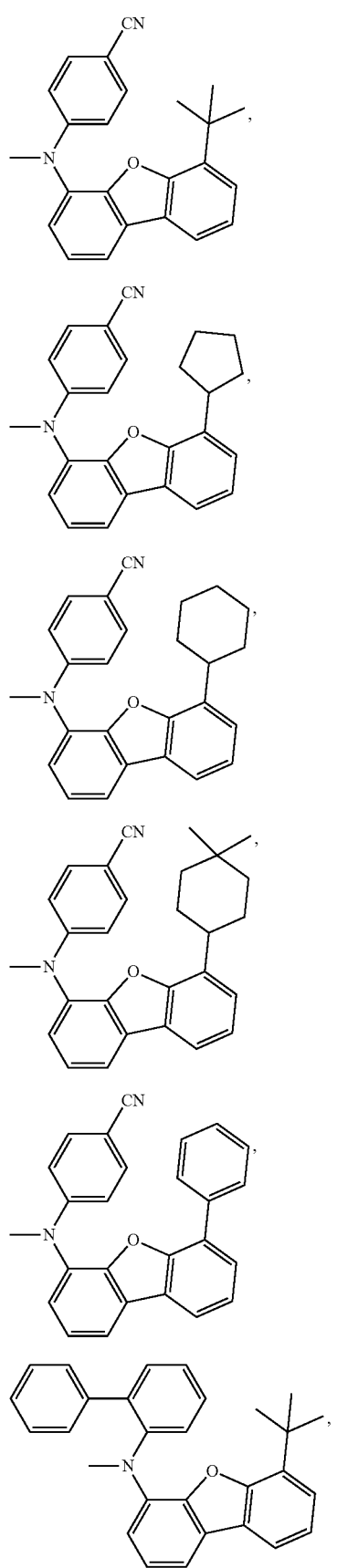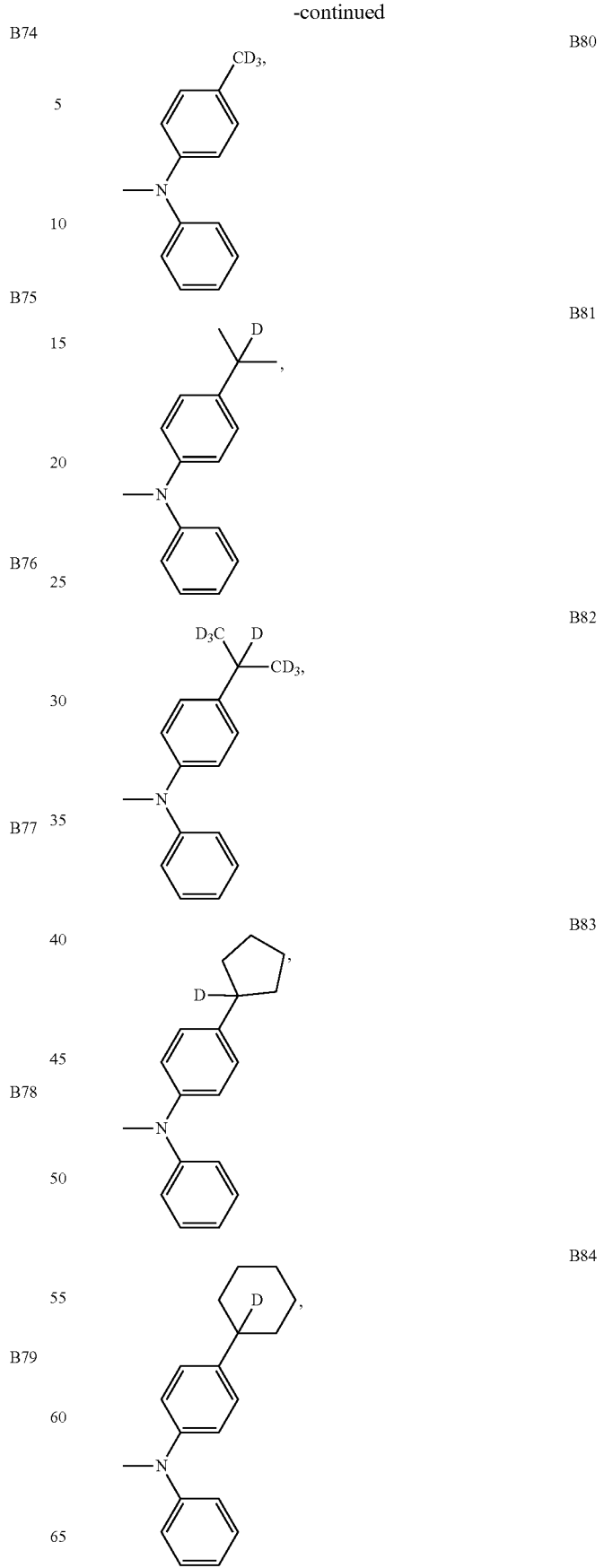

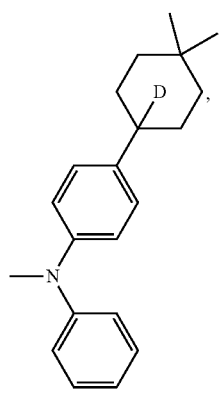
B85
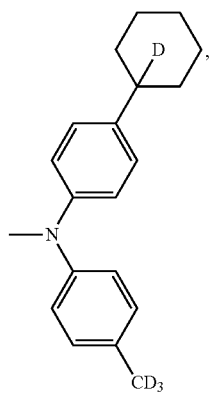
B89
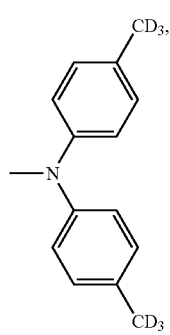
B86
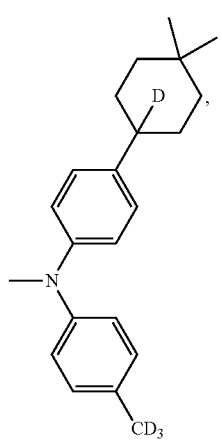
B90
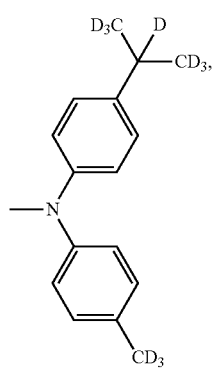
B87
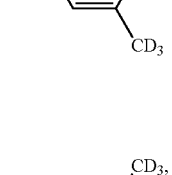
B91
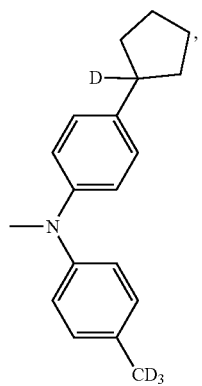
B88
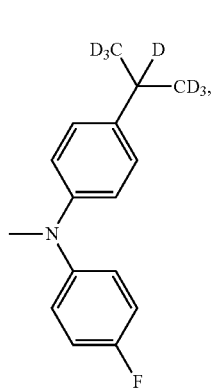
B92

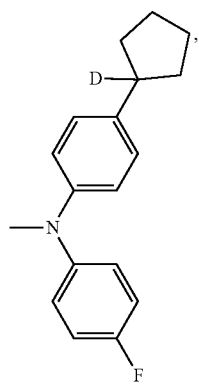
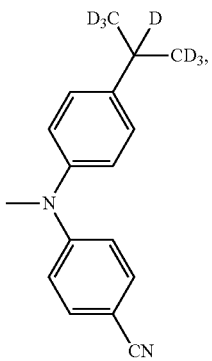
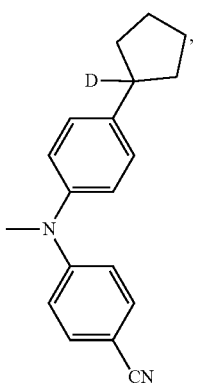
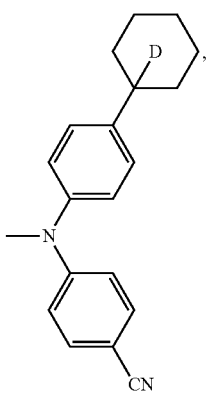
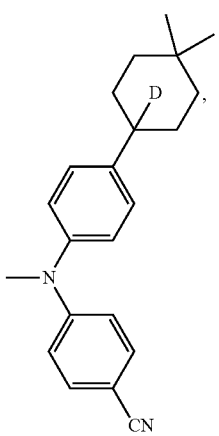

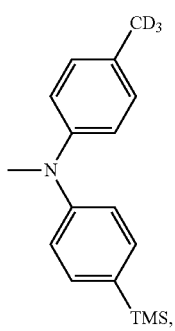
B101
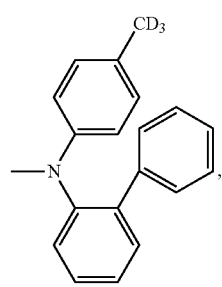
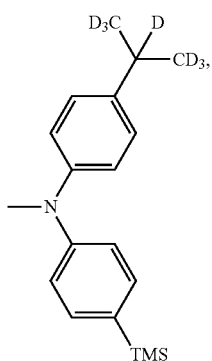
B102
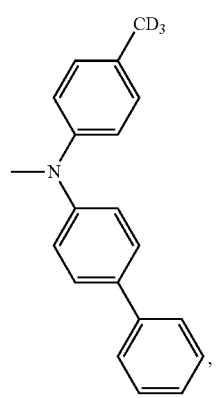
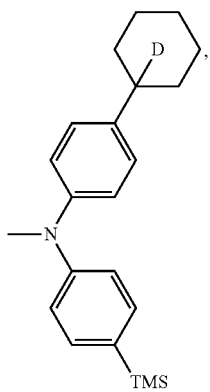
B103
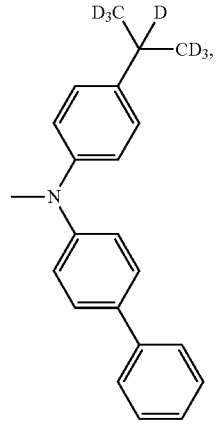
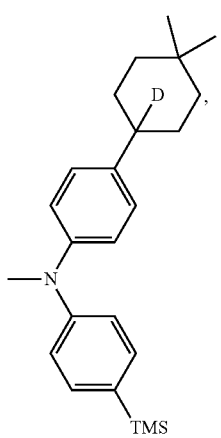
B104
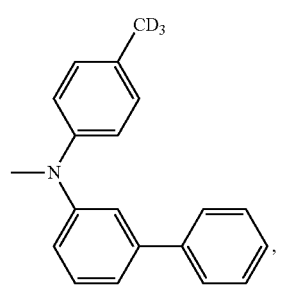

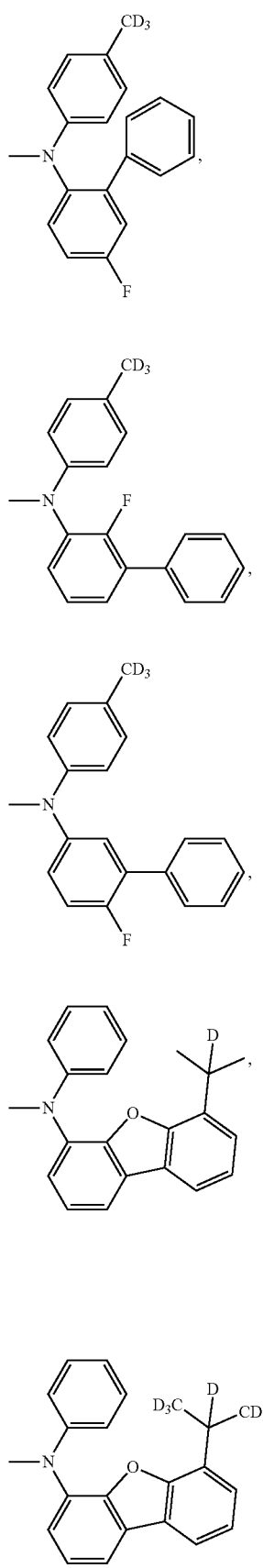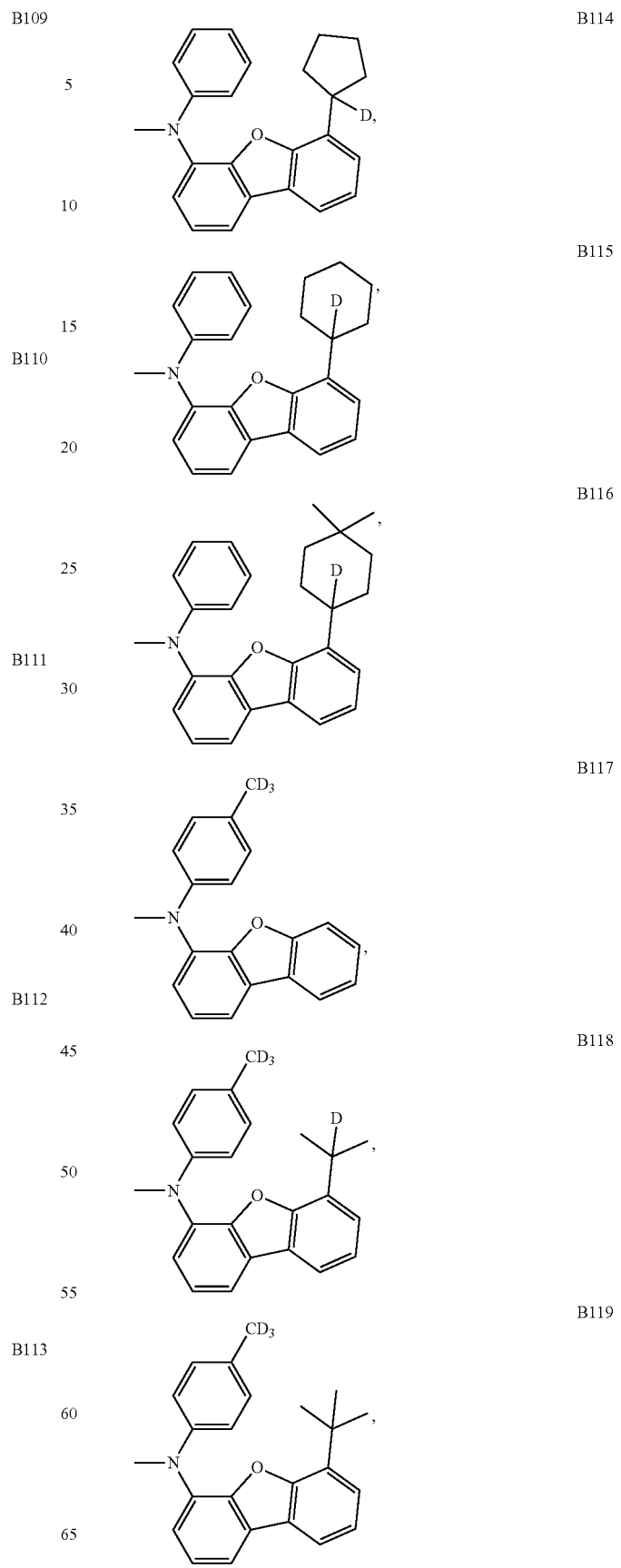

B120 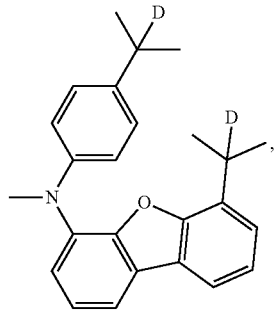
B121 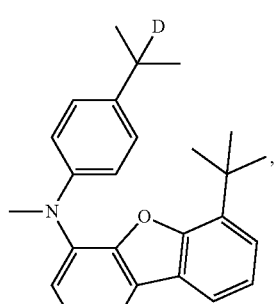
B122 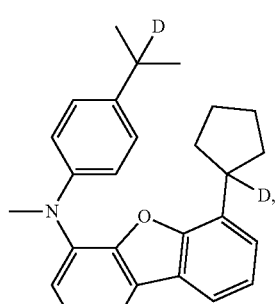
B123 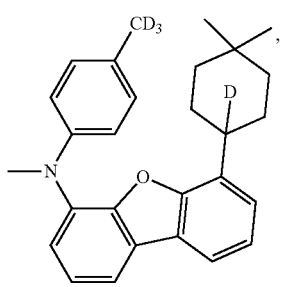
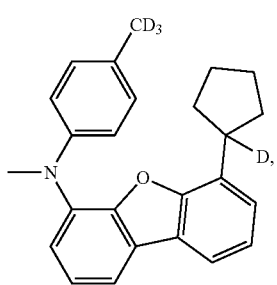 B125
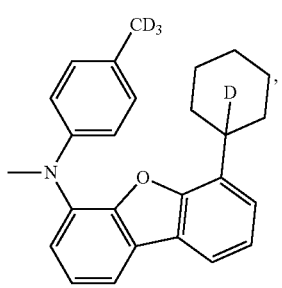 B126
B127 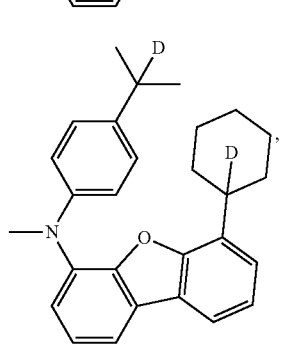
B128 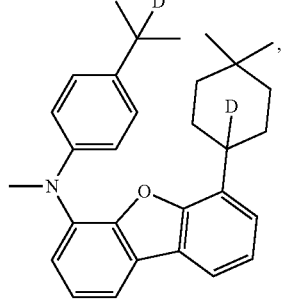
B124 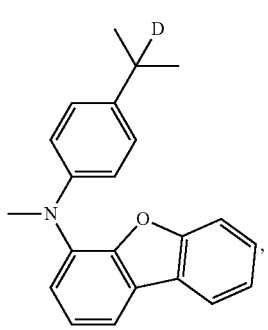
B129 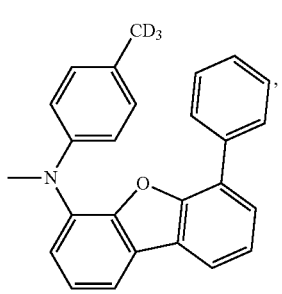

B130 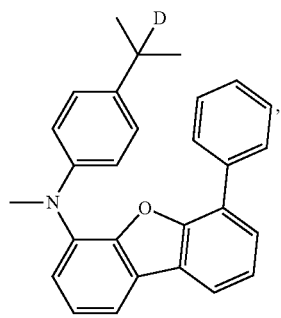
B131 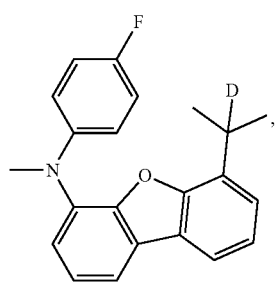
B132 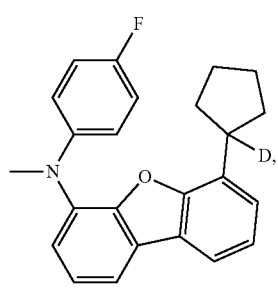
B133 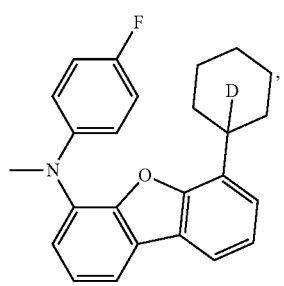
B134 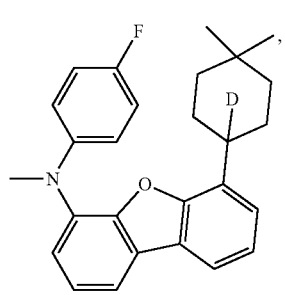
B135 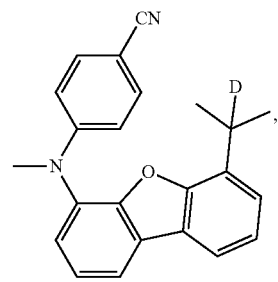
B136 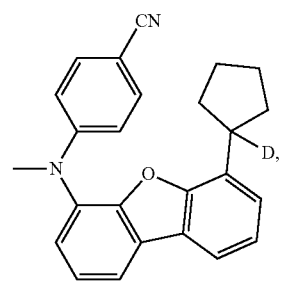
B137 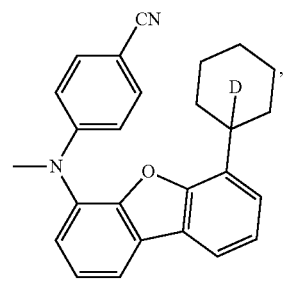
B138 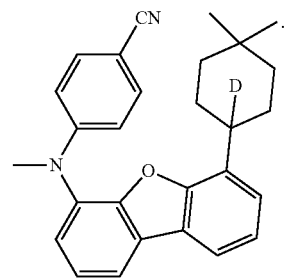

5. The compound of claim 1, wherein the compound having the formula XXVI-XXXIII:
Formula XXVI
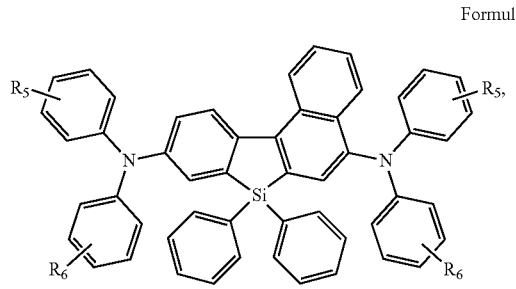
Formula XXVII
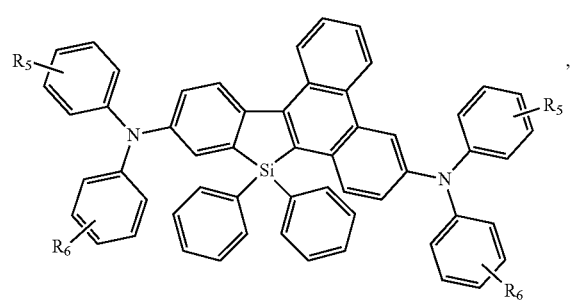
,
Formula XXVIII
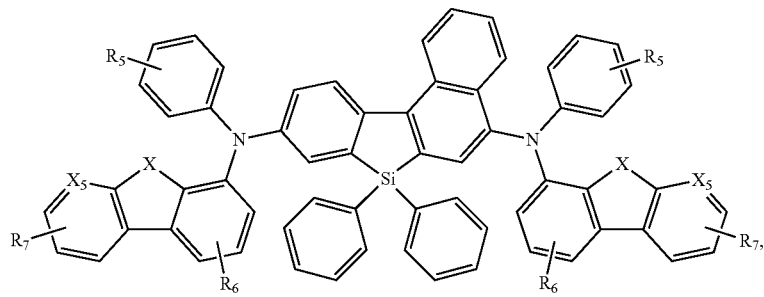
Formula XXIX
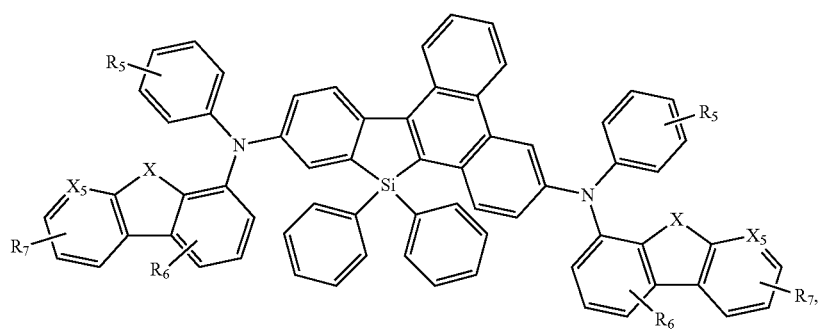
Formula XXX
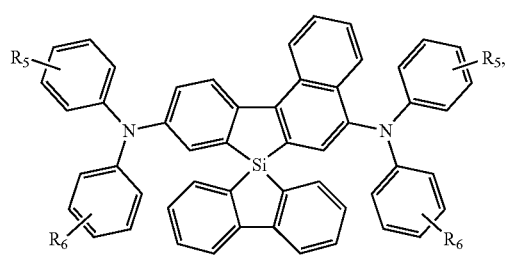
,
Formula XXXI
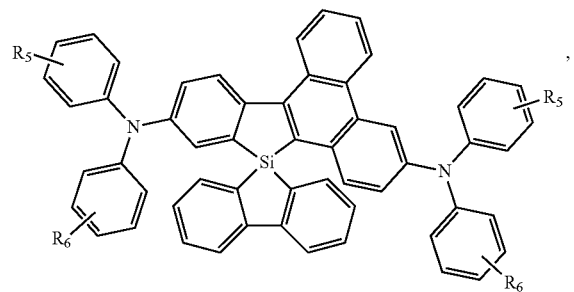
,
Formula XXXII
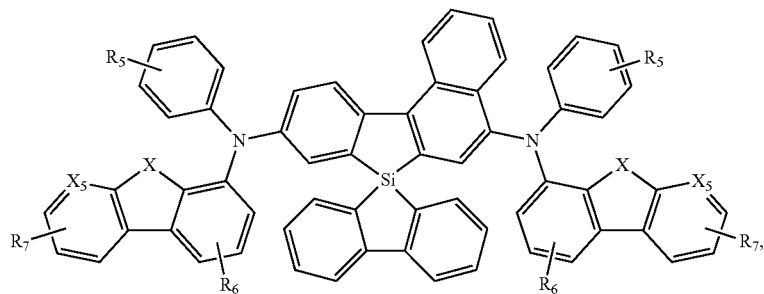
, -continued

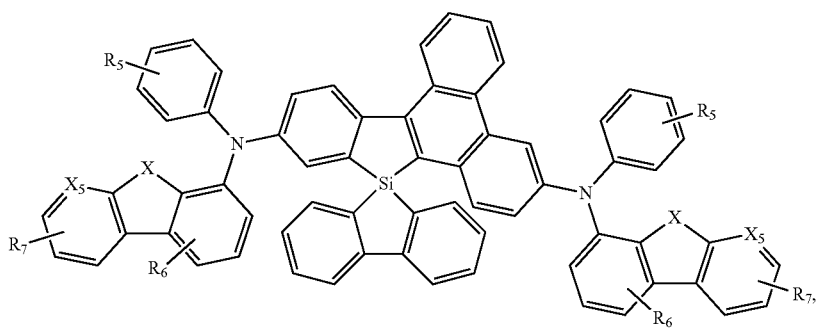

Formula XXXIII wherein
X is O or S,
$X_5$ is selected from CRx, C, or N, wherein Rx is independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;
$R_5$, $R_6$ and $R_7$ each independently represents mono, multi or no substitution; when they represent multi substitutions, the adjacent substitution can be optionally joined to form a ring;
$R_5$, $R_6$ and $R_7$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof.

6. The compound of claim 4, wherein the compound has a structure selected from the group consisting of Compound #139 to Compound #276, Compound #415 to Compound #552, Compound #691 to Compound #828, and Compound #967 to Compound #1104, wherein the Compound #139 to Compound #276, Compound #415 to Compound #552, Compound #691 to Compound #828, Compound #967 to Compound #1104 have the structure of the formula I:

$$A\text{-}(B)_n$$ formula I and wherein A, B and n in the structure of formula I are respectively listed in the table:

| Compound # | A | B | n |
|---|---|---|---|
| 139. | A2 | B1 | 2 |
| 140. | A2 | B2 | 2 |
| 141. | A2 | B3 | 2 |
| 142. | A2 | B4 | 2 |
| 143. | A2 | B5 | 2 |
| 144. | A2 | B6 | 2 |
| 145. | A2 | B7 | 2 |
| 146. | A2 | B8 | 2 |
| 147. | A2 | B9 | 2 |
| 148. | A2 | B10 | 2 |
| 149. | A2 | B11 | 2 |
| 150. | A2 | B12 | 2 |
| 151. | A2 | B13 | 2 |
| 152. | A2 | B14 | 2 |
| 153. | A2 | B15 | 2 |
| 154. | A2 | B16 | 2 |
| 155. | A2 | B17 | 2 |
| 156. | A2 | B18 | 2 |
| 157. | A2 | B19 | 2 |
| 158. | A2 | B20 | 2 |
| 159. | A2 | B21 | 2 |
| 160. | A2 | B22 | 2 |
| 161. | A2 | B23 | 2 |
| 162. | A2 | B24 | 2 |
| 163. | A2 | B25 | 2 |
| 164. | A2 | B26 | 2 |
| 165. | A2 | B27 | 2 |
| 166. | A2 | B28 | 2 |
| 167. | A2 | B29 | 2 |
| 168. | A2 | B30 | 2 |
| 169. | A2 | B31 | 2 |
| 170. | A2 | B32 | 2 |
| 171. | A2 | B33 | 2 |
| 172. | A2 | B34 | 2 |
| 173. | A2 | B35 | 2 |
| 174. | A2 | B36 | 2 |
| 175. | A2 | B37 | 2 |
| 176. | A2 | B38 | 2 |
| 177. | A2 | B39 | 2 |

| Compound # | A | B | n |
|---|---|---|---|
| 178. | A2 | B40 | 2 |
| 179. | A2 | B41 | 2 |
| 180. | A2 | B42 | 2 |
| 181. | A2 | B43 | 2 |
| 182. | A2 | B44 | 2 |
| 183. | A2 | B45 | 2 |
| 184. | A2 | B46 | 2 |
| 185. | A2 | B47 | 2 |
| 186. | A2 | B48 | 2 |
| 187. | A2 | B49 | 2 |
| 188. | A2 | B50 | 2 |
| 189. | A2 | B51 | 2 |
| 190. | A2 | B52 | 2 |
| 191. | A2 | B53 | 2 |
| 192. | A2 | B54 | 2 |
| 193. | A2 | B55 | 2 |
| 194. | A2 | B56 | 2 |
| 195. | A2 | B57 | 2 |
| 196. | A2 | B58 | 2 |
| 197. | A2 | B59 | 2 |
| 198. | A2 | B60 | 2 |
| 199. | A2 | B61 | 2 |
| 200. | A2 | B62 | 2 |
| 201. | A2 | B63 | 2 |
| 202. | A2 | B64 | 2 |
| 203. | A2 | B65 | 2 |
| 204. | A2 | B66 | 2 |
| 205. | A2 | B67 | 2 |
| 206. | A2 | B68 | 2 |
| 207. | A2 | B69 | 2 |
| 208. | A2 | B70 | 2 |
| 209. | A2 | B71 | 2 |
| 210. | A2 | B72 | 2 |
| 211. | A2 | B73 | 2 |
| 212. | A2 | B74 | 2 |
| 213. | A2 | B75 | 2 |
| 214. | A2 | B76 | 2 |
| 215. | A2 | B77 | 2 |
| 216. | A2 | B78 | 2 |
| 217. | A2 | B79 | 2 |
| 218. | A2 | B80 | 2 |
| 219. | A2 | B81 | 2 |
| 220. | A2 | B82 | 2 |
| 221. | A2 | B83 | 2 |
| 222. | A2 | B84 | 2 |
| 223. | A2 | B85 | 2 |
| 224. | A2 | B86 | 2 |
| 225. | A2 | B87 | 2 |
| 226. | A2 | B88 | 2 |
| 227. | A2 | B89 | 2 |
| 228. | A2 | B90 | 2 |
| 229. | A2 | B91 | 2 |
| 230. | A2 | B92 | 2 |
| 231. | A2 | B93 | 2 |
| 232. | A2 | B94 | 2 |
| 233. | A2 | B95 | 2 |
| 234. | A2 | B96 | 2 |
| 235. | A2 | B97 | 2 |
| 236. | A2 | B98 | 2 |
| 237. | A2 | B99 | 2 |
| 238. | A2 | B100 | 2 |
| 239. | A2 | B101 | 2 |
| 240. | A2 | B102 | 2 |
| 241. | A2 | B103 | 2 |
| 242. | A2 | B104 | 2 |
| 243. | A2 | B105 | 2 |
| 244. | A2 | B106 | 2 |
| 245. | A2 | B107 | 2 |
| 246. | A2 | B108 | 2 |
| 247. | A2 | B109 | 2 |
| 248. | A2 | B110 | 2 |
| 249. | A2 | B111 | 2 |
| 250. | A2 | B112 | 2 |
| 251. | A2 | B113 | 2 |
| 252. | A2 | B114 | 2 |
| 253. | A2 | B115 | 2 |
| 254. | A2 | B116 | 2 |
| 255. | A2 | B117 | 2 |
| 256. | A2 | B118 | 2 |
| 257. | A2 | B119 | 2 |
| 258. | A2 | B120 | 2 |
| 259. | A2 | B121 | 2 |
| 260. | A2 | B122 | 2 |
| 261. | A2 | B123 | 2 |
| 262. | A2 | B124 | 2 |
| 263. | A2 | B125 | 2 |
| 264. | A2 | B126 | 2 |
| 265. | A2 | B127 | 2 |
| 266. | A2 | B128 | 2 |
| 267. | A2 | B129 | 2 |
| 268. | A2 | B130 | 2 |
| 269. | A2 | B131 | 2 |
| 270. | A2 | B132 | 2 |
| 271. | A2 | B133 | 2 |
| 272. | A2 | B134 | 2 |
| 273. | A2 | B135 | 2 |
| 274. | A2 | B136 | 2 |
| 275. | A2 | B137 | 2 |
| 276. | A2 | B138 | 2 |
| 415. | A4 | B1 | 2 |
| 416. | A4 | B2 | 2 |
| 417. | A4 | B3 | 2 |
| 418. | A4 | B4 | 2 |
| 419. | A4 | B5 | 2 |
| 420. | A4 | B6 | 2 |
| 421. | A4 | B7 | 2 |
| 422. | A4 | B8 | 2 |
| 423. | A4 | B9 | 2 |
| 424. | A4 | B10 | 2 |
| 425. | A4 | B11 | 2 |
| 426. | A4 | B12 | 2 |
| 427. | A4 | B13 | 2 |
| 428. | A4 | B14 | 2 |
| 429. | A4 | B15 | 2 |
| 430. | A4 | B16 | 2 |
| 431. | A4 | B17 | 2 |
| 432. | A4 | B18 | 2 |
| 433. | A4 | B19 | 2 |
| 434. | A4 | B20 | 2 |
| 435. | A4 | B21 | 2 |
| 436. | A4 | B22 | 2 |
| 437. | A4 | B23 | 2 |
| 438. | A4 | B24 | 2 |
| 439. | A4 | B25 | 2 |
| 440. | A4 | B26 | 2 |
| 441. | A4 | B27 | 2 |
| 442. | A4 | B28 | 2 |
| 443. | A4 | B29 | 2 |
| 444. | A4 | B30 | 2 |
| 445. | A4 | B31 | 2 |
| 446. | A4 | B32 | 2 |
| 447. | A4 | B33 | 2 |
| 448. | A4 | B34 | 2 |
| 449. | A4 | B35 | 2 |
| 450. | A4 | B36 | 2 |
| 451. | A4 | B37 | 2 |
| 452. | A4 | B38 | 2 |
| 453. | A4 | B39 | 2 |
| 454. | A4 | B40 | 2 |
| 455. | A4 | B41 | 2 |
| 456. | A4 | B42 | 2 |
| 457. | A4 | B43 | 2 |
| 458. | A4 | B44 | 2 |
| 459. | A4 | B45 | 2 |
| 460. | A4 | B46 | 2 |
| 461. | A4 | B47 | 2 |
| 462. | A4 | B48 | 2 |
| 463. | A4 | B49 | 2 |
| 464. | A4 | B50 | 2 |
| 465. | A4 | B51 | 2 |
| 466. | A4 | B52 | 2 |
| 467. | A4 | B53 | 2 |
| 468. | A4 | B54 | 2 |
| 469. | A4 | B55 | 2 |

-continued

| Compound # | A | B | n |
|---|---|---|---|
| 470. | A4 | B56 | 2 |
| 471. | A4 | B57 | 2 |
| 472. | A4 | B58 | 2 |
| 473. | A4 | B59 | 2 |
| 474. | A4 | B60 | 2 |
| 475. | A4 | B61 | 2 |
| 476. | A4 | B62 | 2 |
| 477. | A4 | B63 | 2 |
| 478. | A4 | B64 | 2 |
| 479. | A4 | B65 | 2 |
| 480. | A4 | B66 | 2 |
| 481. | A4 | B67 | 2 |
| 482. | A4 | B68 | 2 |
| 483. | A4 | B69 | 2 |
| 484. | A4 | B70 | 2 |
| 485. | A4 | B71 | 2 |
| 486. | A4 | B72 | 2 |
| 487. | A4 | B73 | 2 |
| 488. | A4 | B74 | 2 |
| 489. | A4 | B75 | 2 |
| 490. | A4 | B76 | 2 |
| 491. | A4 | B77 | 2 |
| 492. | A4 | B78 | 2 |
| 493. | A4 | B79 | 2 |
| 494. | A4 | B80 | 2 |
| 495. | A4 | B81 | 2 |
| 496. | A4 | B82 | 2 |
| 497. | A4 | B83 | 2 |
| 498. | A4 | B84 | 2 |
| 499. | A4 | B85 | 2 |
| 500. | A4 | B86 | 2 |
| 501. | A4 | B87 | 2 |
| 502. | A4 | B88 | 2 |
| 503. | A4 | B89 | 2 |
| 504. | A4 | B90 | 2 |
| 505. | A4 | B91 | 2 |
| 506. | A4 | B92 | 2 |
| 507. | A4 | B93 | 2 |
| 508. | A4 | B94 | 2 |
| 509. | A4 | B95 | 2 |
| 510. | A4 | B96 | 2 |
| 511. | A4 | B97 | 2 |
| 512. | A4 | B98 | 2 |
| 513. | A4 | B99 | 2 |
| 514. | A4 | B100 | 2 |
| 515. | A4 | B101 | 2 |
| 516. | A4 | B102 | 2 |
| 517. | A4 | B103 | 2 |
| 518. | A4 | B104 | 2 |
| 519. | A4 | B105 | 2 |
| 520. | A4 | B106 | 2 |
| 521. | A4 | B107 | 2 |
| 522. | A4 | B108 | 2 |
| 523. | A4 | B109 | 2 |
| 524. | A4 | B110 | 2 |
| 525. | A4 | B111 | 2 |
| 526. | A4 | B112 | 2 |
| 527. | A4 | B113 | 2 |
| 528. | A4 | B114 | 2 |
| 529. | A4 | B115 | 2 |
| 530. | A4 | B116 | 2 |
| 531. | A4 | B117 | 2 |
| 532. | A4 | B118 | 2 |
| 533. | A4 | B119 | 2 |
| 534. | A4 | B120 | 2 |
| 535. | A4 | B121 | 2 |
| 536. | A4 | B122 | 2 |
| 537. | A4 | B123 | 2 |
| 538. | A4 | B124 | 2 |
| 539. | A4 | B125 | 2 |
| 540. | A4 | B126 | 2 |
| 541. | A4 | B127 | 2 |
| 542. | A4 | B128 | 2 |
| 543. | A4 | B129 | 2 |
| 544. | A4 | B130 | 2 |
| 545. | A4 | B131 | 2 |
| 546. | A4 | B132 | 2 |

-continued

| Compound # | A | B | n |
|---|---|---|---|
| 547. | A4 | B133 | 2 |
| 548. | A4 | B134 | 2 |
| 549. | A4 | B135 | 2 |
| 550. | A4 | B136 | 2 |
| 551. | A4 | B137 | 2 |
| 552. | A4 | B138 | 2 |
| 691. | A6 | B1 | 2 |
| 692. | A6 | B2 | 2 |
| 693. | A6 | B3 | 2 |
| 694. | A6 | B4 | 2 |
| 695. | A6 | B5 | 2 |
| 696. | A6 | B6 | 2 |
| 697. | A6 | B7 | 2 |
| 698. | A6 | B8 | 2 |
| 699. | A6 | B9 | 2 |
| 700. | A6 | B10 | 2 |
| 701. | A6 | B11 | 2 |
| 702. | A6 | B12 | 2 |
| 703. | A6 | B13 | 2 |
| 704. | A6 | B14 | 2 |
| 705. | A6 | B15 | 2 |
| 706. | A6 | B16 | 2 |
| 707. | A6 | B17 | 2 |
| 708. | A6 | B18 | 2 |
| 709. | A6 | B19 | 2 |
| 710. | A6 | B20 | 2 |
| 711. | A6 | B21 | 2 |
| 712. | A6 | B22 | 2 |
| 713. | A6 | B23 | 2 |
| 714. | A6 | B24 | 2 |
| 715. | A6 | B25 | 2 |
| 716. | A6 | B26 | 2 |
| 717. | A6 | B27 | 2 |
| 718. | A6 | B28 | 2 |
| 719. | A6 | B29 | 2 |
| 720. | A6 | B30 | 2 |
| 721. | A6 | B31 | 2 |
| 722. | A6 | B32 | 2 |
| 723. | A6 | B33 | 2 |
| 724. | A6 | B34 | 2 |
| 725. | A6 | B35 | 2 |
| 726. | A6 | B36 | 2 |
| 727. | A6 | B37 | 2 |
| 728. | A6 | B38 | 2 |
| 729. | A6 | B39 | 2 |
| 730. | A6 | B40 | 2 |
| 731. | A6 | B41 | 2 |
| 732. | A6 | B42 | 2 |
| 733. | A6 | B43 | 2 |
| 734. | A6 | B44 | 2 |
| 735. | A6 | B45 | 2 |
| 736. | A6 | B46 | 2 |
| 737. | A6 | B47 | 2 |
| 738. | A6 | B48 | 2 |
| 739. | A6 | B49 | 2 |
| 740. | A6 | B50 | 2 |
| 741. | A6 | B51 | 2 |
| 742. | A6 | B52 | 2 |
| 743. | A6 | B53 | 2 |
| 744. | A6 | B54 | 2 |
| 745. | A6 | B55 | 2 |
| 746. | A6 | B56 | 2 |
| 747. | A6 | B57 | 2 |
| 748. | A6 | B58 | 2 |
| 749. | A6 | B59 | 2 |
| 750. | A6 | B60 | 2 |
| 751. | A6 | B61 | 2 |
| 752. | A6 | B62 | 2 |
| 753. | A6 | B63 | 2 |
| 754. | A6 | B64 | 2 |
| 755. | A6 | B65 | 2 |
| 756. | A6 | B66 | 2 |
| 757. | A6 | B67 | 2 |
| 758. | A6 | B68 | 2 |
| 759. | A6 | B69 | 2 |
| 760. | A6 | B70 | 2 |
| 761. | A6 | B71 | 2 |

| Compound # | A | B | n |
|---|---|---|---|
| 762. | A6 | B72 | 2 |
| 763. | A6 | B73 | 2 |
| 764. | A6 | B74 | 2 |
| 765. | A6 | B75 | 2 |
| 766. | A6 | B76 | 2 |
| 767. | A6 | B77 | 2 |
| 768. | A6 | B78 | 2 |
| 769. | A6 | B79 | 2 |
| 770. | A6 | B80 | 2 |
| 771. | A6 | B81 | 2 |
| 772. | A6 | B82 | 2 |
| 773. | A6 | B83 | 2 |
| 774. | A6 | B84 | 2 |
| 775. | A6 | B85 | 2 |
| 776. | A6 | B86 | 2 |
| 777. | A6 | B87 | 2 |
| 778. | A6 | B88 | 2 |
| 779. | A6 | B89 | 2 |
| 780. | A6 | B90 | 2 |
| 781. | A6 | B91 | 2 |
| 782. | A6 | B92 | 2 |
| 783. | A6 | B93 | 2 |
| 784. | A6 | B94 | 2 |
| 785. | A6 | B95 | 2 |
| 786. | A6 | B96 | 2 |
| 787. | A6 | B97 | 2 |
| 788. | A6 | B98 | 2 |
| 789. | A6 | B99 | 2 |
| 790. | A6 | B100 | 2 |
| 791. | A6 | B101 | 2 |
| 792. | A6 | B102 | 2 |
| 793. | A6 | B103 | 2 |
| 794. | A6 | B104 | 2 |
| 795. | A6 | B105 | 2 |
| 796. | A6 | B106 | 2 |
| 797. | A6 | B107 | 2 |
| 798. | A6 | B108 | 2 |
| 799. | A6 | B109 | 2 |
| 800. | A6 | B110 | 2 |
| 801. | A6 | B111 | 2 |
| 802. | A6 | B112 | 2 |
| 803. | A6 | B113 | 2 |
| 804. | A6 | B114 | 2 |
| 805. | A6 | B115 | 2 |
| 806. | A6 | B116 | 2 |
| 807. | A6 | B117 | 2 |
| 808. | A6 | B118 | 2 |
| 809. | A6 | B119 | 2 |
| 810. | A6 | B120 | 2 |
| 811. | A6 | B121 | 2 |
| 812. | A6 | B122 | 2 |
| 813. | A6 | B123 | 2 |
| 814. | A6 | B124 | 2 |
| 815. | A6 | B125 | 2 |
| 816. | A6 | B126 | 2 |
| 817. | A6 | B127 | 2 |
| 818. | A6 | B128 | 2 |
| 819. | A6 | B129 | 2 |
| 820. | A6 | B130 | 2 |
| 821. | A6 | B131 | 2 |
| 822. | A6 | B132 | 2 |
| 823. | A6 | B133 | 2 |
| 824. | A6 | B134 | 2 |
| 825. | A6 | B135 | 2 |
| 826. | A6 | B136 | 2 |
| 827. | A6 | B137 | 2 |
| 828. | A6 | B138 | 2 |
| 967. | A8 | B1 | 2 |
| 968. | A8 | B2 | 2 |
| 969. | A8 | B3 | 2 |
| 970. | A8 | B4 | 2 |
| 971. | A8 | B5 | 2 |
| 972. | A8 | B6 | 2 |
| 973. | A8 | B7 | 2 |
| 974. | A8 | B8 | 2 |
| 975. | A8 | B9 | 2 |
| 976. | A8 | B10 | 2 |
| 977. | A8 | B11 | 2 |
| 978. | A8 | B12 | 2 |
| 979. | A8 | B13 | 2 |
| 980. | A8 | B14 | 2 |
| 981. | A8 | B15 | 2 |
| 982. | A8 | B16 | 2 |
| 983. | A8 | B17 | 2 |
| 984. | A8 | B18 | 2 |
| 985. | A8 | B19 | 2 |
| 986. | A8 | B20 | 2 |
| 987. | A8 | B21 | 2 |
| 988. | A8 | B22 | 2 |
| 989. | A8 | B23 | 2 |
| 990. | A8 | B24 | 2 |
| 991. | A8 | B25 | 2 |
| 992. | A8 | B26 | 2 |
| 993. | A8 | B27 | 2 |
| 994. | A8 | B28 | 2 |
| 995. | A8 | B29 | 2 |
| 996. | A8 | B30 | 2 |
| 997. | A8 | B31 | 2 |
| 998. | A8 | B32 | 2 |
| 999. | A8 | B33 | 2 |
| 1000. | A8 | B34 | 2 |
| 1001. | A8 | B35 | 2 |
| 1002. | A8 | B36 | 2 |
| 1003. | A8 | B37 | 2 |
| 1004. | A8 | B38 | 2 |
| 1005. | A8 | B39 | 2 |
| 1006. | A8 | B40 | 2 |
| 1007. | A8 | B41 | 2 |
| 1008. | A8 | B42 | 2 |
| 1009. | A8 | B43 | 2 |
| 1010. | A8 | B44 | 2 |
| 1011. | A8 | B45 | 2 |
| 1012. | A8 | B46 | 2 |
| 1013. | A8 | B47 | 2 |
| 1014. | A8 | B48 | 2 |
| 1015. | A8 | B49 | 2 |
| 1016. | A8 | B50 | 2 |
| 1017. | A8 | B51 | 2 |
| 1018. | A8 | B52 | 2 |
| 1019. | A8 | B53 | 2 |
| 1020. | A8 | B54 | 2 |
| 1021. | A8 | B55 | 2 |
| 1022. | A8 | B56 | 2 |
| 1023. | A8 | B57 | 2 |
| 1024. | A8 | B58 | 2 |
| 1025. | A8 | B59 | 2 |
| 1026. | A8 | B60 | 2 |
| 1027. | A8 | B61 | 2 |
| 1028. | A8 | B62 | 2 |
| 1029. | A8 | B63 | 2 |
| 1030. | A8 | B64 | 2 |
| 1031. | A8 | B65 | 2 |
| 1032. | A8 | B66 | 2 |
| 1033. | A8 | B67 | 2 |
| 1034. | A8 | B68 | 2 |
| 1035. | A8 | B69 | 2 |
| 1036. | A8 | B70 | 2 |
| 1037. | A8 | B71 | 2 |
| 1038. | A8 | B72 | 2 |
| 1039. | A8 | B73 | 2 |
| 1040. | A8 | B74 | 2 |
| 1041. | A8 | B75 | 2 |
| 1042. | A8 | B76 | 2 |
| 1043. | A8 | B77 | 2 |
| 1044. | A8 | B78 | 2 |
| 1045. | A8 | B79 | 2 |
| 1046. | A8 | B80 | 2 |
| 1047. | A8 | B81 | 2 |
| 1048. | A8 | B82 | 2 |
| 1049. | A8 | B83 | 2 |
| 1050. | A8 | B84 | 2 |
| 1051. | A8 | B85 | 2 |
| 1052. | A8 | B86 | 2 |
| 1053. | A8 | B87 | 2 |

-continued

| Compound # | A | B | n |
|---|---|---|---|
| 1054. | A8 | B88 | 2 |
| 1055. | A8 | B89 | 2 |
| 1056. | A8 | B90 | 2 |
| 1057. | A8 | B91 | 2 |
| 1058. | A8 | B92 | 2 |
| 1059. | A8 | B93 | 2 |
| 1060. | A8 | B94 | 2 |
| 1061. | A8 | B95 | 2 |
| 1062. | A8 | B96 | 2 |
| 1063. | A8 | B97 | 2 |
| 1064. | A8 | B98 | 2 |
| 1065. | A8 | B99 | 2 |
| 1066. | A8 | B100 | 2 |
| 1067. | A8 | B101 | 2 |
| 1068. | A8 | B102 | 2 |
| 1069. | A8 | B103 | 2 |
| 1070. | A8 | B104 | 2 |
| 1071. | A8 | B105 | 2 |
| 1072. | A8 | B106 | 2 |
| 1073. | A8 | B107 | 2 |
| 1074. | A8 | B108 | 2 |
| 1075. | A8 | B109 | 2 |
| 1076. | A8 | B110 | 2 |
| 1077. | A8 | B111 | 2 |
| 1078. | A8 | B112 | 2 |
| 1079. | A8 | B113 | 2 |
| 1080. | A8 | B114 | 2 |
| 1081. | A8 | B115 | 2 |
| 1082. | A8 | B116 | 2 |
| 1083. | A8 | B117 | 2 |
| 1084. | A8 | B118 | 2 |
| 1085. | A8 | B119 | 2 |
| 1086. | A8 | B120 | 2 |
| 1087. | A8 | B121 | 2 |
| 1088. | A8 | B122 | 2 |
| 1089. | A8 | B123 | 2 |
| 1090. | A8 | B124 | 2 |
| 1091. | A8 | B125 | 2 |
| 1092. | A8 | B126 | 2 |
| 1093. | A8 | B127 | 2 |
| 1094. | A8 | B128 | 2 |
| 1095. | A8 | B129 | 2 |
| 1096. | A8 | B130 | 2 |
| 1097. | A8 | B131 | 2 |
| 1098. | A8 | B132 | 2 |
| 1099. | A8 | B133 | 2 |
| 1100. | A8 | B134 | 2 |
| 1101. | A8 | B135 | 2 |
| 1102. | A8 | B136 | 2 |
| 1103. | A8 | B137 | 2 |
| 1104. | A8 | B138 | 2 | wherein the structures of A2, A4, A6 and A8 in the table are as follows:

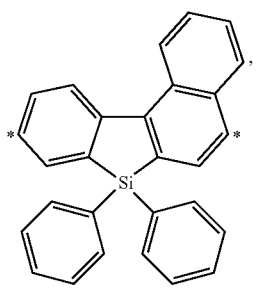
A2

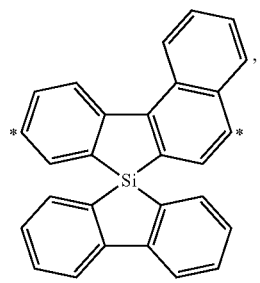
A4

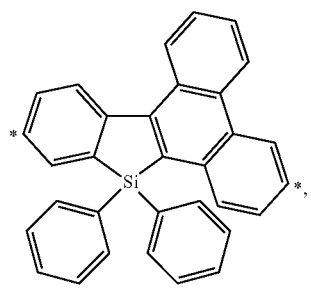
A6

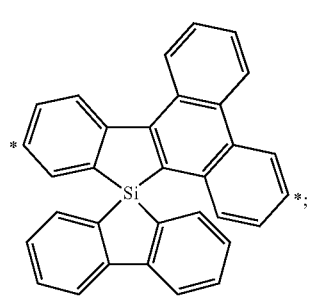
A8 wherein the symbol of "*" in the structural formula A2, A4, A6 and A8 represents the position where the group B is bonded with.

7. An organic electroluminescent device which comprises an anode, a cathode, a series of organic layers deposited between the anode and cathode, wherein at least one of the organic layers comprises the compound of claim 1.

8. The organic electroluminescent device of claim 7, wherein the device comprises a light-emitting layer, wherein the light-emitting layer comprises a compound having formula I.

9. The organic electroluminescent device of claim 7, wherein at least one organic layer comprises a compound having formula I and an anthracene compound having formula a:

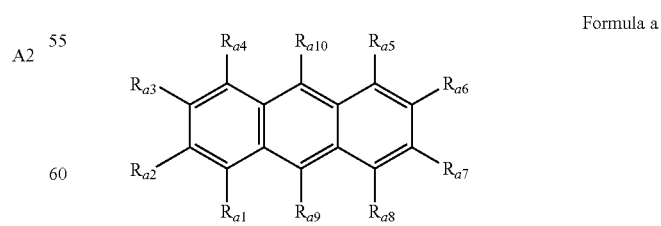
Formula a wherein $R_{a1}$, $R_{a2}$, $R_{a3}$, $R_{a4}$, $R_{a5}$, $R_{a6}$, $R_{a7}$, and $R_{a8}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

wherein $R_{a9}$ and $R_{a10}$ are independently selected from the group consisting of a substituted or unsubstituted aryl or heteroaryl group having 5 to 30 ring atoms.

10. The organic electroluminescent device of claim 7, wherein the device emits white light.

11. A formulation comprising the compound of claim 1.

12. The compound of claim 1, wherein the fused ring system is a fused ring system in which at least two six-membered aryl or heteroaryl rings fused together.

13. The compound of claim 1, wherein n is 1, the structure A is represented by Formula IV, VII, XIII or XVI:

Formula IV

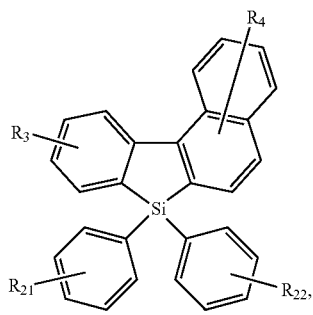

Formula VII

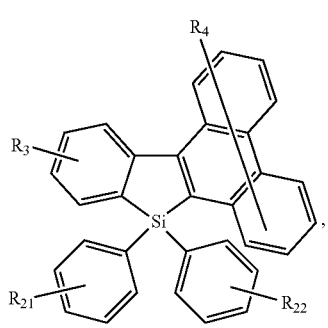

Formula XIII

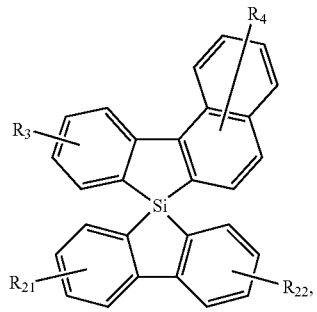

Formula XVI

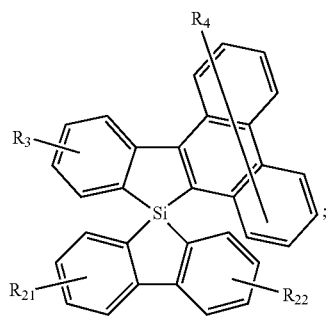

wherein $R_{21}$, $R_{22}$, $R_3$ and $R_4$ each independently represents mono, multiple or no substitution; when they represent multi substitutions, the adjacent substitution can be joined to form a ring;

$R_{21}$, $R_{22}$, $R_3$ and $R_4$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof.

14. The compound of claim 1, wherein n is 1, and A is

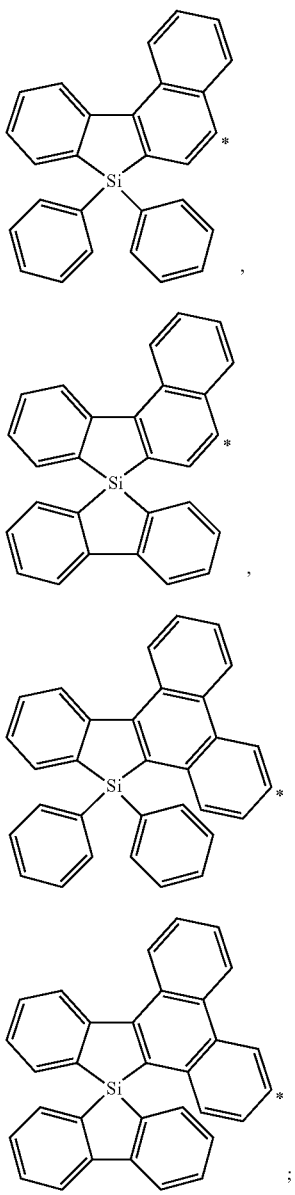

A1,

A3,

A5, or

A7;

wherein the symbol of "*" in the structural formula A1, A3, A5, and A7 represents the position where the group B is bonded with.

15. The compound of claim 1, wherein n is an integer from 2 to 4.

16. The compound of claim 4, wherein the compound has a structure selected from the group consisting of Compound #1 to Compound #138, Compound #277 to Compound #414, Compound #553 to Compound #690, Compound #829 to Compound #966, wherein the Compound #1 to Compound #138, Compound #277 to Compound #414, Compound #553 to Compound #690, Compound #829 to Compound #966 have the structure of the formula I:

A—(B)$_n$　　　　　formula I and wherein A, B and n in the structure of formula I are respectively listed in the table:

| Compound # | A | B | n |
|---|---|---|---|
| 1. | A1 | B1 | 1 |
| 2. | A1 | B2 | 1 |
| 3. | A1 | B3 | 1 |
| 4. | A1 | B4 | 1 |
| 5. | A1 | B5 | 1 |
| 6. | A1 | B6 | 1 |
| 7. | A1 | B7 | 1 |
| 8. | A1 | B8 | 1 |
| 9. | A1 | B9 | 1 |
| 10. | A1 | B10 | 1 |
| 11. | A1 | B11 | 1 |
| 12. | A1 | B12 | 1 |
| 13. | A1 | B13 | 1 |
| 14. | A1 | B14 | 1 |
| 15. | A1 | B15 | 1 |
| 16. | A1 | B16 | 1 |
| 17. | A1 | B17 | 1 |
| 18. | A1 | B18 | 1 |
| 19. | A1 | B19 | 1 |
| 20. | A1 | B20 | 1 |
| 21. | A1 | B21 | 1 |
| 22. | A1 | B22 | 1 |
| 23. | A1 | B23 | 1 |
| 24. | A1 | B24 | 1 |
| 25. | A1 | B25 | 1 |
| 26. | A1 | B26 | 1 |
| 27. | A1 | B27 | 1 |
| 28. | A1 | B28 | 1 |
| 29. | A1 | B29 | 1 |
| 30. | A1 | B30 | 1 |
| 31. | A1 | B31 | 1 |
| 32. | A1 | B32 | 1 |
| 33. | A1 | B33 | 1 |
| 34. | A1 | B34 | 1 |
| 35. | A1 | B35 | 1 |
| 36. | A1 | B36 | 1 |
| 37. | A1 | B37 | 1 |
| 38. | A1 | B38 | 1 |
| 39. | A1 | B39 | 1 |
| 40. | A1 | B40 | 1 |
| 41. | A1 | B41 | 1 |
| 42. | A1 | B42 | 1 |
| 43. | A1 | B43 | 1 |
| 44. | A1 | B44 | 1 |
| 45. | A1 | B45 | 1 |
| 46. | A1 | B46 | 1 |
| 47. | A1 | B47 | 1 |
| 48. | A1 | B48 | 1 |
| 49. | A1 | B49 | 1 |
| 50. | A1 | B50 | 1 |
| 51. | A1 | B51 | 1 |
| 52. | A1 | B52 | 1 |
| 53. | A1 | B53 | 1 |
| 54. | A1 | B54 | 1 |
| 55. | A1 | B55 | 1 |
| 56. | A1 | B56 | 1 |
| 57. | A1 | B57 | 1 |
| 58. | A1 | B58 | 1 |
| 59. | A1 | B59 | 1 |
| 60. | A1 | B60 | 1 |
| 61. | A1 | B61 | 1 |
| 62. | A1 | B62 | 1 |
| 63. | A1 | B63 | 1 |
| 64. | A1 | B64 | 1 |
| 65. | A1 | B65 | 1 |
| 66. | A1 | B66 | 1 |
| 67. | A1 | B67 | 1 |
| 68. | A1 | B68 | 1 |
| 69. | A1 | B69 | 1 |
| 70. | A1 | B70 | 1 |
| 71. | A1 | B71 | 1 |
| 72. | A1 | B72 | 1 |
| 73. | A1 | B73 | 1 |
| 74. | A1 | B74 | 1 |
| 75. | A1 | B75 | 1 |
| 76. | A1 | B76 | 1 |
| 77. | A1 | B77 | 1 |
| 78. | A1 | B78 | 1 |
| 79. | A1 | B79 | 1 |

| Compound # | A | B | n |
|---|---|---|---|
| 80. | A1 | B80 | 1 |
| 81. | A1 | B81 | 1 |
| 82. | A1 | B82 | 1 |
| 83. | A1 | B83 | 1 |
| 84. | A1 | B84 | 1 |
| 85. | A1 | B85 | 1 |
| 86. | A1 | B86 | 1 |
| 87. | A1 | B87 | 1 |
| 88. | A1 | B88 | 1 |
| 89. | A1 | B89 | 1 |
| 90. | A1 | B90 | 1 |
| 91. | A1 | B91 | 1 |
| 92. | A1 | B92 | 1 |
| 93. | A1 | B93 | 1 |
| 94. | A1 | B94 | 1 |
| 95. | A1 | B95 | 1 |
| 96. | A1 | B96 | 1 |
| 97. | A1 | B97 | 1 |
| 98. | A1 | B98 | 1 |
| 99. | A1 | B99 | 1 |
| 100. | A1 | B100 | 1 |
| 101. | A1 | B101 | 1 |
| 102. | A1 | B102 | 1 |
| 103. | A1 | B103 | 1 |
| 104. | A1 | B104 | 1 |
| 105. | A1 | B105 | 1 |
| 106. | A1 | B106 | 1 |
| 107. | A1 | B107 | 1 |
| 108. | A1 | B108 | 1 |
| 109. | A1 | B109 | 1 |
| 110. | A1 | B110 | 1 |
| 111. | A1 | B111 | 1 |
| 112. | A1 | B112 | 1 |
| 113. | A1 | B113 | 1 |
| 114. | A1 | B114 | 1 |
| 115. | A1 | B115 | 1 |
| 116. | A1 | B116 | 1 |
| 117. | A1 | B117 | 1 |
| 118. | A1 | B118 | 1 |
| 119. | A1 | B119 | 1 |
| 120. | A1 | B120 | 1 |
| 121. | A1 | B121 | 1 |
| 122. | A1 | B122 | 1 |
| 123. | A1 | B123 | 1 |
| 124. | A1 | B124 | 1 |
| 125. | A1 | B125 | 1 |
| 126. | A1 | B126 | 1 |
| 127. | A1 | B127 | 1 |
| 128. | A1 | B128 | 1 |
| 129. | A1 | B129 | 1 |
| 130. | A1 | B130 | 1 |
| 131. | A1 | B131 | 1 |
| 132. | A1 | B132 | 1 |
| 133. | A1 | B133 | 1 |
| 134. | A1 | B134 | 1 |
| 135. | A1 | B135 | 1 |
| 136. | A1 | B136 | 1 |
| 137. | A1 | B137 | 1 |
| 138. | A1 | B138 | 1 |
| 277. | A3 | B1 | 1 |
| 278. | A3 | B2 | 1 |
| 279. | A3 | B3 | 1 |
| 280. | A3 | B4 | 1 |
| 281. | A3 | B5 | 1 |
| 282. | A3 | B6 | 1 |
| 283. | A3 | B7 | 1 |
| 284. | A3 | B8 | 1 |
| 285. | A3 | B9 | 1 |
| 286. | A3 | B10 | 1 |
| 287. | A3 | B11 | 1 |
| 288. | A3 | B12 | 1 |
| 289. | A3 | B13 | 1 |
| 290. | A3 | B14 | 1 |
| 291. | A3 | B15 | 1 |
| 292. | A3 | B16 | 1 |
| 293. | A3 | B17 | 1 |
| 294. | A3 | B18 | 1 |
| 295. | A3 | B19 | 1 |
| 296. | A3 | B20 | 1 |
| 297. | A3 | B21 | 1 |
| 298. | A3 | B22 | 1 |
| 299. | A3 | B23 | 1 |
| 300. | A3 | B24 | 1 |
| 301. | A3 | B25 | 1 |
| 302. | A3 | B26 | 1 |
| 303. | A3 | B27 | 1 |
| 304. | A3 | B28 | 1 |
| 305. | A3 | B29 | 1 |
| 306. | A3 | B30 | 1 |
| 307. | A3 | B31 | 1 |
| 308. | A3 | B32 | 1 |
| 309. | A3 | B33 | 1 |
| 310. | A3 | B34 | 1 |
| 311. | A3 | B35 | 1 |
| 312. | A3 | B36 | 1 |
| 313. | A3 | B37 | 1 |
| 314. | A3 | B38 | 1 |
| 315. | A3 | B39 | 1 |
| 316. | A3 | B40 | 1 |
| 317. | A3 | B41 | 1 |
| 318. | A3 | B42 | 1 |
| 319. | A3 | B43 | 1 |
| 320. | A3 | B44 | 1 |
| 321. | A3 | B45 | 1 |
| 322. | A3 | B46 | 1 |
| 323. | A3 | B47 | 1 |
| 324. | A3 | B48 | 1 |
| 325. | A3 | B49 | 1 |
| 326. | A3 | B50 | 1 |
| 327. | A3 | B51 | 1 |
| 328. | A3 | B52 | 1 |
| 329. | A3 | B53 | 1 |
| 330. | A3 | B54 | 1 |
| 331. | A3 | B55 | 1 |
| 332. | A3 | B56 | 1 |
| 333. | A3 | B57 | 1 |
| 334. | A3 | B58 | 1 |
| 335. | A3 | B59 | 1 |
| 336. | A3 | B60 | 1 |
| 337. | A3 | B61 | 1 |
| 338. | A3 | B62 | 1 |
| 339. | A3 | B63 | 1 |
| 340. | A3 | B64 | 1 |
| 341. | A3 | B65 | 1 |
| 342. | A3 | B66 | 1 |
| 343. | A3 | B67 | 1 |
| 344. | A3 | B68 | 1 |
| 345. | A3 | B69 | 1 |
| 346. | A3 | B70 | 1 |
| 347. | A3 | B71 | 1 |
| 348. | A3 | B72 | 1 |
| 349. | A3 | B73 | 1 |
| 350. | A3 | B74 | 1 |
| 351. | A3 | B75 | 1 |
| 352. | A3 | B76 | 1 |
| 353. | A3 | B77 | 1 |
| 354. | A3 | B78 | 1 |
| 355. | A3 | B79 | 1 |
| 356. | A3 | B80 | 1 |
| 357. | A3 | B81 | 1 |
| 358. | A3 | B82 | 1 |
| 359. | A3 | B83 | 1 |
| 360. | A3 | B84 | 1 |
| 361. | A3 | B85 | 1 |
| 362. | A3 | B86 | 1 |
| 363. | A3 | B87 | 1 |
| 364. | A3 | B88 | 1 |
| 365. | A3 | B89 | 1 |
| 366. | A3 | B90 | 1 |
| 367. | A3 | B91 | 1 |
| 368. | A3 | B92 | 1 |
| 369. | A3 | B93 | 1 |
| 370. | A3 | B94 | 1 |
| 371. | A3 | B95 | 1 |

| Compound # | A | B | n |
|---|---|---|---|
| 372. | A3 | B96 | 1 |
| 373. | A3 | B97 | 1 |
| 374. | A3 | B98 | 1 |
| 375. | A3 | B99 | 1 |
| 376. | A3 | B100 | 1 |
| 377. | A3 | B101 | 1 |
| 378. | A3 | B102 | 1 |
| 379. | A3 | B103 | 1 |
| 380. | A3 | B104 | 1 |
| 381. | A3 | B105 | 1 |
| 382. | A3 | B106 | 1 |
| 383. | A3 | B107 | 1 |
| 384. | A3 | B108 | 1 |
| 385. | A3 | B109 | 1 |
| 386. | A3 | B110 | 1 |
| 387. | A3 | B111 | 1 |
| 388. | A3 | B112 | 1 |
| 389. | A3 | B113 | 1 |
| 390. | A3 | B114 | 1 |
| 391. | A3 | B115 | 1 |
| 392. | A3 | B116 | 1 |
| 393. | A3 | B117 | 1 |
| 394. | A3 | B118 | 1 |
| 395. | A3 | B119 | 1 |
| 396. | A3 | B120 | 1 |
| 397. | A3 | B121 | 1 |
| 398. | A3 | B122 | 1 |
| 399. | A3 | B123 | 1 |
| 400. | A3 | B124 | 1 |
| 401. | A3 | B125 | 1 |
| 402. | A3 | B126 | 1 |
| 403. | A3 | B127 | 1 |
| 404. | A3 | B128 | 1 |
| 405. | A3 | B129 | 1 |
| 406. | A3 | B130 | 1 |
| 407. | A3 | B131 | 1 |
| 408. | A3 | B132 | 1 |
| 409. | A3 | B133 | 1 |
| 410. | A3 | B134 | 1 |
| 411. | A3 | B135 | 1 |
| 412. | A3 | B136 | 1 |
| 413. | A3 | B137 | 1 |
| 414. | A3 | B138 | 1 |
| 553. | A5 | B1 | 1 |
| 554. | A5 | B2 | 1 |
| 555. | A5 | B3 | 1 |
| 556. | A5 | B4 | 1 |
| 557. | A5 | B5 | 1 |
| 558. | A5 | B6 | 1 |
| 559. | A5 | B7 | 1 |
| 560. | A5 | B8 | 1 |
| 561. | A5 | B9 | 1 |
| 562. | A5 | B10 | 1 |
| 563. | A5 | B11 | 1 |
| 564. | A5 | B12 | 1 |
| 565. | A5 | B13 | 1 |
| 566. | A5 | B14 | 1 |
| 567. | A5 | B15 | 1 |
| 568. | A5 | B16 | 1 |
| 569. | A5 | B17 | 1 |
| 570. | A5 | B18 | 1 |
| 571. | A5 | B19 | 1 |
| 572. | A5 | B20 | 1 |
| 573. | A5 | B21 | 1 |
| 574. | A5 | B22 | 1 |
| 575. | A5 | B23 | 1 |
| 576. | A5 | B24 | 1 |
| 577. | A5 | B25 | 1 |
| 578. | A5 | B26 | 1 |
| 579. | A5 | B27 | 1 |
| 580. | A5 | B28 | 1 |
| 581. | A5 | B29 | 1 |
| 582. | A5 | B30 | 1 |
| 583. | A5 | B31 | 1 |
| 584. | A5 | B32 | 1 |
| 585. | A5 | B33 | 1 |
| 586. | A5 | B34 | 1 |
| 587. | A5 | B35 | 1 |
| 588. | A5 | B36 | 1 |
| 589. | A5 | B37 | 1 |
| 590. | A5 | B38 | 1 |
| 591. | A5 | B39 | 1 |
| 592. | A5 | B40 | 1 |
| 593. | A5 | B41 | 1 |
| 594. | A5 | B42 | 1 |
| 595. | A5 | B43 | 1 |
| 596. | A5 | B44 | 1 |
| 597. | A5 | B45 | 1 |
| 598. | A5 | B46 | 1 |
| 599. | A5 | B47 | 1 |
| 600. | A5 | B48 | 1 |
| 601. | A5 | B49 | 1 |
| 602. | A5 | B50 | 1 |
| 603. | A5 | B51 | 1 |
| 604. | A5 | B52 | 1 |
| 605. | A5 | B53 | 1 |
| 606. | A5 | B54 | 1 |
| 607. | A5 | B55 | 1 |
| 608. | A5 | B56 | 1 |
| 609. | A5 | B57 | 1 |
| 610. | A5 | B58 | 1 |
| 611. | A5 | B59 | 1 |
| 612. | A5 | B60 | 1 |
| 613. | A5 | B61 | 1 |
| 614. | A5 | B62 | 1 |
| 615. | A5 | B63 | 1 |
| 616. | A5 | B64 | 1 |
| 617. | A5 | B65 | 1 |
| 618. | A5 | B66 | 1 |
| 619. | A5 | B67 | 1 |
| 620. | A5 | B68 | 1 |
| 621. | A5 | B69 | 1 |
| 622. | A5 | B70 | 1 |
| 623. | A5 | B71 | 1 |
| 624. | A5 | B72 | 1 |
| 625. | A5 | B73 | 1 |
| 626. | A5 | B74 | 1 |
| 627. | A5 | B75 | 1 |
| 628. | A5 | B76 | 1 |
| 629. | A5 | B77 | 1 |
| 630. | A5 | B78 | 1 |
| 631. | A5 | B79 | 1 |
| 632. | A5 | B80 | 1 |
| 633. | A5 | B81 | 1 |
| 634. | A5 | B82 | 1 |
| 635. | A5 | B83 | 1 |
| 636. | A5 | B84 | 1 |
| 637. | A5 | B85 | 1 |
| 638. | A5 | B86 | 1 |
| 639. | A5 | B87 | 1 |
| 640. | A5 | B88 | 1 |
| 641. | A5 | B89 | 1 |
| 642. | A5 | B90 | 1 |
| 643. | A5 | B91 | 1 |
| 644. | A5 | B92 | 1 |
| 645. | A5 | B93 | 1 |
| 646. | A5 | B94 | 1 |
| 647. | A5 | B95 | 1 |
| 648. | A5 | B96 | 1 |
| 649. | A5 | B97 | 1 |
| 650. | A5 | B98 | 1 |
| 651. | A5 | B99 | 1 |
| 652. | A5 | B100 | 1 |
| 653. | A5 | B101 | 1 |
| 654. | A5 | B102 | 1 |
| 655. | A5 | B103 | 1 |
| 656. | A5 | B104 | 1 |
| 657. | A5 | B105 | 1 |
| 658. | A5 | B106 | 1 |
| 659. | A5 | B107 | 1 |
| 660. | A5 | B108 | 1 |
| 661. | A5 | B109 | 1 |
| 662. | A5 | B110 | 1 |
| 663. | A5 | B111 | 1 |

-continued

| Compound # | A | B | n |
|---|---|---|---|
| 664. | A5 | B112 | 1 |
| 665. | A5 | B113 | 1 |
| 666. | A5 | B114 | 1 |
| 667. | A5 | B115 | 1 |
| 668. | A5 | B116 | 1 |
| 669. | A5 | B117 | 1 |
| 670. | A5 | B118 | 1 |
| 671. | A5 | B119 | 1 |
| 672. | A5 | B120 | 1 |
| 673. | A5 | B121 | 1 |
| 674. | A5 | B122 | 1 |
| 675. | A5 | B123 | 1 |
| 676. | A5 | B124 | 1 |
| 677. | A5 | B125 | 1 |
| 678. | A5 | B126 | 1 |
| 679. | A5 | B127 | 1 |
| 680. | A5 | B128 | 1 |
| 681. | A5 | B129 | 1 |
| 682. | A5 | B130 | 1 |
| 683. | A5 | B131 | 1 |
| 684. | A5 | B132 | 1 |
| 685. | A5 | B133 | 1 |
| 686. | A5 | B134 | 1 |
| 687. | A5 | B135 | 1 |
| 688. | A5 | B136 | 1 |
| 689. | A5 | B137 | 1 |
| 690. | A5 | B138 | 1 |
| 829. | A7 | B1 | 1 |
| 830. | A7 | B2 | 1 |
| 831. | A7 | B3 | 1 |
| 832. | A7 | B4 | 1 |
| 833. | A7 | B5 | 1 |
| 834. | A7 | B6 | 1 |
| 835. | A7 | B7 | 1 |
| 836. | A7 | B8 | 1 |
| 837. | A7 | B9 | 1 |
| 838. | A7 | B10 | 1 |
| 839. | A7 | B11 | 1 |
| 840. | A7 | B12 | 1 |
| 841. | A7 | B13 | 1 |
| 842. | A7 | B14 | 1 |
| 843. | A7 | B15 | 1 |
| 844. | A7 | B16 | 1 |
| 845. | A7 | B17 | 1 |
| 846. | A7 | B18 | 1 |
| 847. | A7 | B19 | 1 |
| 848. | A7 | B20 | 1 |
| 849. | A7 | B21 | 1 |
| 850. | A7 | B22 | 1 |
| 851. | A7 | B23 | 1 |
| 852. | A7 | B24 | 1 |
| 853. | A7 | B25 | 1 |
| 854. | A7 | B26 | 1 |
| 855. | A7 | B27 | 1 |
| 856. | A7 | B28 | 1 |
| 857. | A7 | B29 | 1 |
| 858. | A7 | B30 | 1 |
| 859. | A7 | B31 | 1 |
| 860. | A7 | B32 | 1 |
| 861. | A7 | B33 | 1 |
| 862. | A7 | B34 | 1 |
| 863. | A7 | B35 | 1 |
| 864. | A7 | B36 | 1 |
| 865. | A7 | B37 | 1 |
| 866. | A7 | B38 | 1 |
| 867. | A7 | B39 | 1 |
| 868. | A7 | B40 | 1 |
| 869. | A7 | B41 | 1 |
| 870. | A7 | B42 | 1 |
| 871. | A7 | B43 | 1 |
| 872. | A7 | B44 | 1 |
| 873. | A7 | B45 | 1 |
| 874. | A7 | B46 | 1 |
| 875. | A7 | B47 | 1 |
| 876. | A7 | B48 | 1 |
| 877. | A7 | B49 | 1 |
| 878. | A7 | B50 | 1 |
| 879. | A7 | B51 | 1 |
| 880. | A7 | B52 | 1 |
| 881. | A7 | B53 | 1 |
| 882. | A7 | B54 | 1 |
| 883. | A7 | B55 | 1 |
| 884. | A7 | B56 | 1 |
| 885. | A7 | B57 | 1 |
| 886. | A7 | B58 | 1 |
| 887. | A7 | B59 | 1 |
| 888. | A7 | B60 | 1 |
| 889. | A7 | B61 | 1 |
| 890. | A7 | B62 | 1 |
| 891. | A7 | B63 | 1 |
| 892. | A7 | B64 | 1 |
| 893. | A7 | B65 | 1 |
| 894. | A7 | B66 | 1 |
| 895. | A7 | B67 | 1 |
| 896. | A7 | B68 | 1 |
| 897. | A7 | B69 | 1 |
| 898. | A7 | B70 | 1 |
| 899. | A7 | B71 | 1 |
| 900. | A7 | B72 | 1 |
| 901. | A7 | B73 | 1 |
| 902. | A7 | B74 | 1 |
| 903. | A7 | B75 | 1 |
| 904. | A7 | B76 | 1 |
| 905. | A7 | B77 | 1 |
| 906. | A7 | B78 | 1 |
| 907. | A7 | B79 | 1 |
| 908. | A7 | B80 | 1 |
| 909. | A7 | B81 | 1 |
| 910. | A7 | B82 | 1 |
| 911. | A7 | B83 | 1 |
| 912. | A7 | B84 | 1 |
| 913. | A7 | B85 | 1 |
| 914. | A7 | B86 | 1 |
| 915. | A7 | B87 | 1 |
| 916. | A7 | B88 | 1 |
| 917. | A7 | B89 | 1 |
| 918. | A7 | B90 | 1 |
| 919. | A7 | B91 | 1 |
| 920. | A7 | B92 | 1 |
| 921. | A7 | B93 | 1 |
| 922. | A7 | B94 | 1 |
| 923. | A7 | B95 | 1 |
| 924. | A7 | B96 | 1 |
| 925. | A7 | B97 | 1 |
| 926. | A7 | B98 | 1 |
| 927. | A7 | B99 | 1 |
| 928. | A7 | B100 | 1 |
| 929. | A7 | B101 | 1 |
| 930. | A7 | B102 | 1 |
| 931. | A7 | B103 | 1 |
| 932. | A7 | B104 | 1 |
| 933. | A7 | B105 | 1 |
| 934. | A7 | B106 | 1 |
| 935. | A7 | B107 | 1 |
| 936. | A7 | B108 | 1 |
| 937. | A7 | B109 | 1 |
| 938. | A7 | B110 | 1 |
| 939. | A7 | B111 | 1 |
| 940. | A7 | B112 | 1 |
| 941. | A7 | B113 | 1 |
| 942. | A7 | B114 | 1 |
| 943. | A7 | B115 | 1 |
| 944. | A7 | B116 | 1 |
| 945. | A7 | B117 | 1 |
| 946. | A7 | B118 | 1 |
| 947. | A7 | B119 | 1 |
| 948. | A7 | B120 | 1 |
| 949. | A7 | B121 | 1 |
| 950. | A7 | B122 | 1 |
| 951. | A7 | B123 | 1 |
| 952. | A7 | B124 | 1 |
| 953. | A7 | B125 | 1 |
| 954. | A7 | B126 | 1 |
| 955. | A7 | B127 | 1 |

-continued

| Compound # | A | B | n |
|---|---|---|---|
| 956. | A7 | B128 | 1 |
| 957. | A7 | B129 | 1 |
| 958. | A7 | B130 | 1 |
| 959. | A7 | B131 | 1 |
| 960. | A7 | B132 | 1 |
| 961. | A7 | B133 | 1 |
| 962. | A7 | B134 | 1 |
| 963. | A7 | B135 | 1 |
| 964. | A7 | B136 | 1 |
| 965. | A7 | B137 | 1 |
| 966. | A7 | B138 | 1 | wherein the structures of A1, A3, A5 and A7 in the table are as follows:

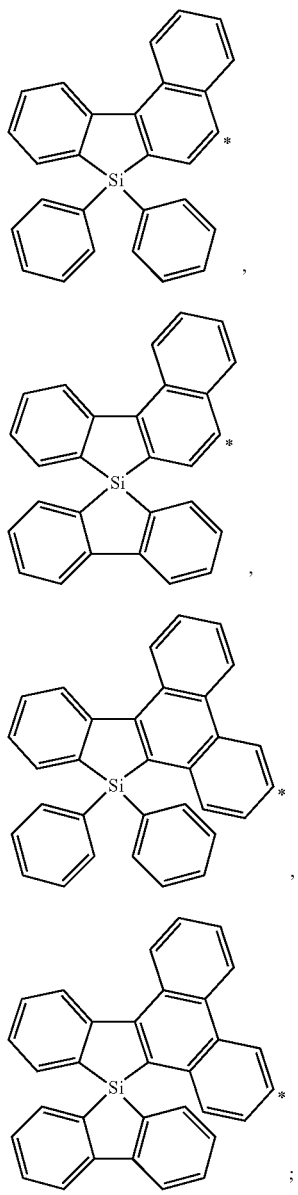

wherein the symbol of "*" in the structural formula A1, A3, A5 and A7 represents the position where the group B is bonded with.

17. The organic electroluminescent device of claim 7, wherein the fused ring system is a fused ring system in which at least two six-membered aryl or heteroaryl rings fused together.

18. The organic electroluminescent device of claim 7, wherein n is 1, A is

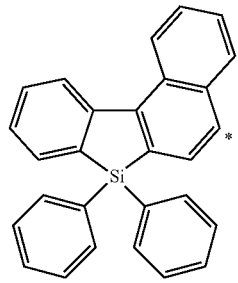

A1

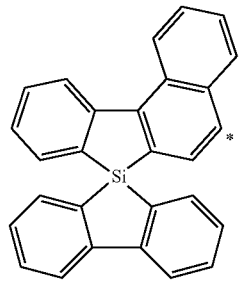

A3

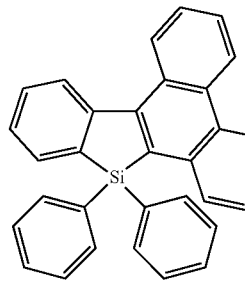

A5 or

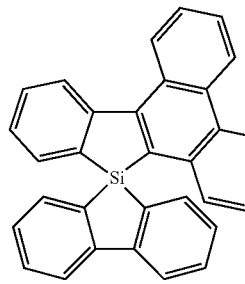

A7 wherein the symbol of "*" in the structural formula A1, A3, A5, and A7 represents the position where the group B is bonded with.

19. The organic electroluminescent device of claim 7, wherein n is an integer from 2 to 4.

* * * * *